(12) United States Patent
Wang

(10) Patent No.: US 12,529,237 B2
(45) Date of Patent: *Jan. 20, 2026

(54) CLEANING DEVICE

(71) Applicant: XINGMAI INNOVATION TECHNOLOGY (SUZHOU) CO., LTD., Suzhou (CN)

(72) Inventor: Shengle Wang, Suzhou (CN)

(73) Assignee: XINGMAI INNOVATION TECHNOLOGY (SUZHOU) CO., LTD., Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/193,821

(22) Filed: Apr. 29, 2025

(65) Prior Publication Data
US 2025/0257582 A1 Aug. 14, 2025

Related U.S. Application Data

(63) Continuation-in-part of application No. 19/031,442, filed on Jan. 18, 2025, which is a continuation-in-part
(Continued)

(30) Foreign Application Priority Data

| Dec. 1, 2023 | (CN) | .......................... 202311639354.6 |
| Jan. 17, 2024 | (CN) | .......................... 202410070430.4 |
| Mar. 27, 2024 | (CN) | .......................... 202410362217.0 |

(51) Int. Cl.
*E04H 4/16* (2006.01)
*A46B 13/00* (2006.01)
(Continued)

(52) U.S. Cl.
CPC ......... *E04H 4/1654* (2013.01); *A46B 13/001* (2013.01); *A46B 13/02* (2013.01);
(Continued)

(58) Field of Classification Search
CPC ........ B01D 29/56; B01D 29/96; B01D 35/02; B01D 35/30; B08B 9/08; B08B 9/087;
(Continued)

(56) References Cited

U.S. PATENT DOCUMENTS

| 3,626,486 A | 12/1971 | Bugbee |
| 3,708,070 A | 1/1973 | Bell |

(Continued)

FOREIGN PATENT DOCUMENTS

| CN | 202038437 U | 11/2011 |
| CN | 204399447 U | 6/2015 |

(Continued)

OTHER PUBLICATIONS

Zeng, Y., et al., "Design Study of Floating Garbage Cleaner on Water Surface", Central South University, China, Abstract, (2013).

*Primary Examiner* — Akash K Varma
(74) *Attorney, Agent, or Firm* — Soleado Law, PC

(57) ABSTRACT

The present disclosure provides a cleaning device, including a cleaning device body provided with an accommodating groove and an accommodating opening, an adjustment mechanism, a moving mechanism, a main cleaning mechanism including at least one filtering box which is provided with a debris inlet and assembled to the accommodating groove through the accommodating opening, a handle, a roller brush, and a solar mechanism including a solar panel. Along a forward direction, a ratio of a maximum length of the solar panel to a maximum length of a contour of the cleaning device body is greater than or equal to 0.7 and less than 1. Along a direction perpendicular to the forward direction, a ratio of a maximum width of the solar panel to a maximum width of the contour of the cleaning device body is greater than or equal to 0.5 and less than 1.

14 Claims, 18 Drawing Sheets

Related U.S. Application Data of application No. PCT/CN2024/094025, filed on May 17, 2024.

(51) Int. Cl.
*A46B 13/02* (2006.01)
*A46B 15/00* (2006.01)
*E04H 4/12* (2006.01)
*H02S 20/30* (2014.01)

(52) U.S. Cl.
CPC ....... *A46B 15/0036* (2013.01); *E04H 4/1263* (2013.01); *H02S 20/30* (2014.12); *A46B 2200/3073* (2013.01)

(58) Field of Classification Search
CPC ... B62D 55/065; E04H 4/1654; E04H 4/1263; E04H 4/12; E04H 4/16; H02S 20/30; A46B 13/001; A46B 13/02; A46B 13/00; A46B 15/0036; A46B 15/00; A46B 2200/3073; G05D 1/467; G05D 1/46; G05D 1/48; G05D 1/648; G05D 2105/10; G05D 2107/00; G05D 2107/29; G05D 2109/30; G05D 2109/38
USPC ....................................................... 210/167.2
See application file for complete search history.

(56) References Cited

U.S. PATENT DOCUMENTS

| | | | |
|---|---|---|---|
| 4,186,844 | A | 2/1980 | Swanson |
| 4,746,424 | A | 5/1988 | Drew |
| 5,106,492 | A | 4/1992 | Distinti |
| 5,133,854 | A | 7/1992 | Horvath |
| 5,788,850 | A | 8/1998 | Tuomey |
| 10,036,174 | B2 | 7/2018 | Smith |
| 11,097,814 | B2 | 8/2021 | Wang |
| 12,378,741 | B2 | 8/2025 | Cheng |
| 2003/0201218 | A1 | 10/2003 | Henkin |
| 2013/0091641 | A1* | 4/2013 | Ben Zion ............... E04H 4/1654 15/1.7 |
| 2016/0060887 | A1* | 3/2016 | Tryber ................... E04H 4/1263 15/1.7 |
| 2018/0066443 | A1* | 3/2018 | Zerweck ............... B62D 55/084 |
| 2018/0229160 | A1* | 8/2018 | Witelson ................ B01D 29/66 |
| 2020/0095792 | A1* | 3/2020 | Miller .................... E04H 4/1654 |
| 2021/0330148 | A1* | 10/2021 | Sun ........................ A47L 9/2852 |
| 2023/0107841 | A1 | 4/2023 | Duffaut |
| 2025/0116129 | A1 | 4/2025 | Zhang |
| 2025/0198183 | A1 | 6/2025 | Cheng |

FOREIGN PATENT DOCUMENTS

| | | |
|---|---|---|
| CN | 206297733 U | 7/2017 |
| CN | 207972758 U | 10/2018 |
| CN | 109204723 B | 1/2019 |
| CN | 109853504 A | 6/2019 |
| CN | 110861755 A | 3/2020 |
| CN | 111042088 A | 4/2020 |
| CN | 111452924 A | 7/2020 |
| CN | 212766664 U | 3/2021 |
| CN | 213323590 U | 6/2021 |
| CN | 215534044 U | 1/2022 |
| CN | 215562477 U | 1/2022 |
| CN | 216739542 U | 6/2022 |
| CN | 114790729 A | 7/2022 |
| CN | 115092332 B | 9/2022 |
| CN | 115506323 A | 12/2022 |
| CN | 117513278 A | 2/2024 |
| CN | 220486389 U | 2/2024 |
| CN | 221557756 U | 8/2024 |
| CN | 221822868 U | 10/2024 |
| CN | 222044131 U | 11/2024 |
| KR | 101416657 B1 | 7/2014 |
| KR | 102443105 B1 | 9/2022 |
| WO | 2025060281 A1 | 3/2025 |

\* cited by examiner

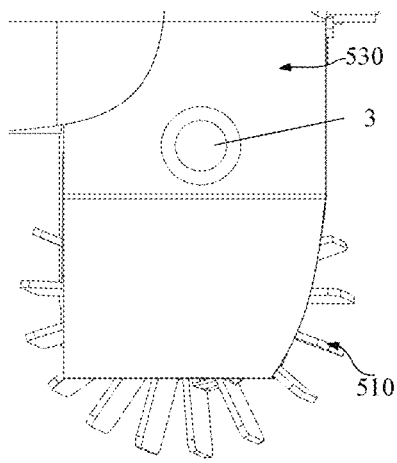
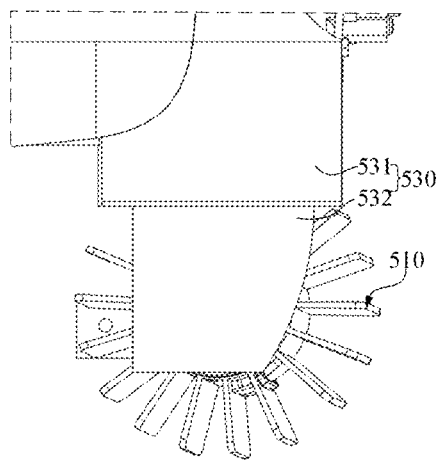
FIG. 16　　　　　　　　FIG. 17
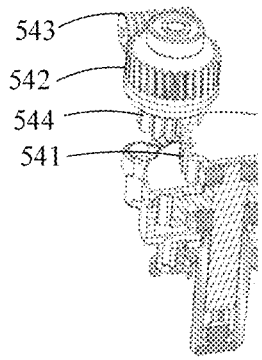
FIG. 18
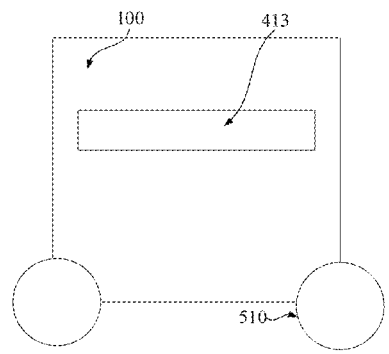
FIG. 19

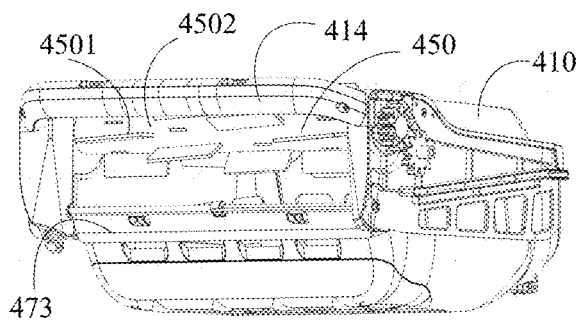
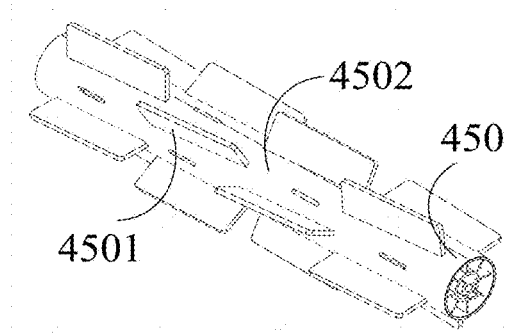
FIG. 30b  FIG. 30c
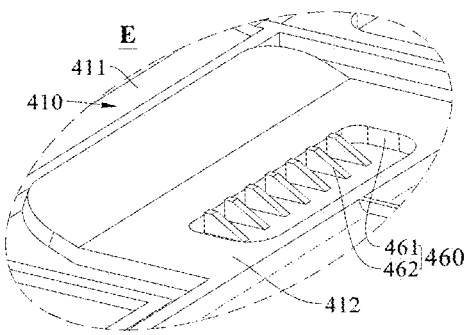
FIG. 31
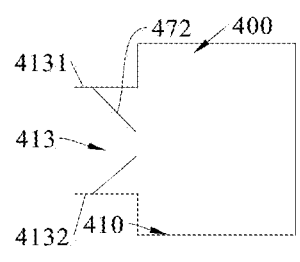 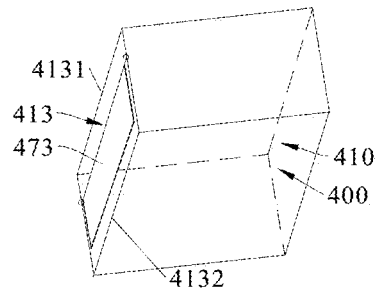 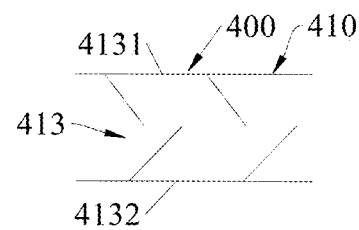
FIG. 32  FIG. 33  FIG. 34
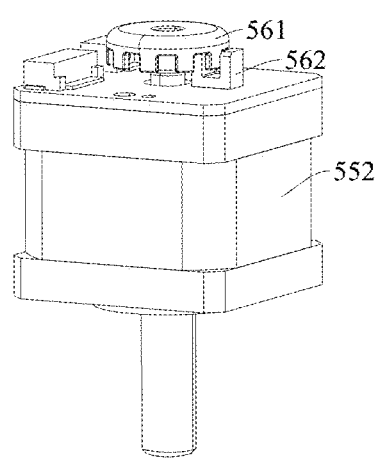
FIG. 35

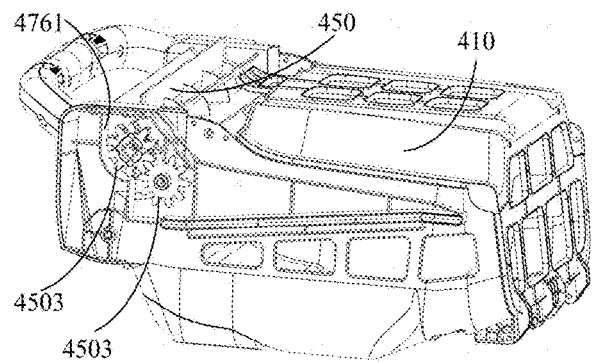
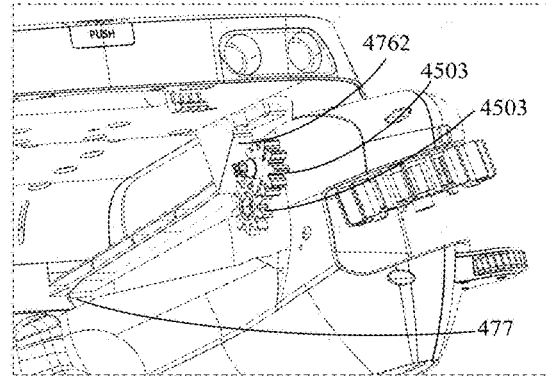
FIG. 47a  FIG. 47b
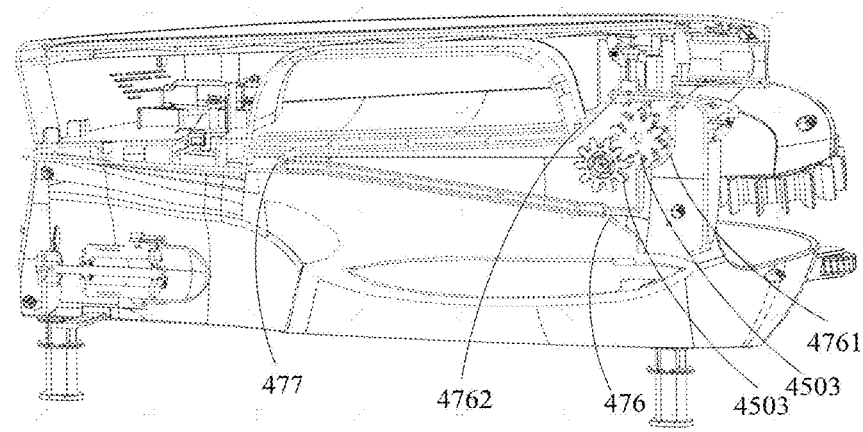
FIG. 47c
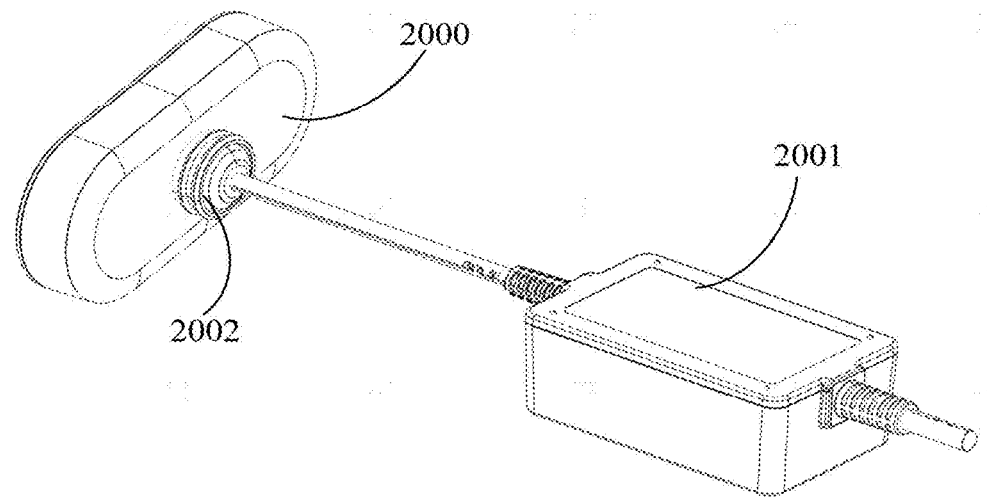
FIG. 48

CLEANING DEVICE

CROSS REFERENCE TO RELATED APPLICATIONS

The present disclosure is a continuation-in-part of prior U.S. patent application Ser. No. 19/031,442, filed on Jan. 18, 2025, which is a continuation-in-part of prior International Patent Application No. PCT/CN2024/094025, filed on May 17, 2024, which claims priority to: Chinese Patent Application No. 202311639354.6, filed with the China National Intellectual Property Administration on Dec. 1, 2023 and entitled "POOL CLEANING ROBOT", Chinese Patent Application No. 202410070430.4, filed with the China National Intellectual Property Administration on Jan. 17, 2024 and entitled "POOL ROBOT AND CONTROL METHOD THEREOF, AND STORAGE MEDIUM", and Chinese Patent Application No. 202410362217.0, filed with the China National Intellectual Property Administration on Mar. 27, 2024 and entitled "POOL CLEANING ROBOT", all of which are hereby incorporated by reference herein.

TECHNICAL FIELD

The present disclosure relates to the technical field of operating devices for liquid, and in particular to, a cleaning device.

BACKGROUND

A swimming pool robot may clean debris in a pool, such as an object floating on a water surface or stains in the water. An existing swimming pool robot includes at least one filtering box and a solar panel. The filtering box is disposed in the swimming pool robot. The filtering box is configured to filter and accumulate the debris, such as the object floating on the water surface or the stains in the water. The solar panel is disposed on the top of the swimming pool robot. When the debris in the filtering box needs to be dumped, a user opens a top cover and removes the filtering box from the pool robot to dump the debris. However, in a process of repeatedly opening the top cover of the swimming pool robot, the solar panel is also opened repeatedly with the top cover. Consequently, it is prone to damage the solar panel, thereby affecting a service life of the solar panel.

SUMMARY OF THE DISCLOSURE

The present disclosure provides a cleaning device, including: a cleaning device body, including an outer side portion; at least one accommodating opening and at least one accommodating groove, where the accommodating opening is provided at the outer side portion, the accommodating groove is provided on the cleaning device body, and the accommodating opening communicates with the accommodating groove; an adjustment mechanism, including at least one buoyancy cavity, where the buoyancy cavity is provided in the cleaning device body and configured to adjust the cleaning device body to be at least partially located on a water surface; a moving mechanism, disposed at the cleaning device body and configured to drive the cleaning device body to move; a main cleaning mechanism, including at least one filtering box, where the filtering box is provided with a debris inlet, at least partially accommodated in the accommodating groove, and capable of being assembled to the accommodating groove in a pull-out manner through the accommodating opening, and a direction of pulling out the filtering box includes a direction substantially parallel to a forward direction of the cleaning device; a handle, disposed at a periphery of the filtering box; a roller brush, rotatably disposed at the debris inlet, where the handle and the roller brush are located on a same side of the cleaning device body; and a solar mechanism, including a solar panel disposed on a top surface of the cleaning device body. A maximum length of a contour of the cleaning device body along the forward direction is a first length. A maximum width of the contour of the cleaning device body along a direction perpendicular to the forward direction is a first width. A maximum length of the solar panel along the forward direction is a second length. A maximum width of the solar panel along the direction perpendicular to the forward direction is a second width. A ratio of the second length to the first length is greater than or equal to 0.7 and less than 1. A ratio of the second width to the first width is greater than or equal to 0.5 and less than 1.

BRIEF DESCRIPTION OF THE DRAWINGS

To more clearly describe the technical solutions in embodiments of the present disclosure, the following briefly introduces the accompanying drawings required for describing embodiments. It is clear that the accompanying drawings in the following description show merely some embodiments of the present disclosure, and a person of ordinary skill in the art may still derive other drawings from these accompanying drawings without creative efforts.

FIG. 16 is a first partial schematic view of a cleaning device according to a third embodiment of the present disclosure;

FIG. 17 is a second partial schematic view of a cleaning device according to a third embodiment of the present disclosure;

FIG. 18 is a schematic structural view of a first transmission mechanism according to the present disclosure;

FIG. 19 is a simplified schematic structural view of a cleaning device according to a fourth embodiment of the present disclosure;

FIG. 30b is a third schematic structural view of a filtering box of a cleaning device according to the present disclosure;

FIG. 30c is a schematic structural view of a side brush of a cleaning device according to the present disclosure;

FIG. 31 is a schematic structural view of a portion E shown in FIG. 30a;

FIG. 32 is a simplified schematic structural view of an anti-regurgitation assembly according to an embodiment of the present disclosure;

FIG. 33 is a simplified schematic structural view of an anti-regurgitation assembly according to another embodiment of the present disclosure;

FIG. 34 is a simplified schematic structural view of an anti-regurgitation assembly according to still another embodiment of the present disclosure;

FIG. 35 is a schematic structural view of a side brush drive motor according to the present disclosure;

FIG. 39 is a schematic structural view of a portion F shown in FIG. 38a;

FIG. 40 is a schematic structural view of a portion G shown in FIG. 38a;

FIG. 47a is a schematic structural view of a filtering box of a cleaning device according to an embodiment of the present disclosure;

FIG. 47b is a schematic structural view of a filtering box of a cleaning device according to an embodiment of the present disclosure;

FIG. 47c is a partial cross-sectional view of a cleaning device according to an embodiment of the present disclosure;

FIG. 48 is a schematic structural view of a wireless charging interface and a wireless charging connector according to an embodiment of the present disclosure;

Figure 1:
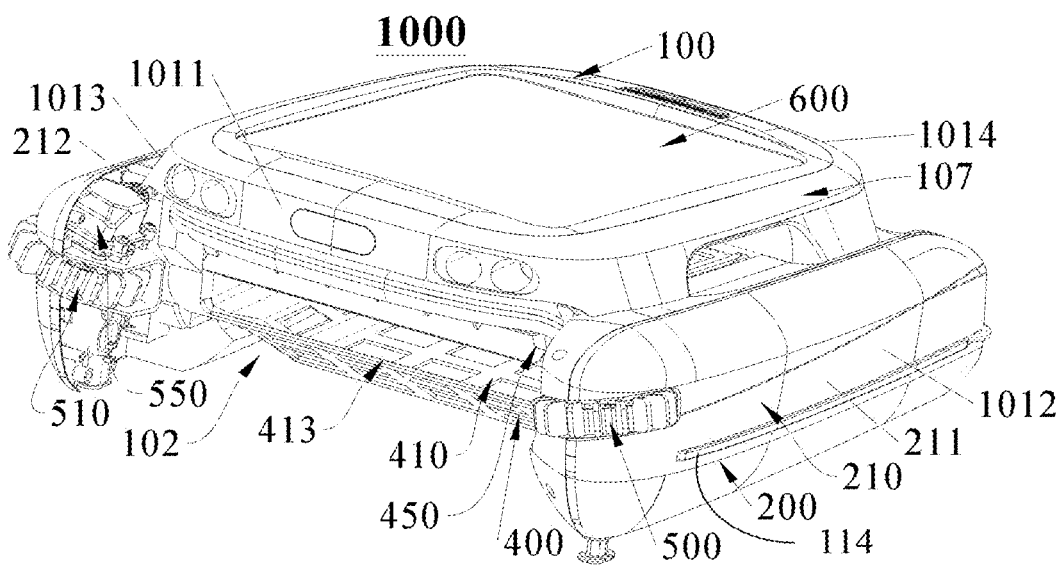
FIG. 1 is a first partial schematic view of a cleaning device according to a first embodiment of the present disclosure.

Reference numerals in drawings: 1000: cleaning device; 100: cleaning device body; 1011: first side portion; 1012: second side portion; 1013: third side portion; 1014: fourth side portion; 102: accommodating opening; 104: water blocking structure; 107: top cover; 108: accommodating groove; 109: auxiliary mounting groove; 110: auxiliary mounting portion; 111: first anti-collision part; 112: second anti-collision part; 113: extension mechanism; 114: third anti-collision part; 120: wireless charging interface; 130: drive box; 140: anti-stranding assembly; 1401: anti-stranding wheel; 141: anti-stranding housing; 142: anti-stranding part; 1421: manual portion; 143: pressed elastic portion; 200: adjustment mechanism; 210: buoyancy cavity; 211: first buoyancy cavity; 212: second buoyancy cavity; 213: anti-collision groove; 214: propulsion groove; 220: buoyancy cavity pump; 300: moving mechanism; 310: propeller; 3101: water flow channel; 3102: opening; 320: overwater sensor; 330: underwater sensor; 400: main cleaning mechanism; 410: filtering box; 411: filtering box portion; 412: rotating portion; 413: debris inlet; 4131: first edge; 4132: second edge; 4133: gradually expanding structure; 414: handle; 415: first rotating shaft; 420: locking mechanism; 421: locking assembly; 4211: first locking part; 42111: first locking portion; 4212: first elastic part; 4213: first pressing part; 42131: pressing bevel; 42132: first pressing guide post; 42133: pressing buckle; 4214: second locking part; 42141: second locking portion; 422: locking groove; 4221: first position-limiting structure; 4222: second position-limiting structure; 4223: third position-limiting structure; 423: second pressing part; 4231: second pressing guide post; 4232: pressing mating portion; 4233: pressing fixing part; 4234: second elastic part; 4235: anti-slip portion; 424: first transferring structure; 4241: first transferring end; 4242: second transferring end; 425: second transferring structure; 4251: third elastic part; 4252: third transferring end; 430: sliding structure; 431: sliding rail; 440: positioning structure; 441: positioning hole; 450: roller brush; 4501: roller brush blade; 4502: roller brush base; 4503: roller brush gear assembly; 460: clamping structure; 461: clamping groove; 462: clamping block; 470: anti-regurgitation assembly; 471: anti-regurgitation door; 4711: anti-regurgitation gear assembly; 4712: second rotating shaft; 4713: first reinforcing part; 472: first anti-regurgitation portion; 473: anti-regurgitation plate; 474: second anti-regurgitation portion; 475: first anti-jamming structure; 4751: first anti-jamming sub-structure; 4752: second anti-jamming sub-structure; 476: second anti-jamming structure; 4761: third anti-jamming sub-structure; 4762: fourth anti-jamming sub-structure; 477: third anti-jamming structure; 500: auxiliary cleaning mechanism; 510: first auxiliary cleaning assembly; 511: side brush; 5111: cleaning portion; 51111: cleaning surface; 5112: side brush body; 512: rotation shaft; 513: hub; 5131: first hub; 5132: second hub; 5133: shaft sleeve; 514: barrier wall structure; 5141: first barrier wall portion; 520: second auxiliary cleaning assembly; 521: water spray assembly; 5211: spout; 5212: water spray part; 530: connection portion; 531: fixed portion; 532: telescopic part; 541: oscillating gear; 542: worm gear; 543: worm; 544: transmission gear; 550: auxiliary drive assembly; 551: drive housing; 5511: first drive housing; 5512: second drive housing; 55121: sealing portion; 552: side brush drive motor; 553: first sealing part; 554: second sealing part; 555: motor fixing part; 561: grating disk; 562: grating sensor, 600: solar mechanism; 810: water quality treatment assembly; 811: reagent kit; 1: reference plane; 2: first direction shaft; 3: second direction shaft; 2000: wireless charging connector; 2001: adapter; 2002: second reinforcing part; 900: light-emitting structure; 901: light-emitting part; 902: light transmission part; 903: light guiding part.

DETAILED DESCRIPTION

The following clearly and completely describes the technical solutions in embodiments of the present disclosure with reference to the accompanying drawings in embodiments of the present disclosure. Apparently, the described embodiments are merely some but not all of embodiments of the present disclosure. All other embodiments obtained by a person of ordinary skill in the art based on embodiments of the present disclosure without creative efforts shall fall within the protection scope of the present disclosure.

Figure 4:
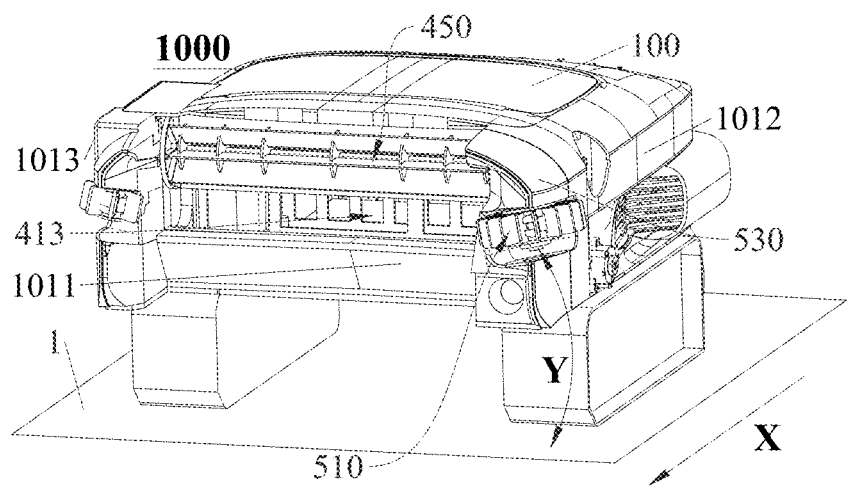
FIG. 4 is a first schematic structural view of a cleaning device according to a second embodiment of the present disclosure.
Figure 5:
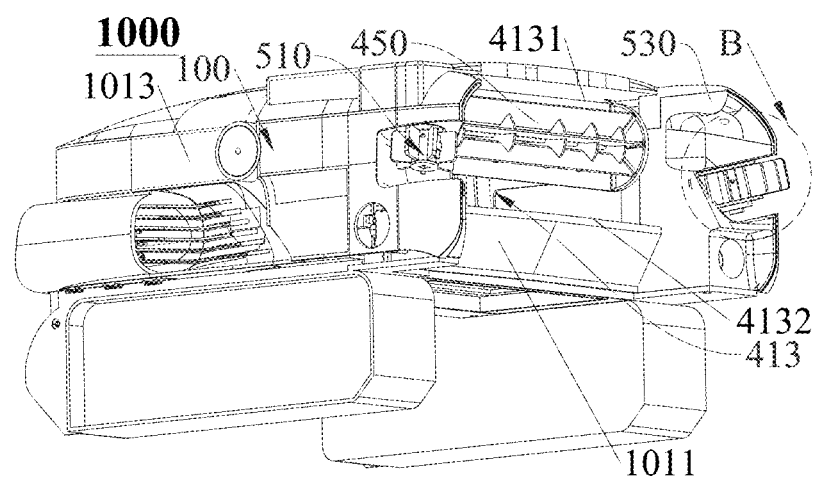
FIG. 5 is a second schematic structural view of a cleaning device according to a second embodiment of the present disclosure.

The present disclosure provides at least one cleaning device, including a water surface cleaning device configured to perform water surface cleaning, an underwater cleaning device configured to perform underwater cleaning, and a multi-functional cleaning device configured to perform underwater cleaning and water surface cleaning. A type of a water body cleaning device is not limited in following descriptions, and a construction, a structure, a function, controlling, and other aspects of the water body cleaning device are described. As shown in FIG. 1, the present disclosure provides a water surface cleaning device capable of independently performing water surface cleaning. As shown in FIG. 4 and FIG. 5, the present disclosure provides a multi-functional cleaning device capable of performing underwater cleaning and water surface cleaning.

Figure 2:
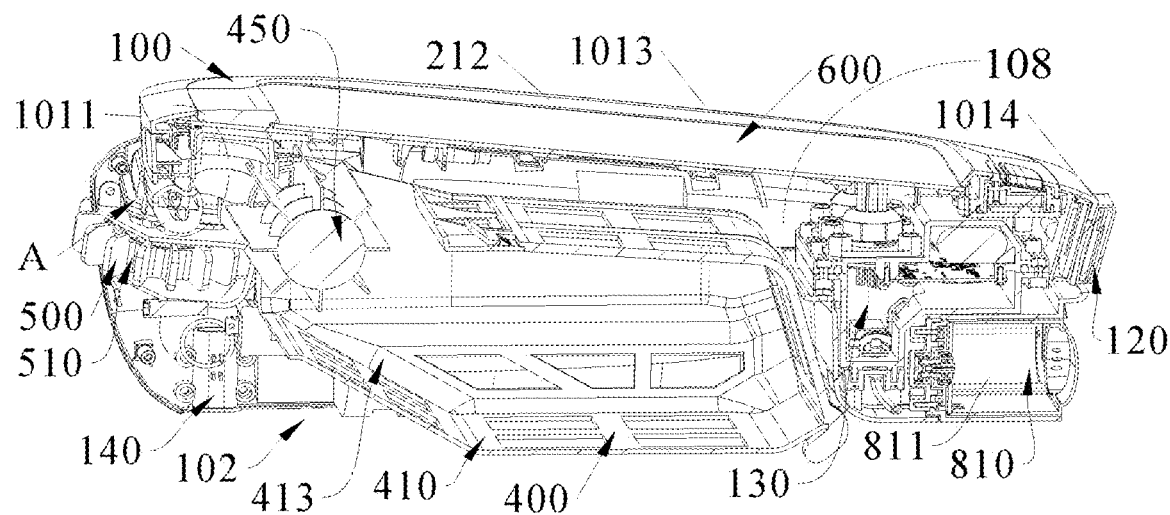
FIG. 2 is a first cross-sectional view of a cleaning device according to a first embodiment of the present disclosure.
Figure 3:
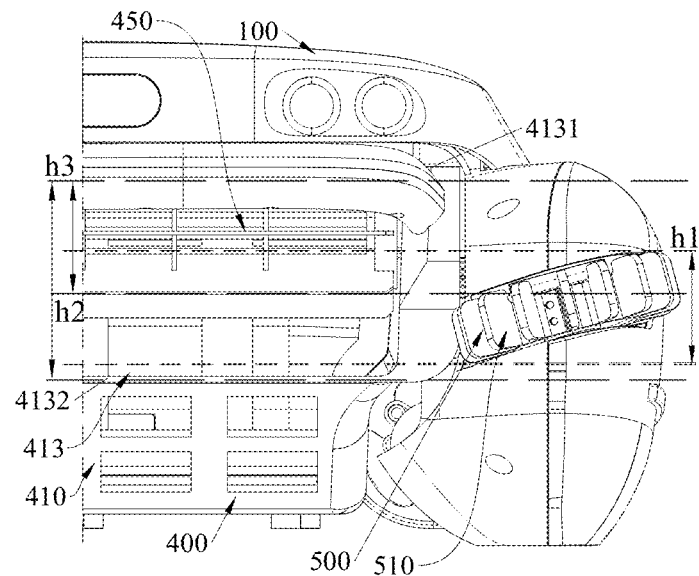
FIG. 3 is a partial side view of a cleaning device according to a first embodiment of the present disclosure.
Figure 20:
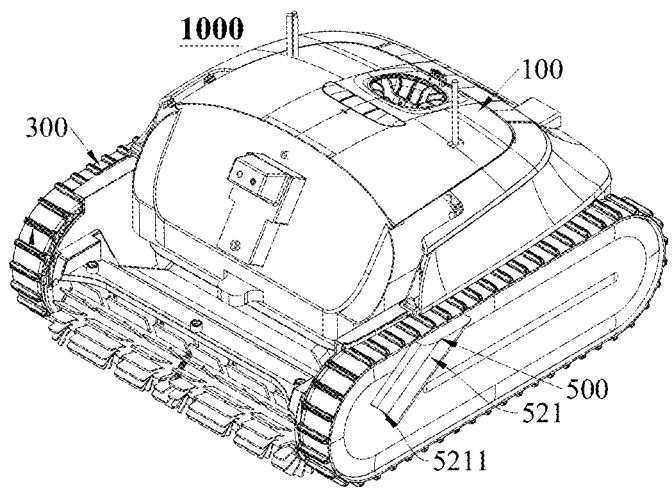
FIG. 20 is a schematic three-dimensional structural view of a cleaning device according to a fifth embodiment of the present disclosure.
Figure 21:
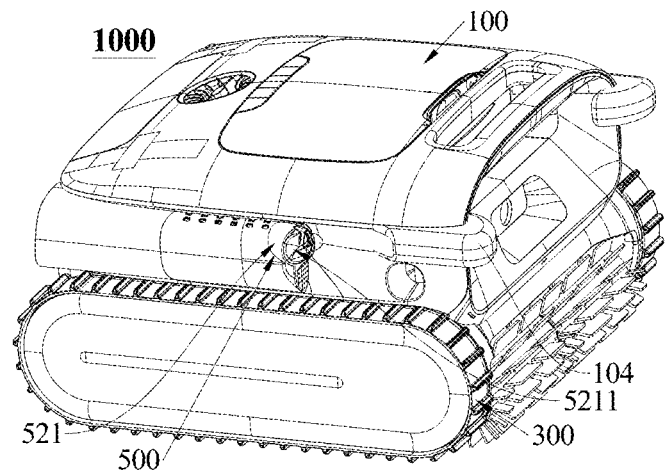
FIG. 21 is a schematic three-dimensional structural view of a cleaning device according to a sixth embodiment of the present disclosure.
Figure 22:
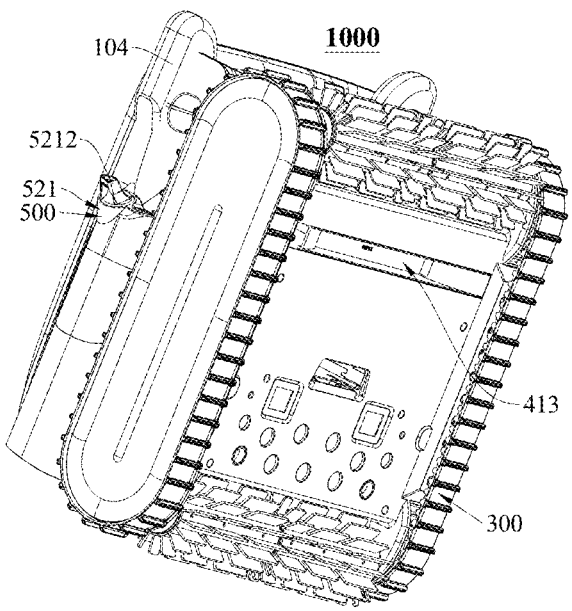
FIG. 22 is a schematic structural view of the bottom of the cleaning device according to a sixth embodiment of the present disclosure.

FIG. 1 is a first partial schematic view of a cleaning device according to a first embodiment of the present disclosure. FIG. 2 is a first cross-sectional view of the cleaning device according to the first embodiment of the present disclosure. FIG. 3 is a partial side view of the cleaning device according to the first embodiment of the present disclosure. The present disclosure provides a water surface cleaning device. The water surface cleaning device may clean debris in a pool, such as an object floating on a water surface. The water surface cleaning device includes a cleaning device body 100, an adjustment mechanism 200, a moving mechanism 300 (as shown in FIG. 20), a main cleaning mechanism 400, an auxiliary cleaning mechanism 500, a solar mechanism 600, and a water quality treatment assembly 810. The cleaning device body 100 has an outer side portion (not shown in the figure). The outer side portion is a peripheral region of the cleaning device body 100, and may be understood as a peripheral contour of a cleaning device 1000. There may be a plurality of outer side portions. An accommodating opening 102 is provided on at least one outer side portion. An accommodating groove 108 is provided at the cleaning device body 100, and is configured to accommodate at least a part of the main cleaning mechanism 400. The accommodating opening 102 communicates with the accommodating groove 108. The adjustment mechanism 200 is disposed at the cleaning device body 100. The adjustment mechanism 200 is configured for the water surface cleaning device to perform water surface operation. For example, the adjustment mechanism 200 includes at least one buoyancy cavity 210. The buoyancy cavity 210 is provided at the cleaning device body 100 and configured to adjust the cleaning device body 100 to be at least partially located on the water surface.

The moving mechanism 300 is disposed at the cleaning device body 100. The moving mechanism 300 is configured to drive the cleaning device body 100 to move. The moving mechanism 300 may include a propeller 310 (as shown in FIG. 36).

The main cleaning mechanism 400 is at least configured to perform filtering. The main cleaning mechanism 400 includes at least one filtering box 410. The filtering box 410 is at least partially accommodated in the accommodating groove 108. The filtering box 410 is of a frame structure, and at least a part of the filtering box 410 is hollowed. A filtering layer (not shown) is provided at a hollowed region of the filtering box 410. The filtering layer has a filtering function, and is configured to filter debris in sewage flowing through the filtering box 410 and configured for the debris to remain inside the filtering box 410. Certainly, the filtering box 410 may alternatively be a filtering bag. A debris inlet 413 is provided on the filtering box 410. A position of the accommodating opening 102 may be the same as that of the debris inlet 413, and the accommodating opening 102 communicates with the debris inlet 413. Alternatively, the position of the accommodating opening 102 may be different from that of the debris inlet 413, and a liquid inlet is provided on the cleaning device body 100 and communicates with the debris inlet 413. During a cleaning process, a dust-loaded water flow may flow through the accommodating opening 102, the debris inlet 413, the inside of the filtering box 410, and the outside of the filtering box 410 sequentially, to form a cleaned water flow channel (not shown). Alternatively, during the cleaning process, the dust-loaded water flow may flow through the liquid inlet, the debris inlet 413, the inside of the filtering box 410, and the outside of the filtering box 410 sequentially, to form a cleaned water flow channel. The liquid inlet and the accommodating opening 102 are disposed at different positions. The cleaning water flow channel can be configured to separate a water flow from the debris, so that the debris remains in the filtering box 410. The main cleaning mechanism 400 may be detachably mounted inside the accommodating groove 108 through the accommodating opening 102, so that the filtering box 410 can be conveniently mounted and removed to dump the debris.

In an embodiment, a frame of the filtering box 410 is made of plastic or similar materials. Another different material which is more buoyant than the frame of the filtering box 410, such as foam, is attached or fixed to the frame, so that the filtering box 410 can float on the water surface. The material can be located at the bottom of the filtering box 410 or other positions. This is not limited here. In this way, the following case can be avoided: The filtering box 410 is difficult to retrieve in time if the filtering box 410 sinks accidentally in the pool, for example, when the user takes out the filtering box 410 from the cleaning device 1000 in the pool, the filtering box 410 accidentally falls into the pool.

The auxiliary cleaning mechanism 500 is disposed at the cleaning device body 100. The auxiliary cleaning mechanism 500 is at least configured to increase a cleaning range of the debris inlet 413. The auxiliary cleaning mechanism 500 is configured to perform auxiliary cleaning to improve cleaning efficiency. The auxiliary cleaning mechanism 500 may be configured to increase the cleaning range of the debris inlet 413. For example, debris outside of a cleaning route of the debris inlet 413 may be guided to the cleaning range of the debris inlet 413 through the auxiliary cleaning mechanism 500. In addition, the auxiliary cleaning mechanism 500 may be configured to perform auxiliary cleaning. For example, when the water surface cleaning device moves at a region close to a wall of a pool, the auxiliary cleaning mechanism 500 may clean the wall of the pool.

The solar mechanism 600 includes a solar panel. The solar panel is provided on a top surface of the cleaning device body 100 to supplement energy for the water surface cleaning device. The cleaning device body 100 includes a top cover 107. The top cover 107 may be the top of the cleaning device body 100. The top cover 107 is connected to an outer side wall of the cleaning device body 100. Compared with the related technology in which the top cover needs to be turned over and opened to mount and remove the filtering box, in embodiments of the present disclosure, because the filtering box 410 in the main cleaning mechanism 400 is mounted in the accommodating groove 108 through the accommodating opening 102 disposed on the outer side portion, the user does not need to frequently flip and open the top cover 107 during processes of mounting and removing the filtering box 410, and the solar mechanism 600 may be directly fixed on the cleaning device body 100, that is, the solar mechanism 600 is not a detachable mechanism. This improves stability of the solar panel and various wires in the solar mechanism 600 and a service life of the solar mechanism 600. In addition, an area of the solar panel can be designed to be larger to improve energy supplement efficiency.

Figure 6:
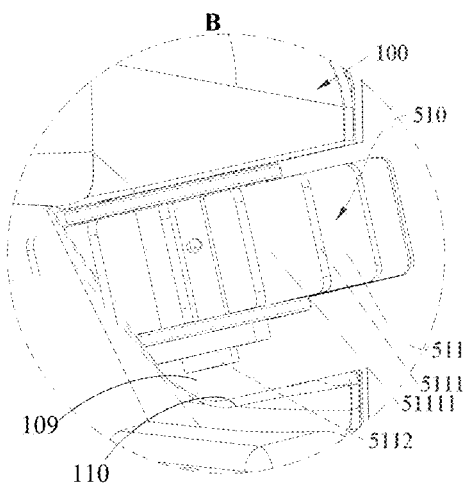
FIG. 6 is an enlarged schematic view of a portion B shown in FIG. 5.

FIG. 4 is a first schematic structural view of the cleaning device according to a second embodiment of the present disclosure. FIG. 5 is a second schematic structural view of the cleaning device according to the second embodiment of the present disclosure. FIG. 6 is an enlarged schematic view of a portion B shown in FIG. 5. Some embodiments of the present disclosure provide a multi-functional cleaning device. The multi-functional cleaning device includes the cleaning device body 100, the adjustment mechanism 200, the moving mechanism 300, the main cleaning mechanism 400, and the auxiliary cleaning mechanism 500. The multi-functional cleaning device may perform all-round cleaning in a water body environment, that is, a bottom, the wall, a water body, a waterline, and the water surface of the pool may be cleaned. The adjustment mechanism 200 is configured to adjust an operation position and an attitude of the multi-functional cleaning device in the water, to clean each target position in the water. When underwater cleaning is performed, the main cleaning mechanism 400 includes at least one filtering box and a main water pump. When the main water pump is in operation, a cleaned water flow, which sequentially flows through the liquid inlet, the filtering box, the main water pump, and an outlet of the multi-functional cleaning device, is generated by the main water pump. When water surface cleaning is performed, an operation process of the multi-functional cleaning device is similar to that of the water surface cleaning device.

The adjustment mechanism 200 may include the buoyancy cavity 210 and a buoyancy cavity adjustment assembly. The buoyancy cavities 210 are substantially symmetrically provided at the cleaning device body 100. The buoyancy adjustment assembly communicates with the buoyancy cavity 210, to adjust a volume of liquid or gas in the buoyancy cavity 210 when the multi-functional cleaning device performs different cleaning modes. Therefore, different poses of the multi-functional cleaning device can be switched in the water, the waterline, and the water surface. Alternatively, the buoyancy cavity 210 is filled with a material for the cleaning device body 100 to float on the water surface, such as foam, so that the cleaning device 100 can perform water surface cleaning. In a specific embodiment, the material filled in the buoyancy cavity 210 may have low water-absorbing quality to prevent the cleaning device body 100 from sinking after the material absorbs water. This improves stability of the cleaning device body 100 on the water surface.

FIG. 1 to FIG. 3 illustrate schematic structural views of the water surface cleaning device according to the present disclosure. FIG. 4 and FIG. 5 illustrate schematic structural views of the multi-functional cleaning device according to the present disclosure. FIG. 6 is an enlarged schematic view of a portion B shown in FIG. 5. The water surface cleaning device and the multi-functional cleaning device in embodiments are both represented by the cleaning device 1000. The cleaning device 1000 includes the cleaning device body 100 and the auxiliary cleaning mechanism 500. The auxiliary cleaning mechanism 500 includes a first auxiliary cleaning assembly 510. The cleaning device body 100 may move along a reference plane. The reference plane may be a bottom wall of the pool, a side wall of the pool, or the water surface of the pool. The reference plane may be defined as a reference plane substantially parallel to a forward direction of the cleaning device 1000 and a to-be-cleaned surface, such as a reference plane 1 shown in FIG. 4. The cleaning device body 100 includes a first side portion 1011, a second side portion part 1012, and a third side portion 1013. The outer side portion includes at least the first side portion 1011, the second side portion 1012, and the third side portion part 1013.

The first side portion 1011 is a side surface facing a forward direction X of the cleaning device body 100. The debris inlet 413 is provided at the first side portion 1011. The debris inlet 413 is an opening configured for a water flow, stains, and the like to enter the cleaning device body 100. The stains may be debris floating in the pool, scale or black stains accumulated in the pool, and the like. The second side portion 1012 and the third side portion 1013 are both connected to the first side portion 1011, and are provided at two sides of the first side portion 1011. Looking from a rear portion of the cleaning device 1000 to a front portion of the cleaning device 1000, the second side portion 1012 is located on a left side of the cleaning device body 100, and the third side portion 1013 is located on a right side of the cleaning device body 100.

The first auxiliary cleaning assembly 510 may be configured to clean the pool. The first auxiliary cleaning assembly 510 is configured to increase the cleaning range of the debris inlet 413 or configured to be in physical contact with and clean the wall of the pool located at a side of the cleaning device 1000.

Specifically, the cleaning range of the debris inlet 413 is a range in which the debris inlet 413 may affect the water flow and the stains when the debris inlet 413 is in a state of sucking the water flow and the stains. Generally, the cleaning range of the debris inlet 413 may be a coverage region or a working region of the debris inlet 413 during a moving process of the cleaning device 1000. The debris inlet 413 directly or indirectly has a suction capability to suck the water flow and the stains, or the debris inlet 413 does not have the suction capability, and the cleaning device body 100 moves relative to the water flow, so that the water flow and the stains are drawn into the debris inlet 413. The first auxiliary cleaning assembly 510 may be provided on an outer surface region in which the second side portion 1012 or the third side portion 1013 transitions to the first side portion 1011. In other words, when the first auxiliary cleaning assembly 510 is in operation, the first auxiliary cleaning assembly 510 may act on a side of the cleaning device 1000 and the front portion of the cleaning device 1000. Alternatively, the first auxiliary cleaning assembly 510 may be disposed inside the cleaning device body 100. Alternatively, the first auxiliary cleaning assembly 510 may be disposed at the forward portion of the cleaning device body 100, namely, the first side portion 1011. Alternatively, the first auxiliary cleaning assembly 510 may be disposed at a side portion of the cleaning device body 100, namely, the second side portion 1012 and/or the third side portion 1013.

Based on the above disposition, when the cleaning device body 100 moves forward along the forward direction, because the debris inlet 413 is located at the front portion of the cleaning device body 100, the debris inlet 413 may suck the stains as the cleaning device body 100 moves forward. Under the action of the first auxiliary cleaning assembly 510, debris, which is originally located outside of the coverage region of the debris inlet 413, may be guided to the working region of the debris inlet 413. In this way, the cleaning range of the debris inlet 413 is increased accordingly, thereby improving debris cleaning efficiency.

The first auxiliary cleaning assembly 510 agitates the water flow toward the debris inlet 413, or a suction force of the debris inlet 413 is improved, to increase the cleaning range of the debris inlet 413. This is not limited herein. In an embodiment, the first auxiliary cleaning assembly 510 may be rotatably provided at the cleaning device body 100 to agitate the water flow near the debris inlet 413, so that the water flow located outside the working region of the debris inlet 413 flows to the working region of the debris inlet 413. In this way, debris located outside the working region can be driven to flow to the working region of the debris inlet 413 with the water flow, and flow into the cleaning device body 100.

A rotation direction of the first auxiliary cleaning assembly 510 may be set based on an actual situation, provided that the water flow can be agitated to flow to the debris inlet 413. For example, as shown in FIG. 4, in a case in which it is viewed from the top of the cleaning device 1000 to the bottom of the cleaning device 1000 along the forward direction X, when the first auxiliary cleaning assembly 510 is closer to the left side of the cleaning device body 100 relative to the debris inlet 413, the first auxiliary cleaning assembly 510 rotates in a clockwise direction, and when the first auxiliary cleaning assembly 510 is closer to the right side of the cleaning device body 100 relative to the debris inlet 413, the first auxiliary cleaning assembly 510 rotates in a counterclockwise direction. Based on the above disposition, when the first auxiliary cleaning assembly 510 is in operation, a water flow away from the debris inlet 413, especially a water flow located at a left front or a right front of the cleaning device 1000, is agitated and guided to the debris inlet 413. A direction of the water flow is substantially opposite to the forward direction of the cleaning device 1000, that is, as the cleaning device 1000 moves, the water flow guided by the first auxiliary cleaning assembly 510 may be sucked into the cleaning device body 100 through the debris inlet 413.

In an embodiment, as shown in FIG. 3 and FIG. 4, a vertical direction is defined as a height direction of the cleaning device 1000, namely, a direction of a connection line between a bottom center and a top center of the cleaning device 1000. When the cleaning device 1000 is placed horizontally, the vertical direction corresponds to a gravity direction of the cleaning device 1000. As shown in FIG. 3 and FIG. 4, the cleaning device 1000 is placed horizontally, and along the height direction, namely, the height direction of the cleaning device 1000, a projection of the first auxiliary cleaning assembly 510 at least partially overlaps with a projection of the debris inlet 413. As shown in FIG. 5, the debris inlet 413 includes at least a first edge 4131 close to the top of the cleaning device 1000 and a second edge 4132 close to the bottom of the cleaning device 1000. The above projection relationship between the first auxiliary cleaning assembly 510 and the debris inlet 413 may be further described as follows. Along the height direction of the cleaning device 1000, the projection of the first auxiliary cleaning assembly 510 is at least partially located between a projection of the first edge 4131 and a projection of the second edge 4132. Alternatively, along the height direction of the cleaning device 1000, the first auxiliary cleaning assembly 510 is at least partially located between the first edge 4131 and the second edge 4132.

As shown in FIG. 3, a projection height of the first auxiliary cleaning assembly 510 in the height direction is h1, a projection height of the debris inlet 413 in the height direction may be h2 or h3, and h1 at least partially overlaps with h2 or h3.

When the cleaning device 1000 performs a water surface cleaning operation, the debris inlet 413 is at least partially located below the water surface. In other words, the second edge 4132 is located below the water surface, and the first edge 4131 may be located above or below the water surface. The first auxiliary cleaning assembly 510 may be at least partially located below the water surface. In a case where the first edge 4131 of the debris inlet 413 is located above the water surface, one portion of the first auxiliary cleaning assembly 510 is located on the water surface, and the other portion of the first auxiliary cleaning assembly 510 is located below the water surface may be taken as an example. In this case, one portion of the debris inlet 413 is located on the water surface, and the other portion of the debris inlet 413 is located below the water surface. When the first auxiliary cleaning assembly 510 is in operation, debris near the cleaning device 1000 may be guided to a region between the first edge 4131 and the second edge 4132, and may be directly sucked into the debris inlet 413.

Figure 7:
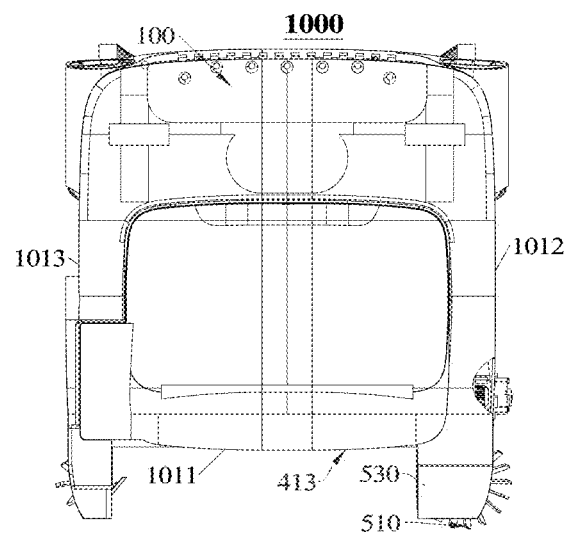
FIG. 7 is a third schematic structural view of a cleaning device according to a second embodiment of the present disclosure.

In an embodiment, as shown in FIG. 1 and FIG. 7, at least a part of the first auxiliary cleaning assembly 510 is disposed in front of the debris inlet 413 along the X direction. As the cleaning device body 100 moves forward, debris cleaned and driven by the first auxiliary cleaning assembly 510 may naturally reach the working region of the debris inlet 413.

Figure 12:
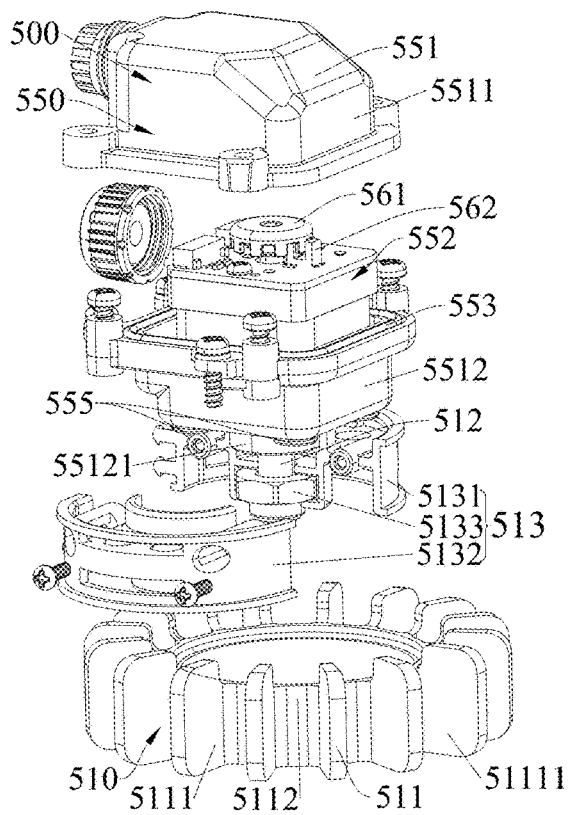
FIG. 12 is a partial exploded schematic view of the cleaning device shown in FIG. 11.

In an embodiment, as shown in FIG. 6 and FIG. 12, the first auxiliary cleaning assembly 510 includes a side brush 511 and a rotation shaft 512. The side brush 511 is disposed around the rotation shaft 512. The rotation shaft 512 is rotatably connected to the cleaning device body 100. The side brush 511 includes a side brush strip (not shown). The side brush strip includes a side brush body 5112 and several cleaning portions 5111 provided at the side brush body 5112 at intervals. The cleaning portion 5111 includes at least one cleaning surface 51111. The cleaning surface 51111 is obliquely configured relative to the reference plane 1. The cleaning surface 51111 is configured to agitate the water flow or be in contact with and clean the wall of the pool. Specifically, when the rotation shaft 512 rotates, the rotation shaft 512 is configured to drive the side brush 511 to rotate. When the side brush 511 rotates, the cleaning surface 51111 is configured to agitate the water flow or be in contact with the wall of the pool.

Figure 38A:
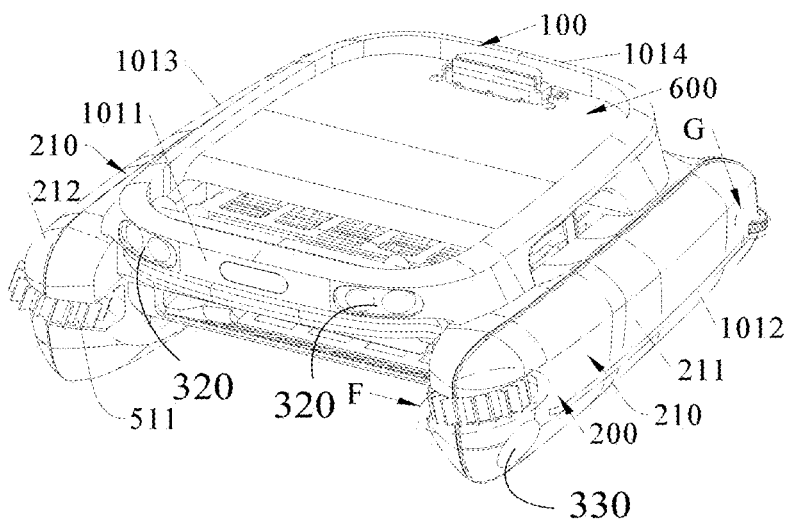
FIG. 38a is a schematic structural view of a cleaning device according to a seventh embodiment of the present disclosure.
Figure 38B:
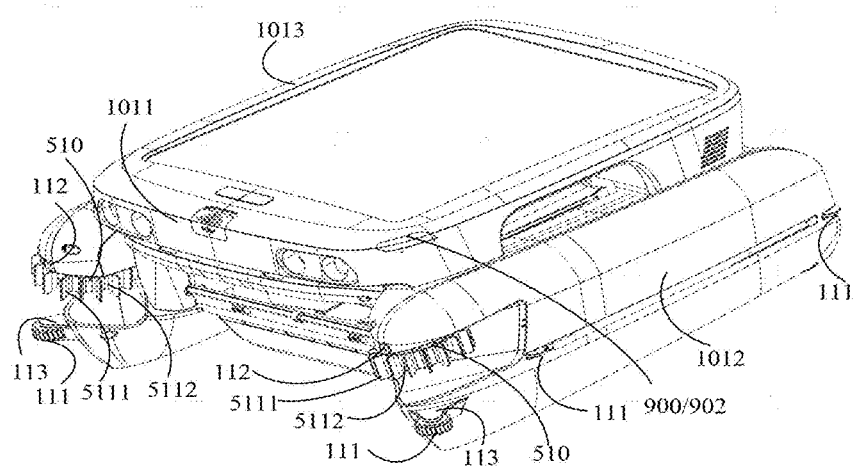
FIG. 38b is a schematic structural view of a cleaning device according to an eighth embodiment of the present disclosure.

In an embodiment, as shown in FIG. 38b, shapes of different cleaning portions 5111 of one side brush body 5112 may be different. For example, one cleaning portion 5111 has a tail end away from the rotation shaft 512, and the tail end is in a straight-line shape; and one cleaning portion 5111 has a tail end away from the rotation shaft 512, and the tail end is serrated. The tail end of the cleaning portion 5111 is set to be serrated, so that the cleaning portion 5111 can block some debris, such as long hair, which is convenient for the user to perform cleaning. The tail end of the cleaning portion 5111 is set to be in a straight-line shape, so that the side brush body 5112 can better stir the water flow. Different cleaning portions 5111 of the side brush body 5112, such as adjacent cleaning portions 5111, are set to be in different shapes, to ensure a stirring effect of the side brush 511 while the side brush 511 can block the debris.

The cleaning surface 51111 obliquely configured relative to the reference plane 1 may agitate the water flow at an oblique angle. In this way, when the side brush 511 rotates, it is not easy for the side brush 511 to form, along a tangential direction of an edge of the side brush 511, a water flow substantially parallel to the forward direction X. Stains located near the edge of the side brush 511 may not be constantly pushed forward by the water flow, so that the stains can approach the debris inlet 413.

In an embodiment, the rotation shaft 512 is configured obliquely at the cleaning device body 100, that is, the rotation shaft 512 is disposed at an angle Y relative to the reference plane 1. The angle Y may be set in a range from 0° to 90°, such as 30°, 40°, 60°, 70°, 75°, or 80°. This is not limited herein. The rotation shaft 512 is obliquely configured, so that the first auxiliary cleaning assembly 510, namely, the side brush 511, can rotate obliquely in the water. A portion of the side brush 511 is close to the debris inlet 413, and the portion is in contact with the water. A portion of the side brush 511 is away from the debris inlet 413, and the portion is located above the water surface or mostly located above the water surface. A direction of a linear velocity at which the side brush 511 agitates the water body points to the debris inlet 413 all the time, so that it can be effectively ensured that the side brush 511 can guide the debris to the working region of the debris inlet 413 instead of pushing the debris away, thereby improving water surface cleaning efficiency.

There may be one, two, three, or a plurality of cleaning surfaces 51111. This is not limited herein. The rotation shaft 512 may be connected to a drive part disposed at the cleaning device body 100. The drive part is configured to drive the rotation shaft 512 to rotate. The drive part may be a stepper motor, and the like.

Figure 8:
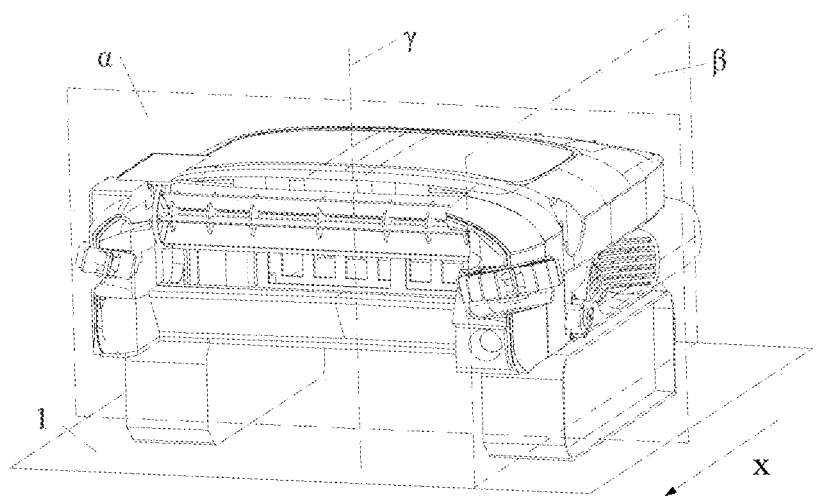
FIG. 8 is a fourth schematic structural view of a cleaning device according to a second embodiment of the present disclosure.
Figure 9:
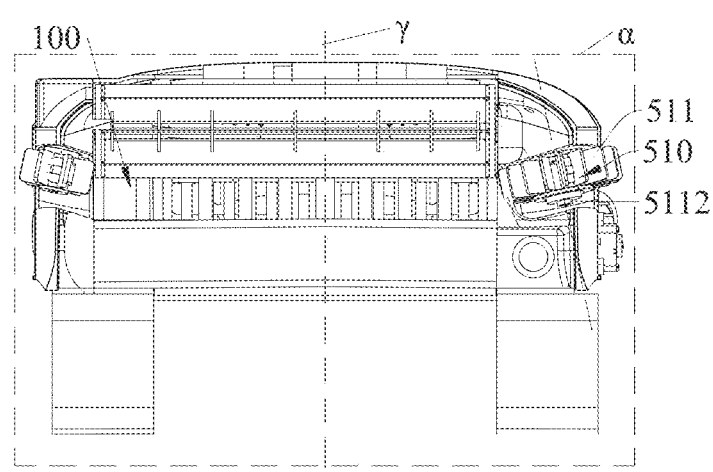
FIG. 9 is a fifth schematic structural view of a cleaning device according to a second embodiment of the present disclosure.
Figure 10:
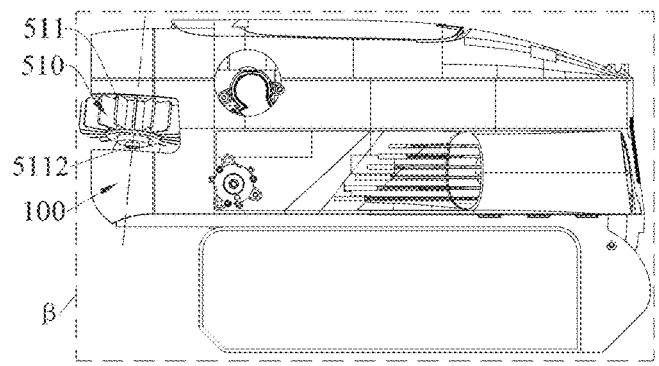
FIG. 10 is a sixth schematic structural view of a cleaning device according to a second embodiment of the present disclosure.

An inclined direction of an axis of the rotation shaft 512 relative to the reference plane 1 may be determined based on an actual situation. In an embodiment, as shown in FIG. 8 to FIG. 10, the cleaning device 1000 includes a first reference plane α, and the first reference plane α is perpendicular to the reference plane 1 and the forward direction X. In other words, the first reference plane α is a plane extending along a left-right direction of the cleaning device body 100. In another embodiment, a reference center line γ is set between the second side portion 1012 and the third side portion 1013. The reference center line γ is a line of the connection line between the center of the top of the cleaning device 1000 and the center of the bottom of the cleaning device 1000. In other words, when the cleaning device 1000 is placed horizontally, the reference center line γ is a virtual straight line substantially parallel to a gravity line of the cleaning device 1000. In another embodiment, as shown in FIG. 8, the cleaning device 1000 includes a second reference plane β, and the second reference plane β is substantially perpendicular to the reference plane 1 and substantially parallel or coincident with the forward direction X. In another embodiment, the cleaning device 1000 further includes a third reference plane, and the third reference plane is a plane different from the first reference plane and the second reference plane. The axis of the rotation shaft 512 may be located in the first reference plane α, the second reference plane β, or the third reference plane. No matter which reference plane the axis of the rotation shaft 512 is located in, on the whole, a portion of the axis of the rotation shaft 512a is close to the top of the cleaning device 1000, another portion of the axis of the rotation shaft 512a is close to the bottom of the cleaning device 1000, and a distance between the portion close to the top of the cleaning device 1000 and the reference center line γ is less than a distance between the portion close to the bottom of the cleaning device 1000 and the reference center line γ. In other words, a distance between a center of an upper surface of the side brush 511 and the reference center line γ is less than a distance between a center of a lower surface of the side brush 511 and the reference center line γ, that is, a position at which the side brush 511 is close to an outer contour of the cleaning device body 100 is higher than a position at which the side brush 511 is close to the reference center line γ of the cleaning device body 100. In other words, it may be understood that the rotation shaft 512 inclines toward the interior of the cleaning device body 100.

In other embodiments, the distance between the center of the upper surface of the side brush 511 (the center may be understood as an intersection point at which the axis of the rotation shaft 512 intersects with the upper surface of the side brush 511) and the reference center line γ is greater than the distance between the center of the lower surface of the side brush 511 and the reference center line γ. Accordingly, the position at which the side brush 511 is close to the outer contour of the cleaning device body 100 is lower than the position at which the side brush 511 is close to the reference center line γ of the cleaning device body 100. In other words, it may be understood that the rotation shaft 512 inclines toward the exterior of the cleaning device body 100, and as the side brush 511 rotates, there is a tendency that deep water at an outer edge of the cleaning device 1000 may be guided to the debris inlet 413.

In another embodiment, the axis of the rotation shaft 512 of the side brush 511 is substantially parallel to the reference center line γ. In this case, the side brush 511 may be substantially horizontally provided at the cleaning device body 100. During an operation process of the cleaning device 1000, one portion of the side brush 511 may be located on the water surface, and the other portion of the side brush 511 may be located below the water surface, so that there is also a tendency that debris at the outer edge of the cleaning device body 100 may be guided to the working region of the debris inlet 413. Certainly, in this case, the cleaning portion 5111 is obliquely configured relative to the rotation shaft 512 to guide the water flow to the debris inlet 413.

In an embodiment, the side brush 511 includes several cleaning portions 5111. The several cleaning portions 5111 are provided around a periphery of the rotation shaft 512. The several cleaning portions 5111 extend, as a whole, along an axial direction of the rotation shaft 512. A side of the cleaning portion 5111 has a cleaning surface 51111. The cleaning surface 51111 is a side surface of the cleaning portion 5111, and the side surface faces the rotation direction of the rotation shaft 512. An extending direction of the cleaning surface 51111 may be substantially parallel to the rotation shaft 512 or set at an angle relative to the rotation shaft 512 (that is, the several cleaning portions 5111 are disposed around the periphery of the rotation shaft 512 in a spiral rotation manner). Therefore, the cleaning portion 5111 is disposed axially along the rotation shaft 512, so that the side brush 511 has a simple structure and is easy to manufacture. When the inclined rotation shaft 512 rotates, the cleaning portion 5111 can agitate the water flow at an oblique angle relative to the reference plane 1.

At least some of the cleaning portions 5111 are made of a flexible material, and/or at least some of the cleaning portions 5111 are made of a rigid material. In an embodiment, all the cleaning portions 5111 are made of a flexible material. In another embodiment, all the cleaning portions 5111 are made of a rigid material. In another embodiment, some of the cleaning portions 5111 are made of a flexible material, and some of the several cleaning portions 5111 are made of a rigid material. The flexible material is a material capable of undergoing elastic deformation. The rigid material is a material that cannot easily undergo elastic deformation.

When the cleaning portion 5111 is made of a flexible material, the cleaning portion 5111 may be a bristle, a rubber sheet, or the like. When the cleaning portion 5111 is made of a rigid material, the cleaning portion 5111 may be a plastic blade, a metal blade, or the like. There may be one, two, three, or a plurality of cleaning portions 5111. This is not limited herein.

Specifically, in an embodiment, the cleaning surface 51111 is obliquely configured relative to the reference plane 1, including a case where the axis of the rotation shaft 512 is substantially perpendicular to the reference plane 1. The side brush 511 includes the several cleaning portions 5111. The several cleaning portions 5111 are provided around the periphery of the rotation shaft 512. The several cleaning portions 5111 incline or bend toward the rotation direction of the rotation shaft 512. The side of the cleaning portion 5111 has the cleaning surface 51111. The cleaning surface 51111 is the side surface of the cleaning portion 5111, and the side surface faces the rotation direction of the rotation shaft 512. When the rotation shaft 512 rotates, the inclined and bent cleaning portion 5111 may agitate the water flow at an oblique angle.

A quantity of first auxiliary cleaning assemblies 510 and a position of the first auxiliary cleaning assembly 510 may be determined based on an actual situation. In an embodiment, one first auxiliary cleaning assembly 510 may be provided at the second side portion 1012 or the third side portion 1013 of the cleaning device 1000. Alternatively, one first auxiliary cleaning assembly 510 may be provided at each of the second side portion 1012 and the third side portion 1013. In this embodiment, the first auxiliary cleaning assembly 510 may be disposed at any position on the second side portion 1012 and/or at any position on the third side portion 1013, such as a position close to the front portion of the cleaning device body 100, a center position of the side portion, or the rear portion of the cleaning device body 100. In another embodiment, the first auxiliary cleaning assembly 510 may be provided at a transition position between the first side portion 1011 and the second side portion 1012 of the cleaning device 1000 and/or a transition position between the first side portion 1011 and the third side portion 1013 of the cleaning device 1000. In this case, a part of the first auxiliary cleaning assembly 510 protrudes from the first side portion 1011, and another part of the first auxiliary cleaning assembly 510 protrudes from the second side portion 1012 and/or the third side portion 1013.

In an embodiment, a connection portion 530 extends from the cleaning device body 100 along the forward direction X, and the first auxiliary cleaning assembly 510 is provided at the connection portion 530. The connection portion 530 may extend from the second side portion 1012 or the third side portion 1013 along the forward direction X, or the connection portion 530 may be additionally provided from the first side portion 1011 along the forward direction X.

In an embodiment, the cleaning device 1000 further includes a roller brush 450. The roller brush 450 may be rotatably provided at the cleaning device body 100 or an inlet for water surface cleaning of the filtering box 410. The inlet for water surface cleaning is a debris inlet when the cleaning device body 100 performs water surface cleaning, and the inlet for water surface cleaning of the filtering box 410 may be the debris inlet 413 or another inlet. As the roller brush 450 rotates, a water flow outside the filtering box 410 is guided to flow through the inlet for water surface cleaning of the filtering box 410 and enters the interior of the filtering box 410. When the cleaning device 1000 is in a state of cleaning the water surface, the roller brush 450 is at least partially located below the water surface to effectively agitate the water flow at the inlet for water surface cleaning of the filtering box 410, thereby improving efficiency of external debris entering the filtering box 410. In addition, a part of debris inside the filtering box 410 is prevented from being regurgitated to the to-be-cleaned region. In a specific embodiment, when water surface cleaning is performed, one portion of the roller brush 450 is located below the water surface, and the other portion of the roller brush 450 is located on the water surface, which corresponds to a case where the portion of the debris inlet 413 is located on the water surface, and the other portion of the debris inlet 413 is located below the water surface, to implement a better water surface cleaning effect.

Therefore, in an embodiment, when the cleaning device 1000 performs water surface cleaning, the portion of the debris inlet 413 is located on the water surface, and the other portion of the debris inlet 413 is located below the water surface, so that debris floating on the water surface, such as leaves and garbage bags, can naturally enter the filtering box 410 along with a water flow at the water surface. The portion of the roller brush 450 is located below the water surface, and the other portion of the roller brush 450 is located on the water surface, so that, in the working region of the debris inlet 413, the roller brush 450 can at least guide the water flow at the water surface to the debris inlet 413. The rotation shaft 512 of the first auxiliary cleaning assembly 510 is configured obliquely, so that when the first auxiliary cleaning assembly 510 is in operation, debris floating on the water surface and located outside the working region of the debris inlet 413 can be guided to the working region of the debris inlet 413 from the side portion and the front portion of the cleaning device body 100. Further, with a movement of the cleaning device 1000 and under the action of the roller brush 450, the debris can be guided to pass through the debris inlet 413 and finally enter the filtering box 410.

Figure 11:
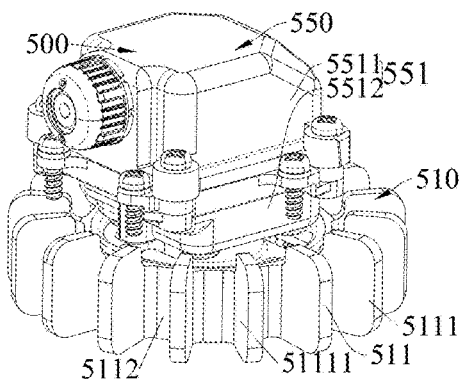
FIG. 11 is a second partial schematic view of a cleaning device according to a first embodiment of the present disclosure.
Figure 13:
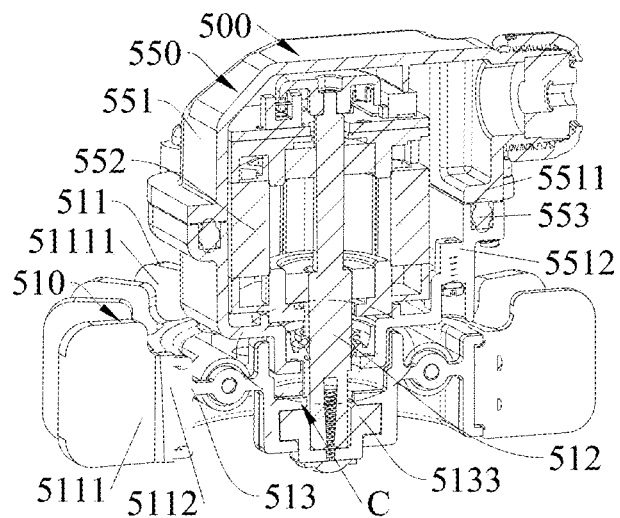
FIG. 13 is a second cross-sectional view of a cleaning device according to a first embodiment of the present disclosure.

FIG. 11 to FIG. 13 illustrate a structure of the first auxiliary cleaning assembly 510 of the cleaning device 1000, and the auxiliary cleaning assembly 510 is the side brush 511. The side brush 511 includes the side brush strip. The side brush strip includes at least a side brush body 5112 and several cleaning portions 5111 provided at the side brush body 5112 at intervals. The side of the cleaning portion 5111 has the cleaning surface 51111. The cleaning portion 5111 may be detachably or fixedly provided at the side brush body 5112. In this embodiment, the several cleaning portions 5111 are integrally provided on the side brush body 5112 to form the side brush strip, and the side brush strip is provided around the periphery of the rotation shaft 512. Since the side brush strip is a wearing part, it is convenient to disassemble, replace, and maintain the side brush strip.

In an embodiment, the several cleaning portions 5111 may be provided at the side brush body 5112 at equal intervals or unequal intervals. A disposition manner of adjacent cleaning portions 5111 may be determined based on an actual requirement. For example, the adjacent cleaning portions 5111 may be disposed in a straight line along a width direction of the side brush body 5112, or the adjacent cleaning portions 5111 may be disposed in a straight line at an angle relative to the width direction of the side brush body 5112, or the adjacent cleaning portions 5111 may be disposed in a curved line along the width direction of the side brush body 5112. When the side brush body 5112 is provided around the periphery of the rotation shaft 512, at least some of the cleaning portions 5111 extend along the axial direction of the rotation shaft 512 and are substantially perpendicular to the side brush body 5112. Alternatively, at least some of the cleaning portions 5111 extend along the axial direction of the rotation shaft 512 and are obliquely configured relative to the side brush body 5112. In this way, the cleaning portion 5111 is disposed at the side brush body 5112 in various forms, provided that performance requirements that the cleaning surface 51111 is in contact with and agitates the water flow can be met.

In some embodiments, the first auxiliary cleaning assembly 510 further includes a hub 513. The hub 513 is sleeved on the rotation shaft 512. The several cleaning portions 5111 are provided around a periphery of the hub 513, or the several cleaning portions 5111 are provided around the hub 513 through the side brush body 5112. The hub 513 is provided, so that a diameter of the side brush 511 is increased, and a quantity of cleaning portions 5111 or an overall length of the side brush strip can be increased, thereby increasing the cleaning range of the cleaning device 1000. The several cleaning portions 5111 are detachably connected to the periphery of the hub 513, or the several cleaning portions 5111 may be detachably connected to the periphery of the hub 513 through the side brush body 5112, so that the several cleaning portions 5111 or the side brush strip are conveniently mounted and replaced. Specifically, the several cleaning portions 5111 or the side brush strip may be fixed on the hub 513 through a fixing part. The fixing part may be, but is not limited to, a screw, a buckle, or the like.

When the side brush strip is detachably mounted on the rotation shaft 512 or the hub 513, there may be one, two, or a plurality of side brush strips. When there is one side brush strip, a head end of the side brush strip is overlapped with a tail end of the side brush strip, and the fixing part passes through the head end and the tail end of the side brush strip and is fixed on the rotation shaft 512 or the hub 513. Alternatively, the side brush strip is annular and is sleeved, as a whole, on the periphery of the rotation shaft 512 or the periphery of the hub 513. When there are a plurality of side brush strips, the plurality of side brush strips are sequentially provided around the rotation shaft 512 or the hub 513 end to end. Each side brush strip is fixed through a corresponding fixing part.

In some embodiments, the hub 513 is detachably connected to the rotation shaft 512. The hub 513 may be mounted on the periphery of the rotation shaft 512, and may be detached from the periphery of the rotation shaft 512. When the hub 513 is damaged due to extended use or excessive frequency of use, the hub 513 only needs to be replaced, to improve usage convenience.

In an embodiment, the hub 513 includes a first hub 5131, a second hub 5132, and a shaft sleeve 5133. The first hub 5131 is detachably connected to the second hub 5132. The shaft sleeve 5133 is embedded between the first hub 5131 and the second hub 5132. When the first hub 5131 and the second hub 5132 are connected, the shaft sleeve 5133 is limited between the first hub 5131 and the second hub 5132, thereby locking the shaft sleeve 5133. The shaft sleeve 5133 is detachably connected to an end of a drive shaft of a side brush drive motor 552. The hub 513 is mounted on the end of the drive shaft through the shaft sleeve 5133 and rotates with the drive shaft without locking the first hub 5131 and the second hub 5132 on the drive shaft. In this way, the first hub 5131 and the second hub 5132 can be disassembled and replaced subsequently, thereby reducing a disassembly operation.

The first hub 5131 and the second hub 5132 may be spliced together to form a ring-shaped structure, which is configured to be sleeved on a periphery of the drive shaft. The first hub 5131 and the second hub 5132 may be symmetrically disposed, that is, a shape of the first hub 5131 may be the same as a shape of the second hub 5132, and the first hub 5131 and the second hub 5132 are symmetrical. Alternatively, the first hub 5131 and the second hub 5132 may be asymmetrically disposed. A position at which the first hub 5131 and the second hub 5132 are spliced together may be fixed through a fixing part. For example, when the first hub 5131 and the second hub 5132 are symmetrically disposed, an end surface of the first hub 5131 and an end surface of the second hub 5132 are disposed opposite to and attached to each other. At least one fixing part may simultaneously fix one end of the first hub 5131 and one end of the second hub 5132. At least another fixing part may simultaneously fix the other end of the first hub 5131 and the other end of the second hub 5132. When there are substances, such as hair, prone to wrap around the side brush strip and the hub 513, between the side brush strip and the hub 513 or in the hub 513, the side brush strip, the first hub 5131, and the second hub 5132 are disassembled to clean the substances such as hair. This improves efficiency in cleaning the substances such as hair, and therefore improves usage convenience. The above fixing part may be, but is not limited to, a fixing screw.

In another embodiment, the hub 513 can be of an integral structure. When the hub 513 includes the first hub 5131, the second hub 5132, and the shaft sleeve 5133, the first hub 5131, the second hub 5132, and the shaft sleeve 5133 are integrally formed, that is, the hub 513 is taken as a whole structure.

In another embodiment, the first auxiliary cleaning assembly 510 may perform contact cleaning. When the cleaning device body 100 moves close to the wall of the pool, the first auxiliary cleaning assembly 510 is in contact with and cleans the wall of the pool. The stains attached to the wall of the pool may be cleaned into the water by the first auxiliary cleaning assembly 510, and at least some of the stains may be sucked into the cleaning device body 100 through the debris inlet 413.

In an embodiment, at least one of the second side portion 1012 and the third side portion 1013 of the cleaning device 1000 may be provided with the first auxiliary cleaning assembly 510. When the first auxiliary cleaning assembly 510 is in operation, at least a portion of the first auxiliary cleaning assembly 510 extends out of a contour of the cleaning device 1000, that is, along the height direction of the cleaning device 1000, at least a portion of the first auxiliary cleaning assembly 510 protrudes from the cleaning device 1000 in a region in which the first auxiliary cleaning assembly 510 is located. When the cleaning device 1000 moves or cleans along an edge of the pool, a portion of the first auxiliary cleaning assembly 510 protrudes from the cleaning device 1000, and the portion may be in contact with the wall of the pool, thereby cleaning the wall of the pool.

In an embodiment, the first hub 5131, the second hub 5132, and the shaft sleeve 5133 are made of a same material or different materials. Each of the first hub 5131, the second hub 5132, and the shaft sleeve 5133 is made of a rigid material. The rigid material may be, but is not limited to, a plastic wear-resistant material, an alloy material, and the like. For example, each of the first hub 5131 and the second hub 5132 is made of the plastic wear-resistant material. For example, the plastic wear-resistant material may be, but is not limited to, a polyformaldehyde resin material. The shaft sleeve 5133 may be made of the alloy material. For example, the alloy material may be, but is not limited to, an aluminum alloy material. Alternatively, each of the first hub 5131, the second hub 5132, and the shaft sleeve 5133 is made of the plastic wear-resistant material. Each of the first hub 5131, the second hub 5132, and the shaft sleeve 5133 is made of a rigid material, so that overall strength of the hub 513 can be improved, thereby improving the service life of the first auxiliary cleaning assembly 510.

When the hub 513 is made of a rigid material, an outer contour of the hub 513 and/or the side brush body 5112 are/is disposed in the outer contour of the cleaning device body 100 and do/does not protrude from the outer contour of the cleaning device body 100. An outer diameter of the hub 513 and/or a position of the side brush body 5112 are/is limited, so that damage to the wall of the pool or the hub caused by collision of the hub 513 with the wall of the pool during a moving process of the first auxiliary cleaning assembly 510. At least some of the several cleaning portions 5111 on the side brush strip protrude from the outer contour of the cleaning device body 100, so that the first auxiliary cleaning assembly 510 can clean the wall of the pool and assist in guiding to escape from the trap. For example, when the first auxiliary cleaning assembly 510 is provided at the second side portion 1012, the outer contour of the hub 513 or the side brush body 5112 does not protrude from the second side portion 1012, and the at least some of the several cleaning portions 5111 protrude from the second side portion 1012. When the first auxiliary cleaning assembly 510 is provided at other positions on the cleaning device body 100, the first auxiliary cleaning assembly 510 may also be provided to meet the above conditions. Details are not described herein.

Each of the first hub 5131, the second hub 5132, and the side brush strip may be made of a same material. When at least a part of the side brush strip is made of a rigid material, both the first hub 5131 and the second hub 5132 may be made of a rigid material. When the side brush strip is made of a flexible material, both the first hub 5131 and the second hub 5132 may be made of a flexible material. When both the first hub 5131 and the second hub 5132 are made of a flexible material, the outer contour of the hub 513 and/or the side brush body 5112 may be located in the cleaning device body 100, or at least partially located outside the cleaning device body 100. In this case, the hub 513 has little impact on a wall surface of the pool. During actual use, the side brush body 5112 and the cleaning portion 5111 may be made of a same material or different materials. For example, each of the side brush body 5112 and the cleaning portion 5111 is made of a flexible material, or the side brush body 5112 may be made of a rigid material, and each of the several cleaning portions 5111 may be made of a flexible material, or some of the several cleaning portions 5111 may be made of a flexible material, and some of the several cleaning portions 5111 may be made of a rigid material. This is not limited herein.

Figure 14:
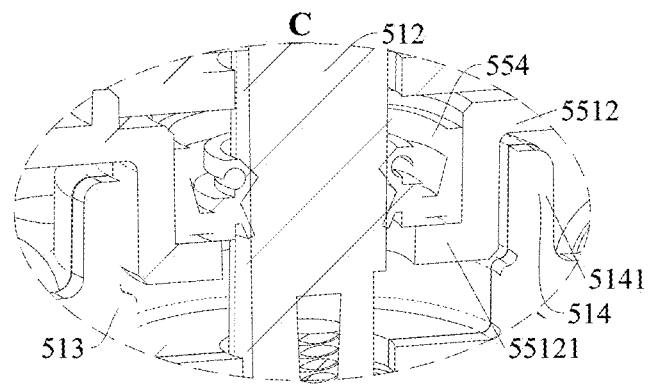
FIG. 14 is a schematic structural view of a portion C shown in FIG. 13.

FIG. 14 is a schematic structural view of a portion C shown in FIG. 13. With reference to FIG. 1, FIG. 2, and FIG. 11 to FIG. 13, in some embodiments, the first auxiliary cleaning assembly 510 further includes an auxiliary drive assembly 550. The auxiliary drive assembly 550 is in transmission connection to the first auxiliary cleaning assembly 510 and configured to drive the first auxiliary cleaning assembly 510 to rotate. The first auxiliary cleaning assembly 510 further includes a barrier wall structure 514. The barrier wall structure 514 may be of labyrinth structure. The barrier wall structure 514 may include a first barrier wall portion 5141. The first barrier wall portion 5141 is provided on an end surface of the hub 513, and the end surface faces the auxiliary drive assembly 550. By providing the first barrier wall portion 5141 on the hub 513, a winding route is extended, so that at least some of the substances, such as hair, are prevented from directly wrapping around the rotation shaft 512, thereby reducing frequency with which the hub 513 needs to be disassembled by the user.

In addition, the barrier wall structure 514 may further include a second barrier wall portion (not shown). The auxiliary drive assembly 550 includes a drive housing 551. The drive housing 551 includes a first drive housing 5511 and a second drive housing 5512. A sealing portion 55121 protrudes from an end of the second drive housing 5512, and the end is away from the first drive housing 5511. The rotation shaft 512 extends out of the sealing portion 55121. The second barrier wall portion may be the sealing portion 55121. The sealing portion 55121 or the second barrier wall is enclosed by the first barrier wall portion 5141. The substances, such as hair, at least need to pass through a route between the hub 513 and the first barrier wall portion 5141, a route between the first barrier wall portion 5141 and the second barrier wall portion, and the second barrier wall portion before wrapping around the rotation shaft 512. In this way, the first barrier wall portion 5141 cooperates with the second barrier wall portion, so that the substances, such as hair, are prevented from wrapping around the rotation shaft 512, thereby reducing the frequency with which the hub 513 is disassembled by the user to clear the hair wrapping around the rotation shaft 512.

In some embodiments, as shown in FIG. 6, an auxiliary mounting groove 109 is provided at the cleaning device body 100. The auxiliary drive assembly 550 is at least partially mounted in the cleaning device body 100, and at least partially extends into the auxiliary mounting groove 109. The auxiliary mounting groove 109 provides a mounting position for mounting the first auxiliary cleaning assembly 510. The cleaning device body 100 includes an auxiliary mounting portion 110. The auxiliary mounting portion 110 may be detachably connected to the auxiliary mounting groove 109, and may be connected to the drive housing 551 and the cleaning device body 100. The auxiliary mounting portion 110 provides a mounting position for mounting the first auxiliary cleaning assembly 510. The side brush 511 is at least partially mounted in the auxiliary mounting portion 110. The auxiliary mounting groove 109 and the auxiliary mounting portion 110 are provided, so that the mounting position is provided for the side brush 511, and at least some of the substances, such as hair, are prevented from directly entering the cleaning device body 100. Therefore, it is convenient to clear the substances, thereby improving usage experience.

In some embodiments, as shown in FIG. 12 and FIG. 13, the first auxiliary cleaning assembly 510 further includes the auxiliary drive assembly 550. The auxiliary drive assembly 550 is in transmission connection to the first auxiliary cleaning assembly 510 and configured to drive the first auxiliary cleaning assembly 510 to rotate. The auxiliary drive assembly 550 includes the drive housing 551 and the side brush drive motor 552. The side brush drive motor 552 is provided at the drive housing 551. The drive shaft of the side brush drive motor 552 extends out of the drive housing 551, and is in transmission connection to the first auxiliary cleaning assembly 510. The drive shaft of the side brush drive motor 552 may be the above rotation shaft 512. Alternatively, the drive shaft may be detachably or fixedly connected to the rotation shaft 512.

In an embodiment, the drive housing 551 includes the first drive housing 5511 and the second drive housing 5512. The first drive housing 5511 is detachably connected to the second drive housing 5512. The auxiliary drive assembly 550 includes a first sealing part 553. The first sealing part 553 is provided between the first drive housing 5511 and the second drive housing 5512. Sealing performance between the first drive housing 5511 and the second drive housing 5512 is improved through the first sealing part 553. The first sealing part 553 may be embedded in at least one of the first drive housing 5511 and/or the second drive housing 5512. The first sealing part 553 may be, but is not limited to, a sealing ring (not shown).

The drive shaft at least partially extends out of the second drive housing 5512. The sealing portion 55121 protrudes from the end of the second drive housing 5512, and the end is away from the first drive housing 5511. The auxiliary drive assembly 550 includes a second sealing part 554. The side brush drive motor 552 at least partially abuts against the sealing portion 55121, and the second sealing part 554 is provided in the sealing portion 55121. The second sealing part 554 is sleeved on the drive shaft. The second sealing part 554 is disposed at the sealing portion 55121 of the second drive housing 551, so that a probability that water in the pool enters the drive housing 551 and the side brush drive motor 552 can be reduced, thereby improving the sealing performance of the auxiliary drive assembly 550. A sealing manner of the second sealing part 554 may be, but is not limited to, oil sealing (not shown).

The cleaning device 1000 needs to have a battery life of at least twenty-four hours, that is, lower power consumption of the first auxiliary cleaning assembly 510 of the cleaning device 1000 indicates a longer battery life of the cleaning device 1000. By improving mounting accuracy of the first auxiliary cleaning assembly 510, the power consumption of the first auxiliary cleaning assembly 510 can be reduced. In an embodiment, the auxiliary drive assembly 550 includes at least one motor fixing part 555. The motor fixing part 555 passes through the second drive housing 5512 and is connected to the side brush drive motor 552. The motor fixing part 555 is configured to position the side brush drive motor 552. The side brush drive motor 552 is positioned by the above motor fixing part 555, so that mounting accuracy of the auxiliary drive assembly 550 is improved. In this case, a problem of friction between the first auxiliary cleaning assembly 510 and the wall of the pool can be prevented, the power consumption of the first auxiliary cleaning assembly 510 can be reduced, and therefore, a cruising ability of the cleaning device 1000 can be improved. There may be one, two, or a plurality of motor fixing parts 555. In this embodiment, there are four motor fixing parts 555 configured to respectively fix four corners of the side brush drive motor 552, to improve the mounting accuracy of the auxiliary drive assembly 550. The motor fixing part 555 may be, but is not limited to, a fixing screw.

When the motor fixing part 555 passes through the second drive housing 5512 and is connected to the side brush drive motor 552, the motor fixing part 555 is connected to the second drive housing 5512 through fixing glue (not shown). In this way, the water in the pool is prevented from entering the drive housing 551 through a gap between the motor fixing part 555 and the second drive housing 5512, so that the internal sealing performance of the drive housing 551 is not affected, and components such as the side brush drive motor 552 are not affected. The fixing glue may be connected between the motor fixing part 555 and the second drive housing 5512 by filling glue. The fixing glue may be, but is not limited to, two-liquid mixed hardening glue, photosensitive glue, and the like. It should be noted that a related structure of the auxiliary drive assembly 550 is also applicable to other drive assemblies of the cleaning device 1000.

Figure 15:
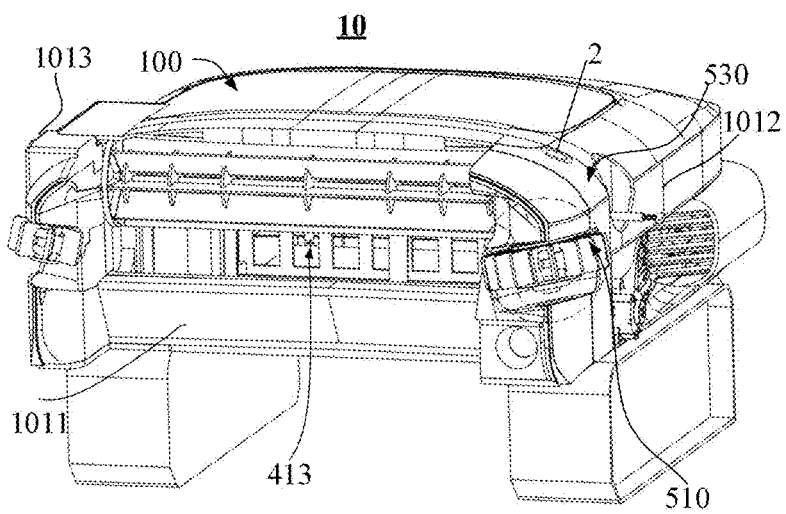
FIG. 15 is a schematic structural view of a cleaning device according to a third embodiment of the present disclosure.

FIG. 15 is a schematic structural view of the cleaning device according to a third embodiment of the present disclosure. The cleaning device 1000 includes the cleaning device body 100 and a movement drive assembly (not shown). The movement drive assembly (not shown) is provided at the cleaning device body 100. The movement drive assembly is connected to the first auxiliary cleaning assembly 510, and is configured to actively drive the first auxiliary cleaning assembly 510 to telescopically move relative to the cleaning device body 100. In other words, under the action of the movement drive assembly, the first auxiliary cleaning assembly 510 may move between a first position and a second position. For ease of description, the first position may be defined as a position at which the first auxiliary cleaning assembly 510 performs a retraction movement to an extreme position along a direction close to the cleaning device body 100. The second position may be defined as a position at which the first auxiliary cleaning assembly 510 performs an extension movement to an extreme position along a direction away from the cleaning device body 100. It should be understood that the first auxiliary cleaning assembly 510 may further move to a third position between the first position and the second position.

In an embodiment, the first auxiliary cleaning assembly 510 may passively move between the first position and the second position. For example, an initial position at which the first auxiliary cleaning assembly 510 is located is the second position. When the cleaning device 1000 is in contact with an obstacle, such as a wall, during moving, the obstacle can squeeze the first auxiliary cleaning assembly 510 to move from the second position to the first position. When the cleaning device 1000 is separated from the obstacle, the first auxiliary cleaning assembly 510 returns to the second position under the action of a reset assembly. For example, the reset assembly may be an elastic mechanism, a stepless rebound mechanism, or the like. When the cleaning device 1000 moves normally, the first auxiliary cleaning assembly 510 is located at the second position under the action of the reset assembly. When the cleaning device 1000 is in contact with the obstacle, especially in a case where the first auxiliary cleaning assembly 510 is in contact with the obstacle, an action force of the obstacle applied to the first auxiliary cleaning assembly 510 overcomes an action force of the reset assembly, so that the first auxiliary cleaning assembly 510 is retracted toward the cleaning device body 100, that is, the first auxiliary cleaning assembly 510 moves from the second position to the third position or the first position. When the cleaning device 1000 moves away from the obstacle again, the first auxiliary cleaning assembly 510 returns to the second position again under the action force of the reset assembly, that is, the first auxiliary cleaning assembly 510 moves from the first position or the third position to the second position.

In some embodiments, the movement drive assembly and the reset assembly cooperate with each other, so that the first auxiliary cleaning assembly 510 moves between the first position and the second position. A specific scenario and a manner are not limited herein.

In the present disclosure, the first auxiliary cleaning assembly 510 is movably connected to the cleaning device body 100, and the first auxiliary cleaning assembly 510 may be driven by the movement drive assembly of the cleaning device 1000 to telescopically move. In this way, the first auxiliary cleaning assembly 510 has more flexibility to perform all-round cleaning on a pool surface or the water in the pool in different directions and at different distances, so that the movement of the cleaning device 1000 can be reduced, thereby improving the cleaning efficiency. A movement track that the first auxiliary cleaning assembly 510 is driven by the movement drive assembly to move between the first position and the second position may be a straight-line track, a continuous curved-line track, a discontinuous broken-line track, or the like. This is not limited herein.

In some embodiments, at the first position, that is, when the first auxiliary cleaning assembly 510 is extremely retracted, the first auxiliary cleaning assembly 510 is entirely located within the contour of the cleaning device body 100, or the first auxiliary cleaning assembly 510 is at least partially located within the contour range of the cleaning device body 100. The first position may be a position at which the movement drive assembly drives the first auxiliary cleaning assembly 510 to retract or a position at which the movement drive assembly does not drive the first auxiliary cleaning assembly 510 to extend. For example, the first position is a position at which the movement drive assembly drives the first auxiliary cleaning assembly 510 to retract along the direction close to the cleaning device body 100. For another example, the first position is a position at which the movement drive assembly does not drive the first auxiliary cleaning assembly 510 to extend. In this case, the first position is also an initial position at which the first auxiliary cleaning assembly 510 is located.

At the second position, that is, when the first auxiliary cleaning assembly 510 extremely extends, at least a portion of the first auxiliary cleaning assembly 510 is located outside the contour of the cleaning device body 100. The second position may be a position at which the movement drive assembly drives the first auxiliary cleaning assembly 510 to extend or a position at which the movement drive assembly does not drive the first auxiliary cleaning assembly 510 to retract. For example, the second position is a position at which the movement drive assembly drives the first auxiliary cleaning assembly 510 to extend along the direction away from the cleaning device body 100. For another example, the second position is a position at which the movement drive assembly does not drive the first auxiliary cleaning assembly 510 to retract. In this case, the second position is an initial position at which the first auxiliary cleaning assembly 510 is located.

The first auxiliary cleaning assembly 510 moves from the first position to the second position, that is, the first auxiliary cleaning assembly 510 moves along the direction away from the cleaning device body 100, which may be defined as an extended state. The first auxiliary cleaning assembly 510 moves from the second position to the first position, that is, the first auxiliary cleaning assembly 510 moves along the direction close to the cleaning device body 100, which may be defined as a retracted state.

In some embodiments, as shown in FIG. 16, the movement drive assembly may include a connection portion 530 and a first drive assembly (not shown). The first auxiliary cleaning assembly 510 is connected to the cleaning device body 100 through the connection portion 530. The first drive assembly is connected to the connection portion 530, and is configured to drive the first auxiliary cleaning assembly 510 to telescopically move relative to the cleaning device body 100.

In some embodiments, as shown in FIG. 17, the connection portion 530 includes a fixed portion 531 and a telescopic part 532. The fixed portion 531 is fixedly connected to the cleaning device body 100. One end of the telescopic part 532 is connected to the fixed portion 531, and the other end of the telescopic part 532 is connected to the first auxiliary cleaning assembly 510. The telescopic part 532 may telescopically move relative to the fixed portion 531. The first drive assembly includes a first power source (not shown). The first power source is provided at a joint between the fixed portion 531 and the telescopic part 532. The first power source is configured to drive the connection portion 530 to telescopically move, to drive the first auxiliary cleaning assembly 510 to telescopically move. It may be understood that the first power source may be a motor, a cylinder, or the like. This is not limited herein.

In some other embodiments, the first auxiliary cleaning assembly 510 is movably connected to the movement drive assembly. The first drive assembly includes a first transmission mechanism (not shown) and the first power source. An input end of the first transmission mechanism is connected to the first power source. An output end of the first transmission mechanism is connected to the first auxiliary cleaning assembly 510. The first power source is configured to provide power for the first transmission mechanism, so that the first transmission mechanism can drive the first auxiliary cleaning assembly 510 to telescopically move relative to the cleaning device body 100 and the connection portion 530.

For example, the first transmission mechanism and the first power source may be provided at an end of the connection portion 530, and the end is connected to the first auxiliary cleaning assembly 510. The first transmission mechanism and the first power source may be configured to control the first auxiliary cleaning assembly 510 to telescopically move. The first transmission mechanism may include a turbine transmission mechanism and a gear transmission mechanism. For example, as shown in FIG. 18, the first transmission mechanism includes an oscillating gear 541, a worm gear 542, a worm 543, and a transmission gear 544. The worm 543 is fixedly connected to an output end of the first power source. The worm 543 is engaged with the worm gear 542. The worm gear 542 is fixedly connected to the transmission gear 544 through a concentric shaft. The transmission gear 544 is engaged with the oscillating gear 541. The oscillating gear 541 serves as the output end of the first transmission mechanism, and is configured to drive a component connected to the output end of the first transmission mechanism to telescopically move. It may be understood that the first transmission mechanism may include a transmission mechanism other than the turbine transmission mechanism and the gear transmission mechanism. This is not limited herein.

In addition, the component connected to the output end of the first transmission mechanism may be the first auxiliary cleaning assembly 510. The first auxiliary cleaning assembly 510 is eccentrically connected to the oscillating gear 541 through a rotating shaft. The oscillating gear 541 and the rotating shaft eccentrically oscillate to drive the first auxiliary cleaning assembly 510 to extend along the direction away from the cleaning device body 100, so that the first auxiliary cleaning assembly 510 at least partially extends out of the cleaning device body 100, or to drive the first auxiliary cleaning assembly 510 to retract along the direction close to the cleaning device body 100, so that the first auxiliary cleaning assembly 510 is at least partially retracted into the cleaning device body 100.

In some other embodiments, a first end of the connection portion 530 is connected to the first auxiliary cleaning assembly 510. The first drive assembly includes the first transmission mechanism and the first power source. The input end of the first transmission mechanism is connected to the first power source. The output end of the first transmission mechanism is connected to a second end of the connection portion 530 or a component located between the cleaning device body 100 and the second end of the connection portion 530. The first power source is configured to provide power for the first transmission mechanism, so that the first transmission mechanism drives the connection portion 530 and the first auxiliary cleaning assembly 510 to telescopically move relative to the cleaning device body 100. The first transmission mechanism may control a component connected to the first transmission mechanism to rotate or translate, so that the first auxiliary cleaning assembly 510 can telescopically move relative to the cleaning device body 100.

In some embodiments, the movement drive assembly includes at least one group of second drive assemblies. Each second drive assembly is configured to drive the first auxiliary cleaning assembly 510 to rotate relative to the cleaning device body 100, so that the first auxiliary cleaning assembly 510 can be switched between the first position and the second position.

The second drive assembly may include a second transmission mechanism and a second power source. The second power source is connected to an input end of the second transmission mechanism, and configured to provide power for the second transmission mechanism, so that the second transmission mechanism can directly or indirectly drive the first auxiliary cleaning assembly 510 to rotate. The second power source may be a motor, a cylinder, or the like. This is not limited herein.

In an embodiment, the first end of the connection portion 530 is connected to the first auxiliary cleaning assembly 510. The at least one group of second drive assemblies includes a first group of second drive assemblies. The first end of the connection portion 530 is connected to the first auxiliary cleaning assembly 510. Each second drive assembly in the first group of second drive assemblies is connected to the cleaning device body 100 and the second end of the connection portion 530, and configured to drive the connection portion 530 to rotate around a first direction shaft 2, so that the first auxiliary cleaning assembly 510 is indirectly driven to rotate around the first direction shaft 2. The first direction shaft 2 may be a straight-line rotation shaft 512. The straight-line rotation shaft 512 may be vertically disposed, so that the connection portion 530 can rotate in a horizontal direction, as shown in FIG. 15. Alternatively, the straight-line rotation shaft 512 may be horizontally disposed, so that the connection portion 530 can rotate in a vertical direction. The first direction shaft 2 may alternatively be a spherical rotation shaft 512, so that the connection portion 530 may rotate at any angle.

In another embodiment, the at least one group of second drive assemblies includes a second group of second drive assemblies. As shown in FIG. 16, the first end of the connection portion 530 is connected to the first auxiliary cleaning assembly 510 through each second drive assembly in the second group of second drive assemblies. Each second drive assembly in the second group of second drive assemblies is configured to drive the connection portion 530 to rotate around a second direction shaft 3, so that the first auxiliary cleaning assembly 510 is directly driven to rotate around the second direction shaft 3. The second direction shaft 3 may be a straight-line rotation shaft 512, a spherical rotation shaft 512, or the like. This is not limited herein.

In another embodiment, the first auxiliary cleaning assembly 510 is movably connected to the cleaning device body 100. The at least one group of second drive assemblies includes the first group of second drive assemblies and the second group of second drive assemblies. With reference to FIG. 15 and FIG. 16, the first end of the connection portion 530 is connected to the first auxiliary cleaning assembly 510. Each second drive assembly in the first group of second drive assemblies is connected to the cleaning device body 100 and the second end of the connection portion 530, and configured to drive the connection portion 530 to rotate around the first direction shaft 2. One end of each second drive assembly in the second group of second drive assemblies is connected to the first auxiliary cleaning assembly 510, and the other end thereof is connected to the connection portion 530, to drive the connection portion 530 to rotate around the second direction shaft 3, to implement multi-stage rotation control on the first auxiliary cleaning assembly 510. This increases a cleaning range of the first auxiliary cleaning assembly 510.

For example, the first direction shaft 2 is the straight-line rotation shaft 512 and disposed vertically, and the second direction shaft 3 is the straight-line rotation shaft 512 and disposed horizontally. Therefore, when the first auxiliary cleaning assembly 510 performs cleaning, each second drive assembly in the first group of second drive assemblies may first drive the connection portion 530 to rotate around the first direction shaft 2 in the horizontal direction. After the first auxiliary cleaning assembly 510 reaches a preset position, each second drive assembly in the second group of second drive assemblies drives the first auxiliary cleaning assembly 510 to rotate around the second direction shaft 3 in the vertical direction, to clean a to-be-cleaned object in the vertical direction. In addition, if the cleaning device 1000 is trapped during performing cleaning, the first auxiliary cleaning assembly 510 and the connection portion 530 may rotate and swing flexibly, so that the cleaning device 1000 can escape from the trap more easily. In addition, the second drive assembly and the first drive assembly may be the same assembly.

It may be understood that, when the first group of second drive assemblies and the second group of second drive assemblies are simultaneously configured to control the first auxiliary cleaning assembly 510 to rotate, the connection portion 530 is first controlled to rotate in the vertical direction, and then the first auxiliary cleaning assembly 510 is controlled to rotate in the horizontal direction, or the connection portion 530 is first controlled to rotate in the horizontal direction, and then the first auxiliary cleaning assembly 510 is controlled to rotate in the vertical direction. A scheme of multi-directional rotation control on the first auxiliary cleaning assembly 510 is not specifically limited herein.

In some embodiments, to improve flexibility of the first auxiliary cleaning assembly 510 and increase the cleaning range of the cleaning device 1000, the first drive assembly and the second drive assembly may be configured to simultaneously control the connection portion 530 to rotate and telescopically move. In this case, the component connected to the output end of the first transmission mechanism and located between the second end of the connection portion 530 and the cleaning device body 100 is the second drive assembly.

In addition, a third drive assembly (not shown) may be provided at the movement drive assembly, so that the first auxiliary cleaning assembly 510 can conveniently clean the pool surface, the to-be-cleaned object, or the water in the pool. The third drive assembly is connected to the first auxiliary cleaning assembly 510, and configured to drive, when the first auxiliary cleaning assembly 510 needs to be in operation, the first auxiliary cleaning assembly 510 rotates around its own axis, to scrub and clean the pool surface, the to-be-cleaned object, or the water in the pool.

In some embodiments, there are several first auxiliary cleaning assemblies 510. At least first auxiliary cleaning assembly 510 may also be configured to escape from the trap. For example, when the cleaning device 1000 is trapped by aquatic plants in the pool, the first auxiliary cleaning assembly 510 can rotate and telescopically move to escape from the aquatic plants, or the first auxiliary cleaning assembly 510 may be retracted into the cleaning device 1000, to reduce a width of the cleaning device 1000, so that the cleaning device 1000 passes through easily.

In some embodiments, when the debris inlet 413 is provided at the first side portion 1011 of the cleaning device body 100, the first auxiliary cleaning assembly 510 may alternatively be provided at the bottom of the cleaning device body 100. As shown in FIG. 19, the first auxiliary cleaning assembly 510 is disposed at the bottom of the cleaning device body 100 and can extend out of the bottom of the cleaning device body 100. In addition, the first auxiliary cleaning assembly 510 may be obliquely disposed relative to a center of the debris inlet 413 or may be substantially parallel to the debris inlet 413, to guide a water flow and debris, which are located below the debris inlet 413, to the debris inlet 413. In addition, when the first auxiliary cleaning assembly 510 extends out of the contour of the cleaning device body 100, the first auxiliary cleaning assembly 510 can scrub a contacted target object.

In other embodiments, for the multi-functional cleaning device, the debris inlet 413 is provided at the bottom of the cleaning device body 100. To increase the cleaning range of the debris inlet 413, the at least one first auxiliary cleaning assembly 510 may alternatively be provided at the bottom of the cleaning device body 100 and located at two sides of the debris inlet 413, to increase the cleaning range of the debris inlet 413. In this case, the first auxiliary cleaning assembly 510 may alternatively incline toward the debris inlet 413, to agitate the water flow and the stains located outside the cleaning range of the debris inlet 413 and guide the water flow and the stains to the debris inlet 413.

In addition, when the debris inlet 413 is provided at the bottom of the cleaning device body 100, the at least one first auxiliary cleaning assembly 510 is provided at the second side portion 1012 and/or the third side portion 1013 of the cleaning device body 100. An end of the connection portion 530 is away from the cleaning device body 100, and the end extends to the bottom of the cleaning device body 100, so that the first auxiliary cleaning assembly 510 disposed at the end of the connection portion 530 and away from the cleaning device body 100 is close to the bottom of the cleaning device body 100. In addition, the first auxiliary cleaning assembly 510 may incline toward the debris inlet 413 provided at the bottom of the cleaning device body 100, to guide the water flow and the stains located outside the bottom of the cleaning device body 100 to the debris inlet 413.

In an embodiment, the first auxiliary cleaning assembly 510 is a component having a suction function. The first auxiliary cleaning assembly 510 may suck the water flow and the stains located beyond the cleaning range of the debris inlet 413, and guide the water flow and the stains to the debris inlet 413.

In another embodiment, as shown in FIG. 21, FIG. 22, FIG. 23, and FIG. 24, the auxiliary cleaning mechanism 500 may include a second auxiliary cleaning assembly 520. The second auxiliary cleaning assembly 520 includes a water spray assembly 521. The water spray assembly 521 is provided at the cleaning device body 100, and configured to spray a water flow to a to-be-cleaned region, to at least scrub the to-be-cleaned region or guide at least a part of debris at the to-be-cleaned region to the working region of the debris inlet 413.

For the multi-functional cleaning device, the debris inlet 413 may be provided at the bottom of the cleaning device body 100, the first side portion 1011, the second side portion 1012, the third side portion 1013, the top of the cleaning device body 100, or the like. The water spray assembly 521 is provided with one spout 5211 or a plurality of spouts 5211, so that the water flow can be sprayed through the spout 5211. Specifically, the spout 5211 of the water spray assembly 521 may be provided at an edge of the cleaning device body 100. The water flow is sprayed to the side or the front of the cleaning device body 100 through the spout 5211.

The water flow sprayed through the spout 5211 may draw the debris to the working region of the debris inlet 413 of the cleaning device 1000 in at least one of the following manners, such as agitation, reflection performed by the pool wall, and water flow guidance. In this way, the debris inlet 413 can draw the debris into the cleaning device body 100.

In an embodiment, when the cleaning device 1000 is close to a pool edge, for example, when the cleaning device 1000 moves along the pool edge through the moving mechanism 300, the water flow is sprayed to the wall of the pool through the at least one spout 5211 (for example, the water flow may be sprayed to the side or the front of the cleaning device body 100, so that the water flow may be sprayed to the wall of the pool). In this way, the water flow is sprayed to the wall of the pool through the spout 5211 to scrub the wall of the pool, and debris on the wall of the pool and debris between the cleaning device body 100 and the wall of the pool are pushed toward the cleaning device 1000 through reflection of the water flow performed by the wall of the pool, so that the cleaning device 1000 can suck the debris through the debris inlet 413. In addition, when the water flow is sprayed toward the wall of the pool through the spout 5211, agitation formed by the water flow sprayed through the spout 5211 may also have a gathering effect on the debris, thereby further facilitating sucking the debris inlet 413.

In another embodiment, when the cleaning device 1000 performs water surface cleaning, the water flow may be sprayed to the side and/or the front of the cleaning device body 100 through the at least one spout 5211. In this case, agitation is formed by the water flow sprayed through the spout 5211, so that at least a part of debris outside the working region of the debris inlet 413 can be guided to the working region of the debris inlet 413. This increases the cleaning range of the cleaning device 1000 and improves the overall cleaning efficiency.

In an embodiment, the cleaning device 1000 further includes a water blocking structure 104 provided at a route where the water flow is sprayed through the spout 5211. The water blocking structure 104 can block a part of sprayed water flow with a high flow velocity, to avoid the following case: the part of the water flow may push the debris away from the cleaning device 1000, and a part of the debris cannot be sucked by the debris inlet 413. In addition, the water blocking structure 104 can change a direction of the sprayed water flow, to form water flow agitation for gathering floating debris located beyond the cleaning range of the debris inlet 413 to the cleaning range.

In an embodiment, the water flow may be sprayed to the debris inlet 413 through the spout 5211 of the water spray assembly 521, so that the debris can be driven to the working region of the debris inlet 413 under the guidance of the water flow sprayed through the spout 5211. For example, the spout 5211 of the water spray assembly 521 may be provided at the outer side portion of the cleaning device body 100, and the debris inlet 413 is provided at the front portion of the cleaning device body 100. When the spout 5211 needs to be in operation, the spout 5211 faces the debris inlet 413 to spray the water flow to the debris inlet 413. In this case, the water flow sprayed through the spout 5211 can have a function of gathering the debris, so that the debris can be gathered within the working region of the debris inlet 413.

Figure 23:
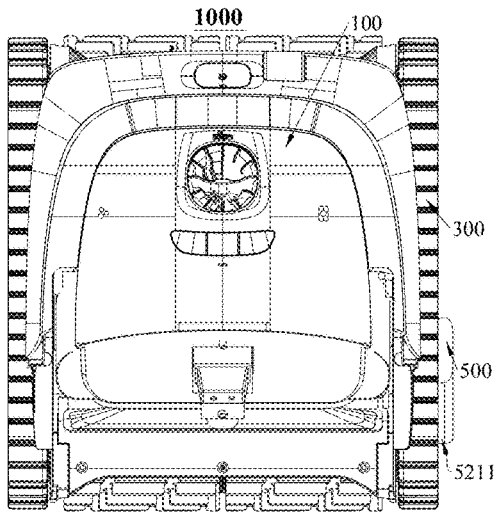
FIG. 23 is a schematic structural view of a spout at a second position according to a fifth embodiment of the present disclosure.
Figure 24:
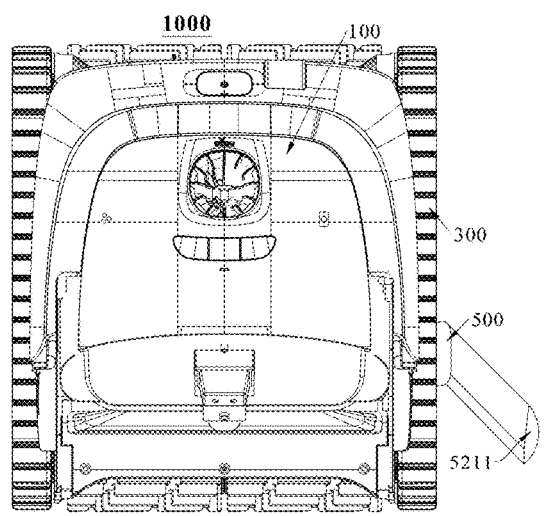
FIG. 24 is a schematic structural view of a spout at a first position according to a fifth embodiment of the present disclosure.

In an embodiment, the position of the spout 5211 may include a first movement position and a second movement position. The spout 5211 can move between the first movement position and the second movement position. For example, the spout 5211 may rotate around an axis in a specific direction between the first movement position and the second movement position. The specific direction may be the horizontal direction, the vertical direction, or the like. The first movement position is a position at which the water flow is sprayed to the debris inlet 413 through the spout 5211, that is, when the water flow needs to be sprayed to the debris inlet 413 through the spout 5211, the spout 5211 moves to the first movement position to spray the water flow. The second movement position is a position different from the first movement position. For example, in a case where the spout 5211 may rotate in the vertical direction, if the first movement position is close to the top of the cleaning device body 100, the second movement position may be close to the bottom of the cleaning device body 100. With reference to FIG. 23 and FIG. 24, the spout 5211 can rotate horizontally around the cleaning device body 100, the first movement position is a position away from the cleaning device body 100, and the second movement position is a position close to the cleaning device body 100. When the water flow does not need to be sprayed to the debris inlet 413 through the spout 5211, the spout 5211 is located at the second movement position. When the water flow needs to be sprayed to the debris inlet 413 through the spout 5211, the spout 5211 rotates to the first movement position, so that the spout 5211 faces the debris inlet 413 and is configured to spray the water flow to the debris inlet 413. In this case, the water flow sprayed through the spout 5211 can have a certain effect of gathering the debris, so that the debris can be gathered within the working region of the debris inlet 413, and the debris can be conveniently sucked through the debris inlet 413. In addition, the spout 5211 may be configured movably. For example, the spout 5211 can be retracted into the cleaning device body 100 when the spout 5211 is not in operation, so that the spout 5211 can be prevented from obstructing the operation of the cleaning device 1000 when the spout 5211 does not need to be in operation. In addition, when the water flow needs to be sprayed through the spout 5211 in directions other than a direction toward the debris inlet 413, the spout 5211 may move to the second movement position and is configured to spray the water flow without being provided with a plurality of spouts 5211.

In an embodiment, the water spray assembly 521 may include a water spray part 5212 and a power unit (not shown). The spout 5211 is provided at the water spray part 5212. The power unit is configured to drive the spout 5211 of the water spray part 5212 to spray the water flow. The power unit may be an original apparatus of the cleaning device 1000, such as the main water pump, or a newly provided apparatus. The newly provided apparatus may be a newly provided water pump, a plunger pump, a diaphragm pump, or the like. The power unit is configured to provide power for the spout 5211 to spray the water. A single spout 5211 may correspond to a single power unit, or a plurality of spouts 5211 may correspond to a same power unit. The water spray part 5212 may be a spray rod or other forms, and the form of the water spray part 5212 is not limited herein.

There may be one or more water spray parts 5212. One or more spouts 5211 are provided at each water spray part 5212. Different water spray parts 5212 may operate simultaneously or independently. Different spouts 5211 disposed at a same water spray part 5212 may also operate simultaneously or independently.

In an embodiment, the spout 5211 of the water spray part 5212 can rotate, and the cleaning device 1000 further includes a rotating assembly (not shown). The spout 5211 of the water spray part 5212 may be rotated by the rotating assembly, so that the spout 5211 is oriented toward a target orientation.

In an embodiment, there may be a plurality of water spray parts 5212, and the plurality of water spray parts 5212 are provided on a left side and a right side of the cleaning device body 100 respectively. At least one water spray part 5212 is disposed at each of the left side and the right side of the cleaning device body 100, and an orientation of the spout 5211 of the water spray part 5212 disposed at the left side is different from that of the spout 5211 of the water spray part 5212 disposed at the right side. For another example, the plurality of water spray parts 5212 are provided on a same side of the cleaning device body 100, such as a front side or the right side of the cleaning device body 100. Orientations of the spouts 5211 disposed at the plurality of water spray parts 5212 are different from each other. In this way, a water spray part 5212 provided with a spout 5211 of a matched orientation can be selected based on an attitude of the cleaning device 1000 for spraying water.

In an embodiment, two water spray parts 5212 are disposed at each of two sides of the cleaning device 1000. The two water spray parts 5212 disposed at each of two sides are an upper water spray part and a lower water spray part. Correspondingly, the spout 5211 of the upper water spray part is an upper spout, and the spout 5211 of the lower water spray part is a lower spout. The upper spout and the lower spout orient toward the front or at a certain outward expansion angle relative to the front. For example, when the cleaning device 1000 performs water surface cleaning, the upper spouts 5211 disposed at two sides may be selected to clean the pool wall at the waterline. When the cleaning device 1000 performs underwater cleaning, the lower spouts 5211 disposed at two sides may be selected to clean the bottom wall or the wall of the pool.

In an embodiment, when the cleaning device 1000 performs water surface cleaning, the spout 5211 currently operating at least needs to be provided at a position of the cleaning device body 100, and the position is close to the water surface. In this case, the water flow sprayed through the spout 5211 can clean the water surface and the pool wall at the waterline. At the same time, the cleaning device 1000 may move on the water surface under the action of the moving mechanism 300, so that the cleaning device 1000 can movably clean the water surface.

In some embodiments, when the cleaning device 1000 performs underwater cleaning, the at least one spout 5211 currently operating needs to be provided at the cleaning device body 100, and inclines toward the bottom of the pool. In this case, the water is sprayed through the spout 5211 to clean small debris at a specific height position in the water, a specific height position on the side wall of the pool, the bottom wall of the pool, and a corner between the pool bottom and the pool side wall.

Figure 25:
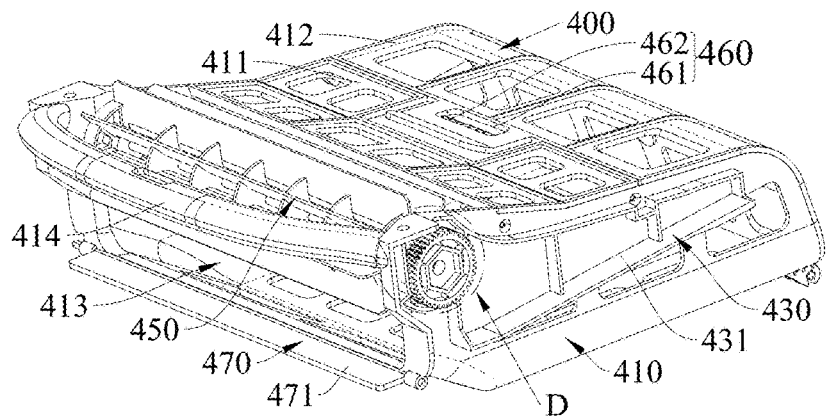
FIG. 25 is a first schematic structural view of a filtering box of a cleaning device according to the present disclosure.

FIG. 25 is a first schematic structural view of a filtering box of the cleaning device according to the present disclosure. With reference to FIG. 1 and FIG. 2, in some embodiments, the first side portion 1011 of the cleaning device body 100 is provided with an accommodating opening 102, and the accommodating groove 108 is formed inside the cleaning device body 100. The first side portion 1011 is a side portion facing the forward direction of the cleaning device body 100. A fourth side portion 1014 and the first side portion 1011 are disposed opposite to each other, that is, the fourth side portion 1014 is the rear portion of the cleaning device body 100. The second side portion 1012 and the third side portion 1013 are disposed opposite to each other. The accommodating opening 102 may be provided at least one of the first side portion 1011, the second side portion 1012, the third side portion 1013, and the fourth side portion 1014. In other words, a position at which the accommodating port 102 is provided may be determined based on an actual requirement. For the water surface cleaning device, the main cleaning mechanism 400 includes at least the filtering box 410 at least partially accommodated in the accommodating groove 108. The main cleaning mechanism 400 may be disassembled through the accommodating opening 102, that is, the filtering box 410 may be disassembled through the accommodating opening 102 provided at the side portion of the cleaning device 1000. Compared with an existing water surface cleaning robot where the top cover needs to be turned over to disassemble the filtering box to mount and remove the filtering box, in this embodiment, the filtering box 410 can be conveniently mounted and removed by using the handle 414 provided at the main cleaning mechanism 400 from the outer side portion of the cleaning device body 100, so that usage experience is improved. In addition, the top cover 107 does not need to be frequently flipped and opened. This improves stability of the solar panel (not shown) and various wires of the solar mechanism 600 mounted on the top cover 107 in an associated manner, thereby improving a service life and reliability of the solar mechanism 600. For the multi-functional cleaning device, the main cleaning mechanism 400 also includes at least the filtering box 410 at least partially accommodated in the accommodating groove 108. The accommodating opening 102 may be provided at the top of the cleaning device 1000. The main cleaning mechanism 400 may be disassembled through the accommodating opening 102. In this case, the top cover 107 may be provided at the accommodating opening 102, and the filtering box 410 may be mounted and removed by opening the top cover 107.

The position of the accommodating opening 102 of the water surface cleaning device may be the same as the position of the debris inlet 413. For example, the accommodating opening 102 is provided at the first side portion 1011, the accommodating opening 102 at least partially overlaps with the debris inlet 413, and at least a part of the debris inlet 413 is located within the range of the accommodating opening 102. In other words, the accommodating opening 102 and the debris inlet 413 are both disposed at the first side portion 1011. A user may mount the main cleaning mechanism 400 in the accommodating groove 108 along the accommodating opening 102 of the first side portion 1011. Based on the above position limitation, in a process of removing the filtering box 410, the debris is located at the bottom of the filtering box 410 due to gravity, to prevent the debris from being regurgitated. In addition, the adjustment mechanism 200, the moving mechanism 300, and other related mechanism can be conveniently mounted on the cleaning device 1000. Certainly, the position of the accommodating opening 102 may be different from the position of the debris inlet 413. The liquid inlet is provided at the first side portion 1011 and communicates with the debris inlet 413. The accommodating opening 102 may be located at one of the second side portion 1012, the third side portion 1013, and the fourth side portion 1014, that is, the user may remove the main cleaning mechanism 400 from the accommodating groove 108 along the accommodating opening 102. When the accommodating opening 102 is located at the fourth side portion 1014, a related anti-regurgitation assembly 470 may be added at the debris inlet 413, so that the debris and the like can be prevented from flowing out from the debris inlet 413 in the process of removing the filtering box 410.

For the multi-functional cleaning device, the accommodating opening 102 is provided at the top, and the debris inlet 413 of the main cleaning mechanism 400 includes at least a debris inlet 413 for water surface cleaning and a debris inlet 413 for underwater cleaning. The debris inlet 413 for water surface cleaning may be provided at the side portion of the cleaning device 1000, such as the first side portion 1011. The debris inlet 413 for underwater cleaning may be provided at the bottom of the cleaning device 1000 and face a to-be-cleaned surface, so that the debris inlet 413 can conveniently cooperate with the to-be-cleaned surface to form a negative pressure area.

In some embodiments, the filtering box 410 may be disposed at the accommodating groove 108 in a pull-out manner. For example, for the water surface cleaning device 1000, the filtering box 410 may be pulled in a direction substantially parallel to the reference plane 1, that is, the filtering box 410 may be pulled in a direction substantially parallel to the solar panel of the solar mechanism 600. For the multi-functional cleaning device, the filtering box 410 may be pulled in a direction at an angle relative to the reference plane 1. When the filtering box 410 is mounted at the accommodating groove 108, the filtering box 410 may be locked to the cleaning device body 100, so that a risk that the filtering box 410 is loosened and falls off can be reduced. When the filtering box 410 needs to be removed, the filtering box 410 and the cleaning device body 100 are unlocked to remove the filtering box 410. The locking manner may be, but is not limited to, a clamping manner, an inserting manner, or the like. The pull-out manner may be, but is not limited to, a sliding manner, or the like.

Figure 26:
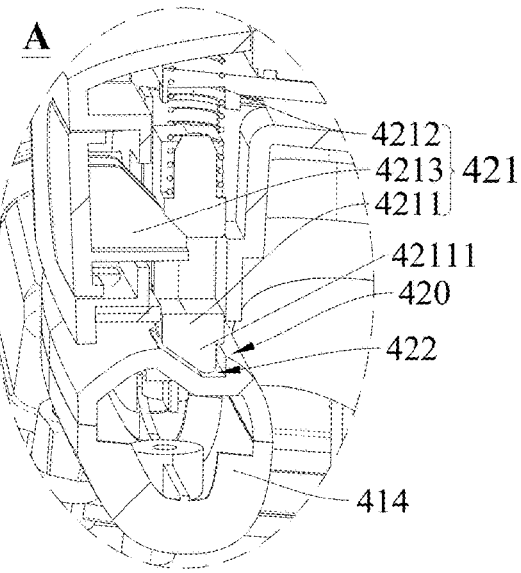
FIG. 26 is a schematic structural view of a portion A shown in FIG. 2.
Figure 27:
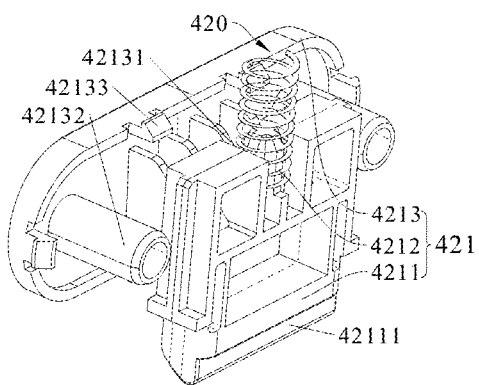
FIG. 27 is a first schematic structural view of a locking mechanism of a cleaning device according to the present disclosure.
Figure 28:
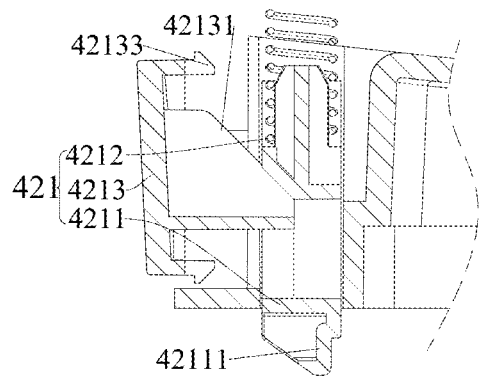
FIG. 28 is a first partial cross-sectional view of a locking mechanism of a cleaning device according to the present disclosure.

As shown in FIG. 26 to FIG. 28, in an embodiment, a locking mechanism 420 is provided between the filtering box 410 and the cleaning device body 100. When the filtering box 410 is mounted in the accommodating groove 108 through the accommodating opening 102, the locking mechanism 420 is in a locked state. In this case, the filtering box 410 is locked to the cleaning device body 100, so that the risk that the filtering box 410 is loosened and falls off when the cleaning device 1000 is in operation can be reduced. When the filtering box 410 needs to be removed from the accommodating groove 108, the locking mechanism 420 is in an unlocked state. In this case, the filtering box 410 and the cleaning device body 100 are unlocked, so that the filtering box 410 can be removed from the accommodating groove 108. The locking mechanism 420 may be, but is not limited to, an elastic locking mechanism, a magnetic attraction locking mechanism, an inserting locking mechanism, or the like, provided that the filtering box 410 can be releasably locked to the cleaning device body 100.

In an embodiment, the locking mechanism 420 includes a locking assembly 421 and a locking groove 422. One of the filtering box 410 and the cleaning device body 100 is provided with the locking assembly 421, and the other one of the filtering box 410 and the cleaning device body 100 is provided with the locking groove 422. The locking assembly 421 may be releasably locked to the locking groove 422. For example, the locking assembly 421 is disposed at the cleaning device body 100, and the locking groove 422 is disposed at the filtering box 410, or the locking assembly 421 is disposed at the filtering box 410, and the locking groove 422 is disposed at the cleaning device body 100.

In an embodiment, the locking assembly 421 includes at least a first locking part 4211, a first elastic part 4212, and a first pressing part 4213. The first elastic part 4212 is provided between a top end of the first locking part 4211 and the cleaning device body 100. The first locking part 4211 includes a first locking portion 42111. The first locking portion 42111 may be releasably locked to the locking groove 422. When an external force is applied to the first pressing part 4213, the first pressing part 4213 acts on the first locking part 4211, the first locking part 4211 is lifted and acts on the first elastic part 4212, and the first locking portion 42111 of the first locking part 4211 is disconnected from the locking groove 422, so that the filtering box 410 can be removed from the accommodating groove 108. When the external force is not applied, the first pressing part 4213 is reset under a restoring force of the first elastic part 4212. At the same time, the first locking part 4211 is lowered under the restoring force of the first elastic part 4212, and the first locking portion 42111 of the first locking part 4211 is locked to the locking groove 422, so that the filtering box 410 can be locked to the cleaning device body 100 and located in the accommodating groove 108. The first elastic part 4212 may be, but is not limited to, a compression spring.

In an embodiment, an end of the first pressing part 4213 faces the first locking part 4211, and the end is provided with a pressing bevel 42131. The pressing bevel 42131 is configured obliquely. The first pressing part 4213 is provided with the pressing bevel 42131, so that the first pressing part 4213 can easily act on the first locking part 4211. This reduces friction and improves smoothness of the first pressing part 4213 acting on the first locking part 4211, thereby improving usage experience.

In another embodiment, an end of the first pressing part 4213 faces the first locking part 4211, and the end is provided with a first pressing guide post 42132 and a pressing buckle 42133. The first pressing guide post 42132 is movably inserted into the cleaning device body 100, and configured to guide the first pressing part 4213 to reduce pressing deviation of the first pressing part 4213. There may be one, two, or a plurality of first pressing guide posts 42132. The pressing buckle 42133 is disposed at a periphery of the first pressing part 4213, and plays a clamping role. When the first pressing part 4213 is reset under the restoring force of the first elastic part 4212, the pressing buckle 42133 is clamped to the cleaning device body 100, to reduce a risk that the pressing buckle 42133 falls out of the cleaning device body 100. There may be one, two, or a plurality of pressing buckles 42133.

Figure 42A:
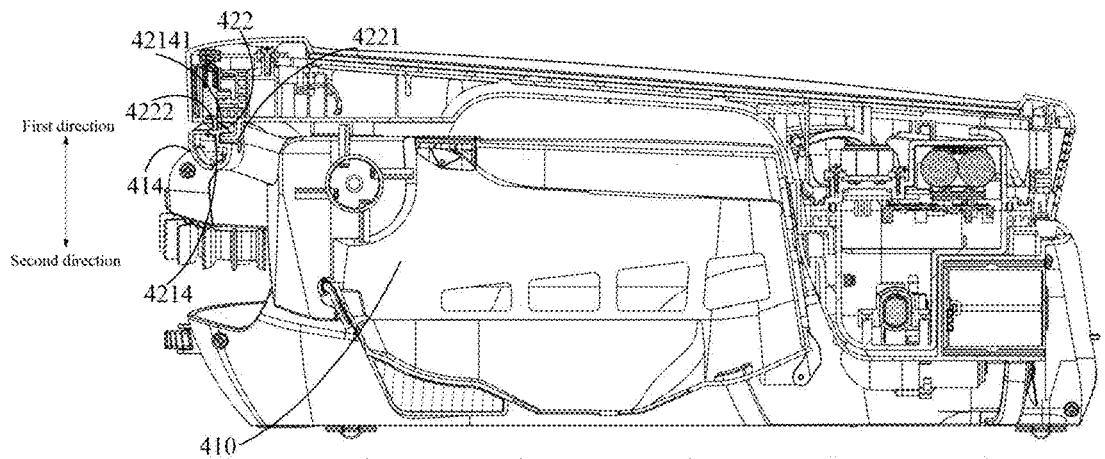
FIG. 42a is a first schematic cross-sectional view of a cleaning device according to a ninth embodiment of the present disclosure.
Figure 42B:
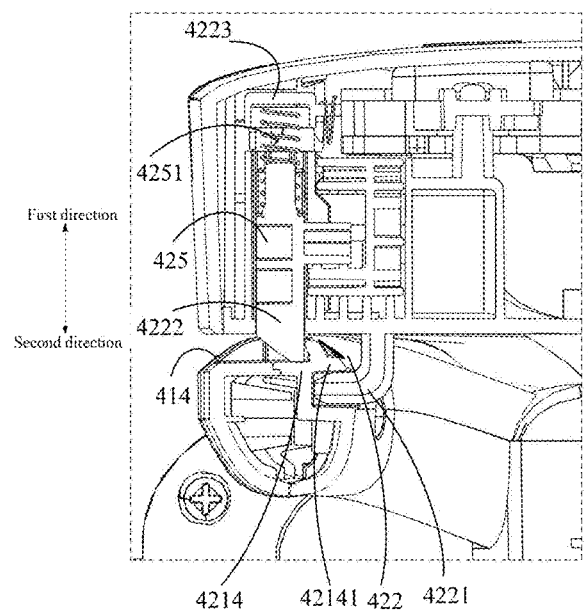
FIG. 42b is a partial cross-sectional view of a cleaning device according to a ninth embodiment of the present disclosure.

FIG. 42a is a first schematic cross-sectional view of the cleaning device according to a ninth embodiment of the present disclosure. FIG. 42b is a partial cross-sectional view of the cleaning device according to the ninth embodiment of the present disclosure. As shown in FIG. 42a and FIG. 42b, in an embodiment, the locking assembly 421 includes at least a second locking part 4214. The second locking part 4214 is disposed on the filtering box 410, for example, on the handle 414. The second locking part 4214 includes a second locking portion 42141. The second locking portion 42141 is releasably locked to the locking groove 422. The cleaning device body 100 is provided with a locking groove 422. The locking groove 422 includes at least a first position-limiting structure 4221 and a second position-limiting structure 4222. At least one of the first position-limiting structure 4221 and the second position-limiting structure 4222 is a movable structure. In a specific embodiment, the first position-limiting structure 4221 is a fixed structure, and the second position-limiting structure 4222 is a movable structure. The second position-limiting structure 4222 may move between a fourth position and a fifth position. For ease of description, the fourth position may be defined as a position at which the second position-limiting structure 4222 moves to a limit of the second position-limiting structure 4222 in a direction close to the first position-limiting structure 4221, and the fifth position may be defined as a position at which the second position-limiting structure 4222 moves to a limit of the second position-limiting structure 4222 in a direction away from the first position-limiting structure 4221. It may be understood that the second position-limiting structure 4222 may further move to a sixth position between the fourth position and the fifth position. When the second position-limiting structure 4222 moves to the fifth position or the sixth position, the second locking portion 42141 may be disconnected from the locking groove 422, so that the filtering box 410 can be removed from the accommodating groove 108. When the second position-limiting structure 4222 moves to the fourth position or the sixth position, the second locking portion 42141 may be locked to the locking groove 422, so that the filtering box 410 can be locked to the cleaning device body 100 and located in the accommodating groove 108.

Figure 43A:
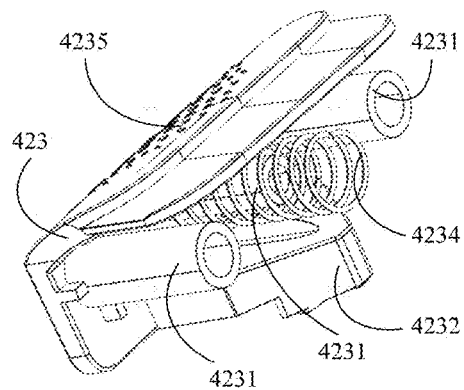
FIG. 43a is a schematic structural view of a second pressing part of a cleaning device according to the present disclosure.
Figure 43B:
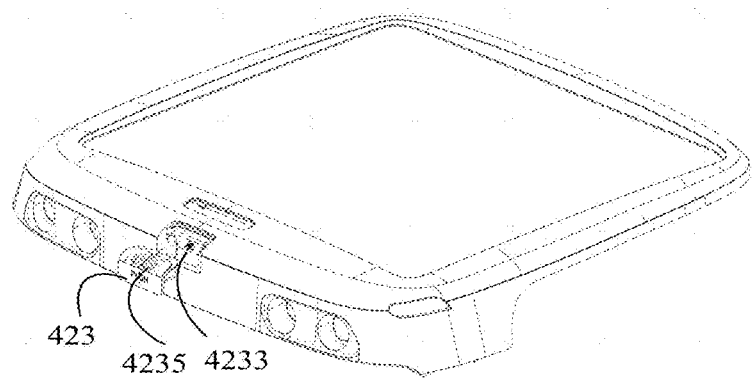
FIG. 43b is a first partial exploded view of a cleaning device according to a ninth embodiment of the present disclosure.

In a specific embodiment, the locking mechanism 420 further includes a second pressing part 423. FIG. 43a is a schematic structural view of the second pressing part of the cleaning device according to the present disclosure. FIG. 43b is a first partial exploded view of the cleaning device according to the ninth embodiment of the present disclosure. As shown in FIG. 43a and FIG. 43b, an end of the second pressing part 423 faces the cleaning device body 100, and the end is provided with a second pressing guide post 4231 and a pressing mating portion 4232. The second pressing guide post 4231 is movably inserted into the cleaning device body 100 to play a guiding and position-limiting role for the second pressing part 423, thereby reducing pressing deviation of the second pressing part 423. There may be one, two, or more second pressing guide posts 4231. Further, the cleaning device body 100 is further provided with a pressing fixing part 4233 mating with at least one second pressing guide post 4231. The second pressing part 423 is fixed to the cleaning device body 100 by using the pressing fixing part 4233. For example, the second pressing guide post 4231 may include a hollow structure. The pressing fixing part 4233 may be inserted into the hollow structure of the second pressing guide post 4231 to fix the second pressing guide post 4231, thereby fixing the second pressing part 423. The pressing fixing part 4233 may be, but is not limited to, a screw, a buckle, or the like. In some embodiments, a second elastic part 4234 may be disposed between the second pressing guide post 4231 and the pressing fixing part 4233, and the second elastic part 4234 is disposed on the second pressing part 423. When an external force is applied to the second pressing part 423, the second pressing guide post 4231 acts on the second elastic part 4234, the second pressing part 423 moves toward a side of the cleaning device body 100, and the second elastic part 4234 is compressed. The second pressing part 423 may be provided at a joint between the first side portion 1011 and the top of the cleaning device body 100. This is not limited herein.

Figure 43C:
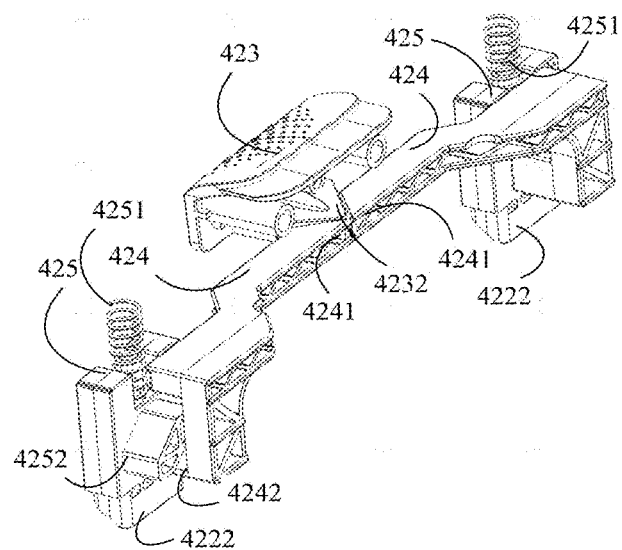
FIG. 43c is a first partial structural view of a cleaning device according to a ninth embodiment of the present disclosure.

FIG. 43c is a first partial structural view of the cleaning device according to the ninth embodiment of the present disclosure. As shown in FIG. 43c, the locking mechanism 420 further includes at least one first transferring structure 424 and at least one second transferring structure 425 provided on the cleaning device body 100. A first transferring end 4241 of the first transferring structure 424 may be in contact with the pressing mating portion 4232, and a second transferring end 4242 of the first transferring structure 424 may be in contact with the second transferring structure 425. When an external force is applied to the second pressing part 423, the pressing mating portion 4232 acts on the first transferring end 4241 of the first transferring structure 424, the second transferring end 4242 of the first transferring structure 424 acts on the second transferring structure 425, and the second transferring structure 425 causes the second position-limiting structure 4222 to move toward the fifth position. When the external force is not applied, the second pressing part 423 is reset under a restoring force of the second elastic part 4234, and at the same time, the second position-limiting structure 4222 moves toward the fourth position, so that the second transferring structure 425 is reset, thereby driving the first transferring structure 424 to be reset. The second transferring structure 425 and the second position-limiting structure 4222 may be an integral structure or may be connected in any manner. Both the pressing mating portion 4232 and the first transferring end 4241 may incline. This is not limited herein. In some embodiments, one of contact surfaces between the first transferring end 4241 and the pressing mating portion 4232 is a smooth surface, and the other is a non-smooth surface, to avoid the following case: Difficulty in pressing the second pressing part 423 is increased due to an increase in a friction force after the two surfaces are in contact with each other. In addition, possible abnormal noise caused during performing pressing can be avoided.

Figure 43D:
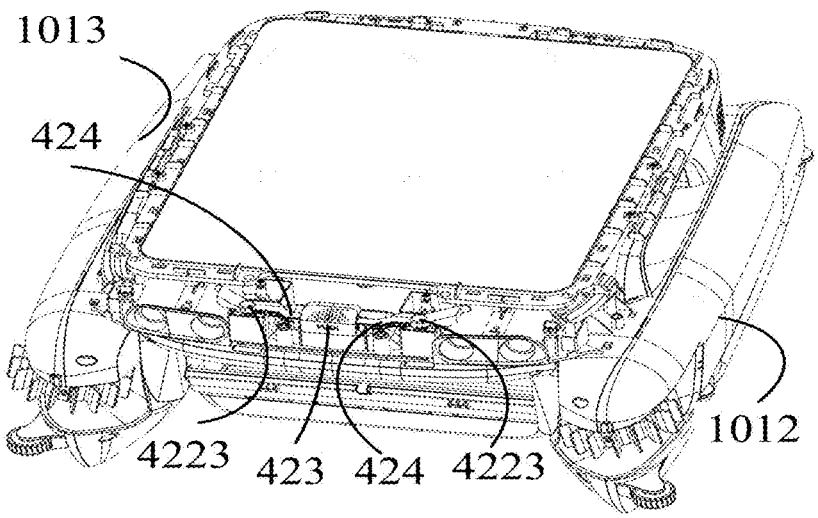
FIG. 43d is a second partial structural view of a cleaning device according to a ninth embodiment of the present disclosure.
Figure 43E:
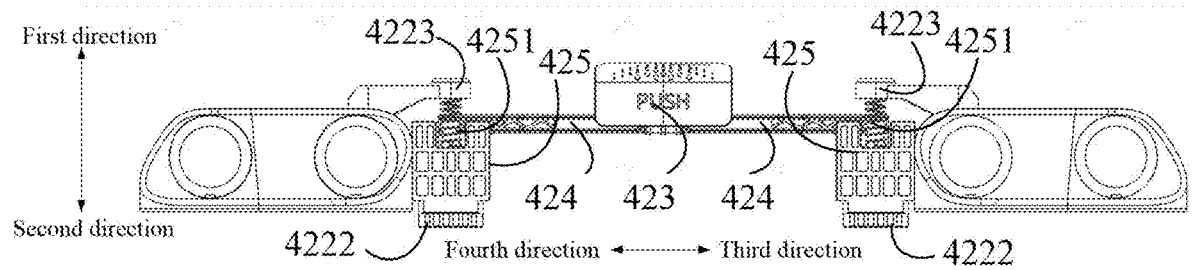
FIG. 43e is a third partial structural view of a cleaning device according to a ninth embodiment of the present disclosure.

FIG. 43d is a second partial structural view of the cleaning device according to the ninth embodiment of the present disclosure. FIG. 43e is a third partial structural view of the cleaning device according to the ninth embodiment of the present disclosure. With reference to FIG. 43d, FIG. 43e, and FIG. 42b, in a specific embodiment, the cleaning device body 100 is further provided with a third position-limiting structure 4223. There is a third elastic part 4251 between the third position-limiting structure 4223 and the second transferring structure 425. When an external force is applied to the second pressing part 423, the second transferring end 4242 of the first transferring structure 424 acts on the second transferring structure 425, and the second transferring structure 425 acts on the third elastic part 4251. For ease of description, a direction in which the fourth position faces the fifth position may be defined as a first direction, and a direction in which the fifth position faces the fourth position may be defined as a second direction. The second transferring structure 425 applies at least a force component in the first direction to the third position-limiting structure 4223 through the third elastic part 4251. When the external force is not applied to the second pressing part 423, a restoring force of the third elastic part 4251 has at least a force component in the second direction on the second position-limiting structure 4222, so that the second position-limiting structure 4222 moves toward the fourth position. The second elastic part 4234 and the third elastic part 4251 may be, but are not limited to, a compression spring. The third position-limiting structure 4223 may be independently disposed or may be integrally formed with any structure on the cleaning device body. This is not limited herein.

Figure 43F:
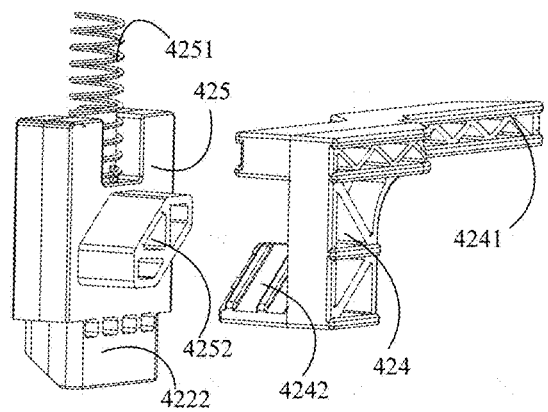
FIG. 43f is a second partial exploded view of a cleaning device according to a ninth embodiment of the present disclosure.

Refer to FIG. 43c, FIG. 43d, FIG. 43e, and FIG. 43f. FIG. 43f is a second partial exploded view of the cleaning device according to the ninth embodiment of the present disclosure. In a specific embodiment, there are two first transferring structures 424 and two second transferring structures 425. One first transferring structure 424 cooperates with one second transferring structure 425. One pair of the first transferring structure 424 and the second transferring structure 425 is close to the second side portion 1012, and the other pair of the first transferring structure 424 and the second transferring structure 425 are close to the third side portion 1013. The two pairs of first transferring structures 424 and second transferring structures 425 may be symmetrically disposed to respectively cooperate with different second position-limiting structures 4222. For ease of description, a direction in which the third side portion 1013 faces the second side portion 1012 may be defined as a third direction, and a direction in which the second side portion 1012 faces the third side portion 1013 may be defined as a fourth direction. In some cases, the third direction and the fourth direction are both perpendicular to the second direction, that is, the third direction and the fourth direction are also perpendicular to the first direction. The first transferring structure 424 and the second transferring structure 425 that are close to the second side portion 1012 are used as an example for description. When an external force is applied to the second pressing part 423, the pressing mating portion 4232 acts on the first transferring end 4241 and applies at least a force component in the third direction to the first transferring structure 424. A third transferring end 4252 of the second transferring structure 425 is in contact with the second transferring end 4242, and both the second transferring end 4242 and the third transferring end 4252 may incline, so that the second transferring end 4242 can apply at least a force component in the first direction to the third transferring end 4252. In this way, the second transferring structure 425 can move in the first direction, and the second position-limiting structure 4222 can move in the first direction. When the external force is not applied, the second pressing part 423 is reset under the restoring force of the second elastic part 4234, and the second transferring structure 425 moves in the second direction under the restoring force of the third elastic part 4251, so that the second transferring structure 425 and the second position-limiting structure 4222 are reset. The third transferring end 4252 applies a force component in the fourth direction to the second transferring end 4242 to drive the first transferring structure 424 to be reset.

The second pressing part 423 has a surface approximately parallel to a moving direction of the second pressing part 423 and/or a surface approximately perpendicular to the moving direction of the second pressing part 423. The surface approximately parallel to the moving direction of the second pressing part 423 is rubbed, and/or the surface approximately perpendicular to the moving direction of the second pressing part 423 is pressed, so that a force for the second pressing part 423 to move toward the cleaning device body 100 is applied to the second pressing part 423. Further, as shown in FIG. 43a and FIG. 43b, the second pressing part 423 is provided with an anti-slip portion. The anti-slip portion may be provided on the surface approximately parallel to the moving direction of the second pressing part 423 to increase a friction force applied to the surface. This improves use convenience and effectiveness of the second pressing part 423. A structure of the anti-slip portion may be determined based on an actual situation, provided that the anti-slip portion can implement an effect of increasing the friction force. The anti-slip portion may be, but is not limited to, several protruding points distributed on the surface of the second pressing part 423 at intervals.

In an embodiment, a sliding structure 430 is provided between a periphery of the filtering box 410 and an inner side wall of the accommodating groove 108. The sliding structure 430 is disposed, so that the filtering box 410 can be mounted and removed smoothly. This improves usage experience. The sliding structure 430 may include a sliding rail 431 and a sliding groove (not shown), and the sliding rail 431 is slidably connected to the sliding groove. One of the periphery of the filtering box 410 and the inner side wall of the accommodating groove 108 is provided with the sliding rail 431, and the other is provided with the sliding groove. Positions and quantities of the sliding rail 431 and the sliding groove may be determined based on an actual requirement. This is not limited herein.

Specifically, the periphery of the filtering box 410 is provided with the sliding groove, and the inner side wall of the accommodating groove 108 is provided with the sliding rail 431. Alternatively, in this embodiment, the periphery of the filtering box 410 is provided with the sliding rail 431, and the inner side wall of the accommodating groove 108 is provided with the sliding groove. The sliding rail 431 is slidably connected to the sliding groove, so that the filtering box 410 can be mounted and removed more smoothly. In addition, the sliding rail 431 is provided at the periphery of the filtering box 410 to improve strength of the filtering box 410. The sliding rail 431 is disposed outside a side wall of the filtering box 410, and the side wall faces the second side portion 1012 and/or the third side portion 1013.

In some embodiments, the main cleaning mechanism 400 further includes a handle 414. The handle 414 is provided at the periphery of the filtering box 410. The handle 414 is located on a side of the filtering box 410, and the side of the filtering box 410 is provided with the debris inlet 413. It is convenient for the user to mount and remove the filtering box 410 through the handle 414. A position of the handle 414 corresponds to a position of the accommodating opening 102. In this embodiment, the accommodating opening 102 is provided at the first side portion 1011, and the handle 414 is disposed at the first side portion 1011. At least a part of space in which the accommodating opening 102 is located may be configured to accommodate the handle 414. The filtering box 410 may be pulled out by using the handle 414 in a direction substantially parallel to the forward direction of the cleaning device 1000. As shown in FIG. 25, at least two of the handle 414, the debris inlet 413, the roller brush, and the anti-regurgitation assembly 470 are located on a same side of the cleaning device body 100.

In a specific embodiment, the filtering box 410 is further provided with a filtering box handle for a user to remove the filtering box 410, and the filtering box handle and the handle 414 are located at different positions on the filtering box 410. In another specific embodiment, the filtering box 410 is only provided with the handle 414, that is, the filtering box 410 may be mounted, removed, and lifted by using the handle 414.

In a specific embodiment, the cleaning device body 100 is further provided with a body handle for the user to lift the cleaning device body 100, and the body handle and the handle 414 are located at different positions on the cleaning device body 100. In another specific embodiment, when the filtering box 410 is mounted in the accommodating groove 108, the handle 414 may serve as the body handle, that is, the cleaning device body 100 may be lifted by using the handle 414.

Specifically, the locking mechanism 420 is provided between the handle 414 and the cleaning device body 100, so that the locking mechanism 420 can be conveniently locked and unlocked. For example, the locking assembly 421 is disposed at the cleaning device body 100, and the locking groove 422 is provided at the handle 414.

Figure 29:
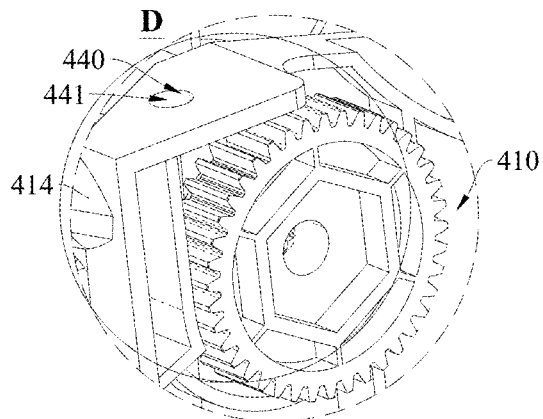
FIG. 29 is a schematic structural view of a portion D shown in FIG. 25.

FIG. 29 is a schematic structural view of a portion D shown in FIG. 25. In some embodiments, a positioning structure 440 is provided between the filtering box 410 and the inner wall of the accommodating groove 108. The positioning structure 440 has a positioning function, so that the filtering box 410 can be quickly located at a proper position in the cleaning device body 100 by the locking mechanism 420, thereby improving efficiency in mounting and removing the filtering box 410. The positioning structure 440 includes a positioning part (not shown) and a positioning hole 441. The positioning part is connected to the positioning hole 441 in a positional manner. One of the periphery of the filtering box 410 and the inner side wall of the accommodating groove 108 is provided with the positioning part, and the other is provided with the positioning hole 441. Positions and quantities of the positioning hole 441 and the positioning part may be determined based on an actual requirement.

In this embodiment, the periphery of the filtering box 410 is provided with the positioning hole 441, and the inner side wall of the accommodating groove 108 is provided with the positioning part. The positioning hole 441 is provided on the filtering box 410, so that the positioning hole 441 can be conveniently processed. Specifically, the positioning hole 441 is disposed at a side surface of the filtering box 410, and the side surface is close to the top cover 107. In addition, the positioning hole 441 is provided close to the locking mechanism 420, so that the locking mechanism 420 can be conveniently locked. There are two positioning holes 441 disposed at two sides of a side surface of the filtering box 410 respectively, and the side surface faces the top cover 107. The positioning part may be, but is not limited to, a ball plunger or the like.

In some embodiments, the cleaning device 1000 further includes an in-position detection mechanism for a filtering box. The in-position detection mechanism for the filtering box is configured to detect whether the filtering box 410 is mounted in position on the cleaning device body 100 to ensure that, only after the filtering box 410 is mounted in position, the cleaning device 1000 can operate normally. This eliminates any user misoperation, prevents ineffective cleaning or a poor cleaning effect, and better improves intelligence of the cleaning device 1000.

The in-position detection mechanism for the filtering box may include, but is not limited to, at least one of a sensing assembly (not shown), an inductance assembly (not shown), and a switch assembly (not shown), and a quantity of detection methods can be increased, which may be selected based on an actual requirement. The sensing assembly may be implemented by a Hall element and a Hall magnet mating with each other. The inductance assembly may detect whether the filtering box 410 is in position in an inductive manner. The switch assembly detects, by using a switch part, whether the filtering box 410 is in position. It should be noted that the sensing assembly, the inductance assembly, and the switch assembly may be provided with a waterproof structure based on an actual requirement, to prevent short circuits. This ensures use performance of the in-position detection mechanism for the filtering box and improves stability of the in-position detection mechanism for the filtering box.

In some embodiments, the in-position detection mechanism for the filtering box includes the sensing assembly. The sensing assembly includes a sensing part (not shown) and a sensing mating part (not shown). When the filtering box 410 is mounted in position, the sensing part and the sensing mating part mate with each other to detect whether the filtering box 410 is mounted in position at the cleaning device body 100.

One of the sensing part and the sensing mating part is provided at the filtering box 410, and the other is provided at the cleaning device body 100. Specific positions of the sensing part and the sensing mating part may be selected based on an actual situation. Alternatively, each of the sensing part and the sensing mating part is not disposed at the filtering box 410, but is disposed at other positions. The filtering box 410 may move to drive the sensing part and the sensing mating part to mate with each other to detect whether the filtering box 410 is mounted in position.

In an embodiment, the sensing part is disposed at the cleaning device body 100, and the sensing mating part is disposed at the filtering box 410. The sensing mating part may be detachably or fixedly connected to the filtering box 410. For example, the filtering box 410 is provided with a filtering box mounting groove, and the sensing mating part is sealed in the filtering box mounting groove. Alternatively, the sensing mating part and the filtering box 410 may be an integral structure, and the sensing mating part is disposed in a side wall of the filtering box 410. This helps simplify an assembly process. In this embodiment, the sensing part may be a Hall sensing part, and the sensing mating part is the Hall magnet.

In the sensing assembly, the Hall magnet is used to affect an internal magnetic field to conduct a circuit, so that whether the circuit is open or closed can be detected. When the filtering box 410 is mounted at the cleaning device body 100, the Hall magnet gradually approaches the Hall sensing part, and magnetic field strength at the Hall sensing part is increased, so that the Hall sensing part is in a triggered state. When the filtering box 410 is removed from the cleaning device body 100, the Hall magnet gradually moves away from the Hall sensing part, and the magnetic field strength at the Hall sensing part is decreased, so that the Hall sensing part cannot be triggered. The magnetic field can penetrate the filtering box 410 and the cleaning device body 100, so that the Hall sensing part can sense the Hall magnet can sense each other.

In another embodiment, each of the sensing part and the sensing mating part is not disposed at the filtering box 410, but is disposed at other positions. Specifically, the cleaning device 1000 includes a sealed cavity. The sealed cavity may be a drive box 130. The filtering box 410 may be detachably mounted in the accommodating groove 108. The in-position detection mechanism for the filtering box is configured to detect whether the filtering box 410 is mounted in position at the accommodating groove 108.

The in-position detection mechanism for the filtering box includes a sensing drive assembly. The sensing drive assembly is connected in the accommodating groove 108. The sensing part is provided at one of the sensing drive assembly and the sealed cavity, and the sensing mating part is provided at the other of the sensing drive assembly and the sealed cavity. The filtering box 410 acts on the sensing drive assembly, so that the sensing part and the sensing mating part can mate with each other. In a process of mounting the filtering box 410 at the accommodating groove 108, the filtering box 410 acts on the sensing drive assembly, and the sensing drive assembly moves, so that the sensing part and the sensing mating part mate with each other to implement detection. In a process of removing the filtering box 410 from the accommodating groove 108, the sensing drive assembly is reset, so that the sensing part cannot sense the sensing mating part. The sensing drive assembly is disposed between the accommodating groove 108 and the sealed cavity.

Figure 30A:
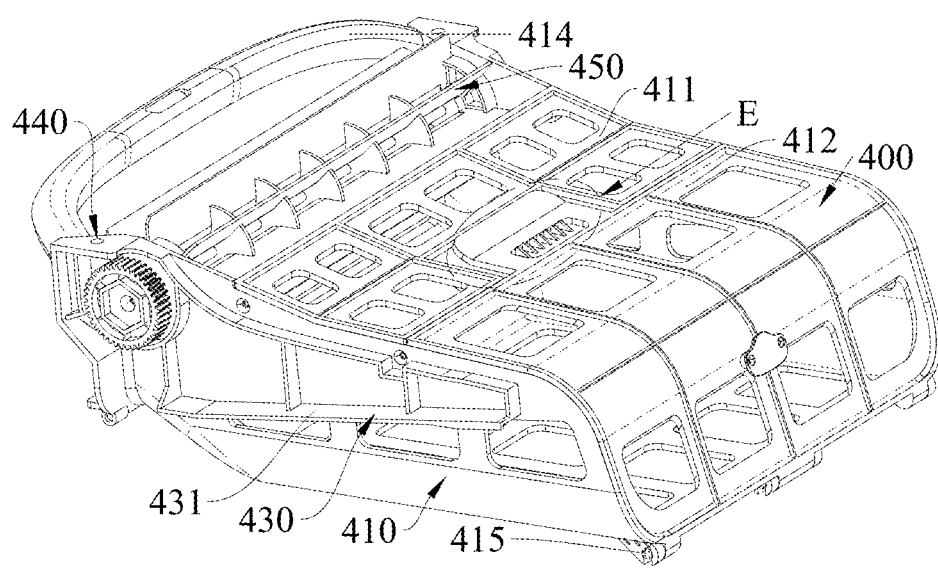
FIG. 30a is a second schematic structural view of a filtering box of a cleaning device according to the present disclosure.

As shown in FIG. 30a and FIG. 31, in some embodiments, the filtering box 410 includes a filtering box portion 411 and a rotating portion 412. The filtering box portion 411 and/or the rotating portion 412 are/is provided with a filtering box outlet (not shown). The filtering box outlet may be a filtering layer portion of the filtering box 410, and the water entering the filtering box 410 through the debris inlet 413 is directly drained from the filtering box 410 through the filtering layer. The rotating portion 412 may be rotatably provided at the filtering box portion 411. Compared with the filtering box portion 411, the rotating portion 412 has an open position and a closed position. When the rotating portion 412 is at the open position, the debris inside the filtering box 410 may be poured out through a debris dumping opening formed by opening the rotating portion 412. When the rotating portion 412 is at the closed position, the filtering box portion 411 and the rotating portion 412 are enclosed to form the filtering box 410. The rotating portion 412 and the filtering box portion 411 may be closed and opened, that is, locked and unlocked, through a clamping structure or the like. The debris dumping opening may be disposed opposite to the debris inlet 413. After the filtering box 410 is removed from the accommodating groove 108, and the rotating portion 412 is unlocked relative to the filtering box portion 411, the user holds the handle 414, and the rotating portion 412 may rotate and be opened under the gravity of the rotating portion 412 to form the debris dumping opening, so that the debris in the filtering box 410 is drained from the debris dumping opening. A periphery of the filtering box of the existing pool robot is closed, so it is inconvenient to scrub by using a water gun. In addition, the filtering box needs to be flipped over to dump the debris, resulting in defects such as dirtying hands and clothes during a dumping process.

In an embodiment, the filtering box 410 includes at least a first sub side wall (not shown), a second sub side wall (not shown), a third sub side wall (not shown), and a fourth sub side wall (not shown). The first sub side wall and the fourth sub side wall are disposed opposite to each other. The second sub side wall and the third sub are disposed opposite to each other. The first sub side wall is close to the first side portion 1011. The second sub side wall is close to the second side portion 1012. The third sub side wall is close to the third side portion 1013. The fourth sub side wall is close to the fourth side portion 1014. When the debris inlet 413 is disposed at the first sub side wall, the debris dumping opening may be disposed at any one of the second sub side wall, the third sub side wall, and the fourth sub side wall.

For the rotating portion 412, a position of the debris dumping opening may be related to a position of the accommodating opening 102. For example, when the accommodating opening 102 and the debris inlet 413 are close to the first side portion 1011, the rotating portion 412 may include at least the fourth sub side wall, and the debris dumping opening is disposed opposite to the accommodating opening 102. When the accommodating opening 102 is disposed at the second side portion 1012, the rotating portion 412 may include at least the third sub side wall. In other embodiments, the position of the debris dumping opening may not be related to the position of the accommodating opening 102. For example, when the accommodating opening 102 and the debris inlet 413 are close to the first side portion 1011, the rotating portion 412 may further include at least a part of the second sub side wall or at least a part of the third sub side wall. When the filtering box 410 needs to be cleaned, the rotating portion 412 needs to be manually opened, and the debris dumping opening directly faces downward.

In an embodiment, the rotating portion 412 is rotatably connected to the filtering box portion 411 through a rotating structure (not shown), so that the rotating portion 412 can rotate relative to the filtering box portion 411. The rotating structure may include a first rotating shaft 415 and a rotating groove (not shown). The first rotating shaft 415 rotates in the rotating groove, so that the rotating portion 412 can rotate more smoothly relative to the filtering box portion 411. The first rotating shaft 415 is provided at one of the rotating portion 412 and the filtering box portion 411, and the rotating groove is provided at the other one of the rotating portion 412 and the filtering box portion 411. The rotating portion 412 is provided with several first rotating shafts 415, and the filtering box portion 411 is provided with several rotating grooves. Alternatively, the rotating portion 412 is provided with several rotating grooves, and the filtering box portion 411 is provided with several first rotating shafts 415.

In an embodiment, a clamping structure 460 is provided between the rotating portion 412 and the filtering box portion 411, so that the rotating portion 412 can be releasably clamped to the filtering box portion 411. The rotating portion 412 can be clamped to the filtering box portion 411 through the clamping structure 460. When the filtering box 410 is removed from the accommodating groove 108, and the debris in the filtering box 410 needs to be dumped, the clamping structure 460 is unlocked, the rotating portion 412 is not clamped to the filtering box portion 411, and the debris is poured out along a direction of the debris dumping opening. Before the filtering box 410 is mounted in the accommodating groove 108, the rotating portion 412 is clamped to the filtering box portion 411 through the clamping structure 460 to form an integrated filtering box 410, so that the filtering box 410 can be conveniently mounted in the accommodating groove 108.

The clamping structure 460 may include a clamping groove 461 and a clamping block 462, and the clamping groove 461 is clamped to the clamping block 462. One of the rotating portion 412 and the filtering box portion 411 is provided with the clamping groove 461, and the other is provided with the clamping block 462. In this embodiment, the rotating portion 412 is provided with the rotating block (not shown), and the clamping groove 461 is provided on the rotating block (not shown). The clamping block 462 is disposed at the outer side portion of the filtering box portion 411. When the rotating portion 412 is provided over the filtering box outlet, the rotating block at least partially covers the outside of the filtering box portion 411, and the clamping groove 461 is clamped to the clamping block 462. Alternatively, the clamping block 462 is disposed at the rotating portion 412, and the clamping groove 461 is disposed at the filtering box 410.

In an embodiment, clamping of the clamping structure 460 may be released by an operating mechanism provided at the handle 414, such as pressing an unlocking structure (not shown). After removing the filtering box 410 from the cleaning device body 100 by using the handle 414, the user presses the unlocking structure, so that the rotating portion 412 can be opened to form the debris dumping opening, which is convenient for the user to operate.

As further shown in FIG. 25, in some embodiments, the main cleaning mechanism 400 or the cleaning device body 100 includes an anti-regurgitation assembly 470. For example, the anti-regurgitation assembly 470 is provided at the main cleaning mechanism 400, and the anti-regurgitation assembly 470 is disposed near the debris inlet 413 of the filtering box 410. When the cleaning device 1000 moves backward, makes a turn, and stops operating, the anti-regurgitation assembly 470 is configured to prevent at least a part of the debris from being regurgitated to the to-be-cleaned region through the debris inlet 413, to resolve the problem of the cleaning device 1000 that the debris may be regurgitated. In some embodiments, the anti-regurgitation assembly 470 includes an anti-regurgitation door 471 and an anti-regurgitation drive assembly (not shown). The anti-regurgitation door 471 may be rotatably provided at a position at which the filtering box 410 is close to the debris inlet 413. The anti-regurgitation drive assembly drives the anti-regurgitation door 471 to rotate relative to the debris inlet 413. When the cleaning device 1000 moves backward, makes a turn, and stops operating, the anti-regurgitation drive assembly drives the anti-regurgitation door 471 to rotate to block at least a part of the debris inlet 413, so that the debris in the filtering box 410 is less likely to be regurgitated. The anti-regurgitation door 471 cooperates with the anti-regurgitation drive assembly, so that at least a part of the debris can be actively prevented from being regurgitated to the to-be-cleaned region.

Figure 44A:
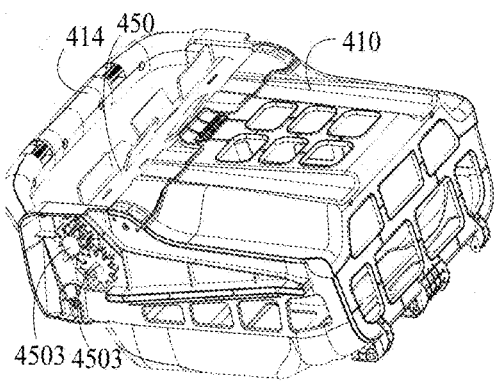
FIG. 44a is a fourth schematic structural view of a filtering box of a cleaning device according to the present disclosure.
Figure 44B:
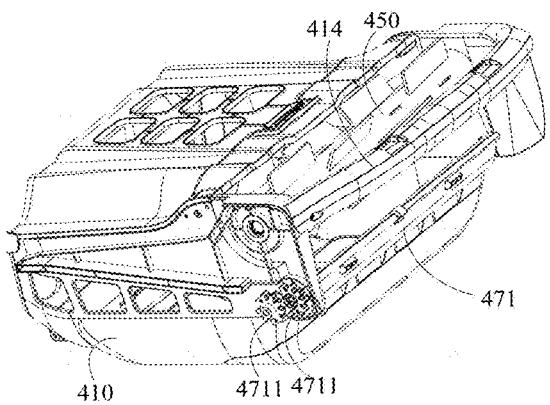
FIG. 44b is a fifth schematic structural view of a filtering box of a cleaning device according to the present disclosure.

FIG. 44a is a fourth schematic structural view of the filtering box of the cleaning device according to the present disclosure. FIG. 44b is a fifth schematic structural view of the filtering box of the cleaning device according to the present disclosure. The anti-regurgitation drive assembly includes an anti-regurgitation drive motor. In other words, a drive shaft of the anti-regurgitation drive motor is connected to the anti-regurgitation door 471 to directly drive the anti-regurgitation door 471 to rotate relative to the debris inlet 413. Alternatively, the anti-regurgitation drive assembly includes an anti-regurgitation drive motor and an anti-regurgitation gear assembly 4711. The anti-regurgitation gear assembly 4711 is provided between the anti-regurgitation drive motor and the anti-regurgitation door 471 in a transmission manner. The anti-regurgitation gear assembly 4711 includes at least one gear. The anti-regurgitation drive motor is configured to drive the anti-regurgitation gear assembly 4711 to rotate, and the anti-regurgitation gear assembly 4711 is configured to drive the anti-regurgitation door 471 to rotate relative to the debris inlet 413. Alternatively, the anti-regurgitation drive assembly includes the anti-regurgitation drive motor and an anti-regurgitation magnetic attraction assembly (not shown). The anti-regurgitation magnetic attraction assembly is provided between the anti-regurgitation drive motor and the anti-regurgitation door 471. The anti-regurgitation drive motor is configured to drive the anti-regurgitation magnetic attraction assembly to move, and the anti-regurgitation magnetic attraction assembly is configured to drive the anti-regurgitation door 471 in a magnetic transmission manner. In some embodiments, the anti-regurgitation drive assembly includes a first anti-jamming structure 475, so that the anti-regurgitation gear assembly 4711 can operate stably during transmission, and the following case can be avoided: The anti-regurgitation gear assembly 4711 is jammed because the gear wears, a foreign object wraps around the gear, or the gear is deformed. The first anti-jamming structure 475 may be, but is not limited to, a baffle provided partially or entirely around the anti-regurgitation gear assembly 4711, a housing covering the anti-regurgitation gear assembly 4711, a groove in which the anti-regurgitation gear assembly 4711 is disposed, a rail for guiding movement of the foreign object, or the like. The first anti-jamming structure 475 may be disposed on the filtering box 410, in the accommodating groove 108 (for example, on an inner side portion of the accommodating groove 108), or partially disposed on the filtering box 410 and partially disposed in the accommodating groove 108.

Figure 45A:
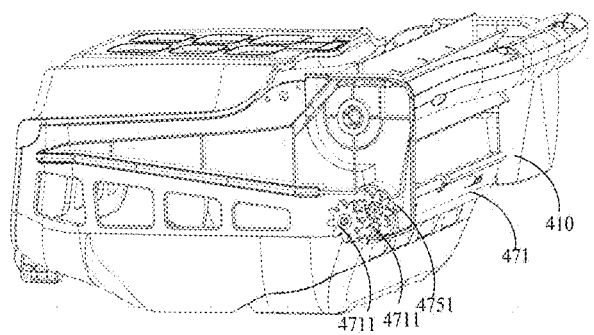
FIG. 45a is a schematic structural view of a filtering box of a cleaning device according to an embodiment of the present disclosure.
Figure 45B:
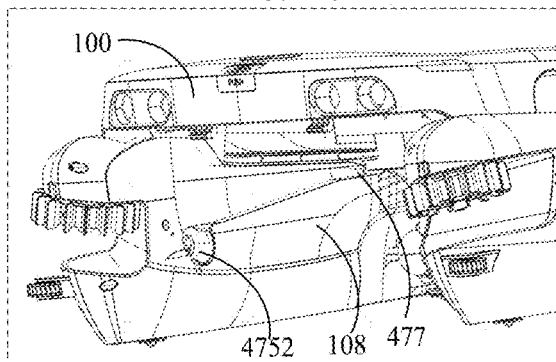
FIG. 45b is a schematic structural view of a filtering box of a cleaning device according to an embodiment of the present disclosure.
Figure 45C:
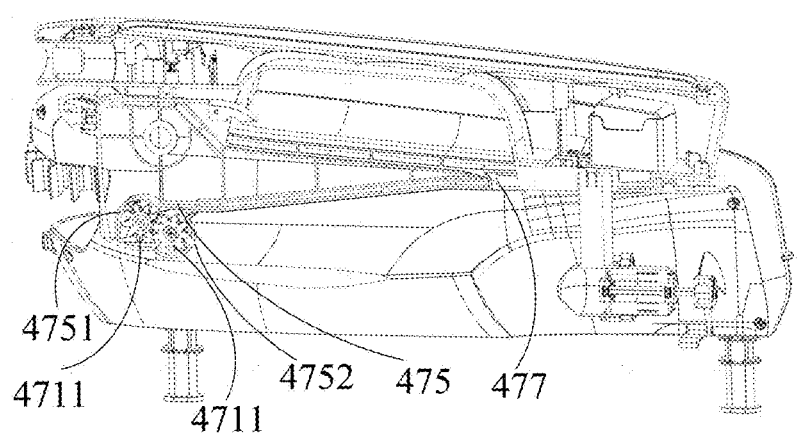
FIG. 45c is a partial cross-sectional view of a cleaning device according to an embodiment of the present disclosure.

In a specific embodiment, the first anti-jamming structure 475 is partially disposed on the filtering box 410 and partially disposed on the inner side portion of the accommodating groove 108. FIG. 45a is a schematic structural view of the filtering box of the cleaning device according to an embodiment of the present disclosure. FIG. 45b is a schematic structural view of the filtering box of the cleaning device according to an embodiment of the present disclosure. FIG. 45c is a partial cross-sectional view of the cleaning device according to an embodiment of the present disclosure. As shown in FIG. 45a to FIG. 45c, the first anti-jamming structure 475 includes a first anti-jamming sub-structure 4751 and a second anti-jamming sub-structure 4752. The first anti-jamming sub-structure 4751 is disposed on the filtering box 410, and the second anti-jamming sub-structure 4752 is disposed on the inner side portion of the accommodating groove 108. When the filtering box 410 is assembled to the accommodating groove 108, the first anti-jamming sub-structure 4751 and the second anti-jamming sub-structure 4752 jointly form the first anti-jamming structure 475, for example, a structure that partially or entirely surrounds the anti-regurgitation gear assembly 4711, to reduce a possibility that a foreign object enters the anti-regurgitation gear assembly 4711.

Figure 46:
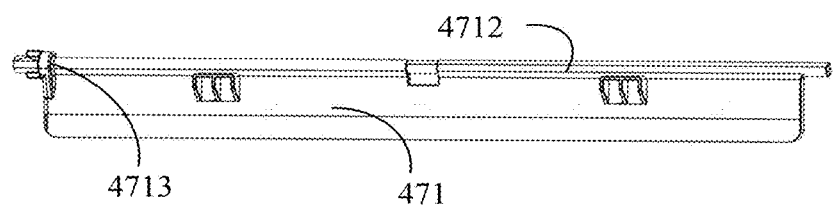
FIG. 46 is a schematic structural view of an anti-regurgitation door according to an embodiment of the present disclosure.

In some embodiments, the anti-regurgitation door 471 is rotatably connected to the filtering box 410 through a rotating structure, so that the anti-regurgitation door 471 can rotate relative to the debris inlet 413. FIG. 46 is a schematic structural view of the anti-regurgitation door according to an embodiment of the present disclosure. As shown in FIG. 46, the rotating structure may include a second rotating shaft 4712. At least one end of the second rotating shaft 4712 is connected to the anti-regurgitation drive assembly to implement drive control of the anti-regurgitation door 471. In a specific embodiment, one end of the second rotating shaft 4712 is connected to the anti-regurgitation drive assembly, and the end is provided with a first reinforcing part 4713, to reduce a risk that the second rotating shaft 4712 is broken under a force. This ensures that the debris in the filtering box 410 is less likely to be regurgitated when the anti-regurgitation door 471 is closed. The first reinforcing part 4713 may be any component having a reinforcing function, such as a reinforcing rib. The first reinforcing part 4713 may be integrally formed with the anti-regurgitation door 471 or connected to the anti-regurgitation door 471 through welding, a threaded connection, or the like.

In some embodiments, the roller brush 450 includes a roller brush drive assembly. The roller brush drive assembly includes a roller brush drive motor, that is, a drive shaft of the roller brush drive motor is connected to the roller brush 450 to directly drive the roller brush 450 to rotate relative to the debris inlet 413. Alternatively, the roller brush drive assembly includes a roller brush drive motor and a roller brush gear assembly 4503. The roller brush gear assembly 4503 is disposed between the roller brush drive motor and the roller brush 450 in a transmission manner. The roller brush gear assembly 4503 includes at least one gear. The roller brush drive motor drives the roller brush gear assembly 4503 to rotate, and the roller brush gear assembly 4503 drives the roller brush 450 to rotate relative to the debris inlet 413. In some embodiments, the roller brush drive assembly includes a second anti-jamming structure 476, so that the roller brush gear assembly 4503 can operate stably during transmission, and the following case can be avoided: The roller brush gear assembly 4503 is jammed because the gear wears, a foreign object wraps around the gear, or the gear is deformed. The second anti-jamming structure 476 may be, but is not limited to, a baffle provided partially or entirely around the roller brush gear assembly 4503, a housing covering the roller brush gear assembly 4503, a groove in which the roller brush gear assembly 4503 is disposed, a rail for guiding movement of the foreign object, or the like. The second anti-jamming structure 476 may be disposed on the filtering box 410, in the accommodating groove 108 (for example, on an inner side portion of the accommodating groove 108), or partially disposed on the filtering box 410 and partially disposed in the accommodating groove 108.

In a specific embodiment, the second anti-jamming structure 476 is partially disposed on the filtering box 410 and partially disposed on the inner side portion of the accommodating groove 108. FIG. 47a is a schematic structural view of the filtering box of the cleaning device according to an embodiment of the present disclosure. FIG. 47b is a schematic structural view of the filtering box of the cleaning device according to an embodiment of the present disclosure. FIG. 47c is a partial cross-sectional view of the cleaning device according to an embodiment of the present disclosure. As shown in FIG. 47a to FIG. 47c, the second anti-jamming structure 476 includes a third anti-jamming sub-structure 4761 and a fourth anti-jamming sub-structure 4762. The third anti-jamming sub-structure 4761 is disposed on the filtering box 410, and the fourth anti-jamming sub-structure 4762 is disposed on the inner side portion of the accommodating groove 108. When the filtering box 410 is assembled to the accommodating groove 108, the third anti-jamming sub-structure 4761 and the fourth anti-jamming sub-structure 4762 jointly form the second anti-jamming structure 476, for example, a structure that partially or entirely surrounds the roller brush gear assembly 4503, to reduce a possibility that a foreign object enters the roller brush gear assembly 4503.

In some embodiments, when the filtering box 410 is assembled to the accommodating groove 108, at least two of the first anti-jamming structure 475, the second anti-jamming structure 476, and the inner side portion of the accommodating groove 108 are on a same side of the cleaning device 1000 and may jointly form a surrounded region. When the anti-regurgitation gear assembly 4711 and the roller brush gear assembly 4503 are located on a same side of the filtering box 410, both may be disposed in a surrounded region on the same side. When the anti-regurgitation gear assembly 4711 and the roller brush gear assembly 4503 are located on different sides of the filtering box 410, the two may be respectively disposed in surrounded regions on corresponding sides. Structures of the surrounded regions on different sides may be the same or may be differently configured based on an actual requirement.

In a specific embodiment, the accommodating groove 108 further includes a third anti-jamming structure 477. The third anti-jamming structure 477 may be disposed at a position on the inner side portion of the accommodating groove 108, and the position is close to the rear portion of the cleaning device 1000, or may be disposed on a side of a rear portion of the filtering box 410, to reduce a possibility that a foreign object enters the anti-regurgitation gear assembly 4711 or the roller brush gear assembly 4503 from the rear portion of the cleaning device 1000 when the filtering box 410 is assembled to the accommodating groove 108. The third anti-jamming structure 477 may be, but is not limited to, a combination of one or more of a baffle, a housing, a groove, or a rail. The third anti-jamming structure 477 may form a surrounded region with at least one of the first anti-jamming structure 475, the second anti-jamming structure 476, and other parts of the inner side portion of the accommodating groove 108 (for example, a protrusion on the inner side portion), to further improve an anti-jamming effect for the anti-regurgitation gear assembly 4711 or the roller brush gear assembly 4503.

In some embodiments, the roller brush drive assembly and the anti-regurgitation drive assembly are disposed on different sides of the cleaning device body 100.

FIG. 32 is a simplified schematic structural view of an anti-regurgitation assembly according to an embodiment of the present disclosure. The anti-regurgitation assembly 470 includes a first anti-regurgitation portion 472. The first anti-regurgitation portion 472 is provided near the debris inlet 413. The first anti-spitting part 472 is in a horn-like shape and has a smaller cross-sectional area at a position away from the debris inlet 413. In other words, the cross-sectional area of the first anti-spitting part 472 gradually decreases in a direction substantially perpendicular to a direction from the first sub side wall (not shown) to the fourth sub side wall (not shown), or in a direction from the debris inlet 413 to the interior of the filtering box 410. The first anti-regurgitation portion 472 has a large cross-sectional area close to the debris inlet 413 and a small cross-sectional area away from the debris inlet 413. In this way, the debris can be easy to enter the filtering box 410 and difficult to overflow from the filtering box 410 through the debris inlet 413. When the cleaning device 1000 moves backward, makes a turn, and stops operating, the first anti-regurgitation portion 472 can prevent at least a part of the debris from being regurgitated to the to-be-cleaned region.

FIG. 33 is a simplified schematic structural view of the anti-regurgitation assembly according to another embodiment of the present disclosure. The anti-regurgitation assembly 470 includes an anti-regurgitation plate 473. Two ends of the anti-regurgitation plate 473 are rotatably connected in the filtering box 410 and disposed at the debris inlet 413. When the cleaning device 1000 moves forward, the agitated water flow makes the anti-regurgitation plate 473 rotate toward inner space of the filtering box 410, so that the debris inlet 413 is opened, and the debris easily enters the filtering box 410. When the cleaning device 1000 moves backward, makes a turn, and stops operating, the agitated water flow disappears or weakens. In this case, under the action of a configuration of the anti-regurgitation plate 473 and an action force, the debris inlet 413 is closed by the anti-regurgitation plate 473 to prevent at least a part of the debris from being regurgitated to the to-be-cleaned region. A buoyancy structure (not shown) or the like may be provided in the anti-regurgitation plate 473, so that the anti-regurgitation plate 473 can at least block the debris inlet 413 by using the buoyancy structure when there is no agitated water flow. Alternatively, a position of the anti-regurgitation plate 473 is adjusted, so that the anti-regurgitation plate 473 closes the debris inlet 413 under the gravity of the anti-regurgitation plate 473. It should be noted that the anti-regurgitation plate 473 is always disposed inside the filtering box 410.

FIG. 34 is a simplified schematic structural view of the anti-regurgitation assembly according to yet another embodiment of the present disclosure. Several second anti-regurgitation portions 474 are provided at the debris inlet 413 of the filtering box 410 and extend into the filtering box 410. The several second anti-regurgitation portions 474 are disposed on an inner wall close to the debris inlet 413 in a staggered manner to form a serrated anti-regurgitation structure. In addition, the several second anti-regurgitation portions 474 extend toward the interior of the filtering box 410. The staggered second anti-regurgitation portions 474 may be at least disposed on a transition channel extending from the debris inlet 413 to the interior of the filtering box 410, such as an inner side of an upper wall and an inner side of a lower wall, an inner side of each of two opposite side walls, or an inner side of each of four inner walls, of the transition channel. The second anti-regurgitation portion 474 extends along a direction from the first sub side wall to the fourth sub side wall and is configured at an acute angle with the inner side wall of the filtering box 410, to prevent at least a part of the debris from being regurgitated to the to-be-cleaned region.

In some embodiments, the cleaning device 1000 includes a roller brush 450. The roller brush 450 may be rotatably provided at the cleaning device body 100 or the debris inlet of the filtering box 410. The cleaning device 1000 includes a roller brush drive assembly. The roller brush 450 is driven by the roller brush drive assembly. The roller brush 450 exists alone, or the roller brush 450 and at least one component, two components, or a plurality of components of the anti-regurgitation assembly 470 coexist. For example, the roller brush 450 and the anti-regurgitation door 471 coexist in the cleaning device 1000, or the roller brush 450 and the first anti-regurgitation portion 472 coexist in the cleaning device 1000, or the roller brush 450 and the anti-regurgitation plate 473 coexist in the cleaning device 1000, or the roller brush 450, the first anti-regurgitation portion 472, and the anti-regurgitation plate 473 coexist in the cleaning device 1000. In a specific embodiment, when the roller brush 450 and the anti-regurgitation assembly 470 coexist in the cleaning device 1000, there is no interference between the roller brush 450 and the anti-regurgitation assembly 470, that is, there is no interference between a movement track of the roller brush 450 and a movement track of the anti-regurgitation assembly 470. Alternatively, when there is an interference between the roller brush 450 and the anti-regurgitation assembly 470, the anti-regurgitation assembly 470 or the roller brush 450 may be made of a flexible material to reduce hard contact between the anti-regurgitation assembly 470 and the roller brush 450, thereby reducing damage to components. In some cases, the anti-regurgitation plate 473 is the anti-regurgitation door 471. In another specific embodiment, when the roller brush 450 and the anti-regurgitation assembly 470 coexist in the cleaning device 1000, there is an interference between the roller brush 450 and the anti-regurgitation assembly 470, and the anti-regurgitation assembly 470 and the roller brush 450 are both made of a rigid material.

The roller brush 450 may be made of a rigid material or a flexible material, or the roller brush 450 may be partially made of a rigid material and partially made of a flexible material. In some embodiments, the roller brush includes a roller brush blade 4501 and a roller brush base 4502. The roller brush blade 4501 is disposed on the roller brush base 4502. A shape of the roller brush base 4502 may be, but is not limited to, cylindrical. FIG. 30b is a third schematic structural view of the filtering box of the cleaning device according to the present disclosure. FIG. 30c is a schematic structural view of the roller brush of the cleaning device according to the present disclosure. The roller brush base 4502 may be made of a rigid material, and the roller brush blade 4501 may be made of a flexible material, or the roller brush blade 4501 may be partially made of a flexible material and partially made of a rigid material (for example, a part of the roller brush blade 4501 is connected to the roller brush base 4502, the part is made of a rigid material, and other parts of the roller brush blade 4501 are made of a flexible material). When a hard object, such as a branch, is located between the roller brush 450 and other mechanisms of the cleaning device body 100, the flexible roller brush blade 4501 is deformed, so that a possibility that the hard object is stuck between the roller brush blade 4501 and other mechanisms of the cleaning device body 100 can be reduced. In this way, a possibility that the roller brush 450 stops rotating is reduced, and a possibility that the roller brush 450 is damaged is reduced. In some embodiments, roller brush blades 4501 are discontinuous in an axial direction of the roller brush base 4502. When the cleaning device 1000 performs water surface cleaning, because each roller brush blade 4501 is in contact with the water surface, contact areas of the roller brush blades 4501 with the water are reduced. In this way, slaps of the roller brush blades 4501 against the water surface are reduced when the roller brush blades 4501 are in contact with the water surface, and resistance applied to the cleaning device 1000 is reduced when the cleaning device 1000 enters the water. In some embodiments, the roller brush blades 4501 are staggered in the axial direction of the roller brush base 4502, so that during rotation of the roller brush, the roller brush blade 4501 is always in contact with the water surface to form a continuous agitated water flow. This improves efficiency of external debris entering the filtering box 410 and improves an effect of preventing at least a part of the debris inside the filtering box 410 from being regurgitated. In some embodiments, the roller brush blade 4501 is disposed obliquely in the axial direction of the roller brush base 4502 to reduce a contact area of a single roller brush blade 4501 with water.

In this way, resistance applied to the cleaning device 1000 is reduced when the cleaning device 1000 enters the water. In some embodiments, a length of the roller brush blade 4501 is increased to increase an amount of water stirred by the roller brush blade 4501, so that intensity of the water flow formed during rotation of the roller brush blade 4501 is increased. This further improves the efficiency of external debris entering the filtering box 410 and improves the effect of preventing at least a part of the debris inside the filtering box 410 from being regurgitated.

In some embodiments, the roller brush drive assembly may be a roller brush drive motor. In other words, a drive shaft of the roller brush drive motor is connected to the roller brush 450 to directly drive the roller brush 450 to rotate. Alternatively, the roller brush drive assembly includes the roller brush drive motor and a roller brush transmission assembly (not shown). The roller brush transmission assembly is provided between the roller brush drive motor and the roller brush 450 in a transmission manner. The roller brush drive motor drives the roller brush transmission assembly to rotate, and the roller brush transmission assembly drives the roller brush 450 to rotate. The roller brush transmission assembly may be, but is not limited to, a roller brush gear assembly, a roller brush belt assembly, or the like. Alternatively, the roller brush drive assembly includes the roller brush drive motor and a roller brush magnetic attraction assembly (not shown). The roller brush magnetic attraction assembly is provided between the roller brush drive motor and the roller brush 450, the roller brush drive motor drives the roller brush magnetic attraction assembly to move, and the roller brush magnetic attraction assembly drives the roller brush 450 in a magnetic transmission manner. Compared with a case where the roller brush 450 is directly driven by the roller brush drive motor or is jointly driven by the roller brush drive motor and the roller brush transmission assembly, in this embodiment, the roller brush magnetic attraction assembly and the roller brush 450 cooperate with each other, so that it is easy to mount the roller brush 450 in position without considering whether gears are engaged with each other in position. When the roller brush 450 is jammed due to rigid objects such as branches, or the roller brush 450 is stuck because the filtering box 410 is full of the debris, the roller brush magnetic attraction assembly may still rotate relative to the roller brush 450, so that the roller brush drive motor can still rotate without generating abnormal noise. The roller brush drive motor may be, but is not limited to, a stepper motor.

In an embodiment, the roller brush drive motor may be the stepper motor. The roller brush magnetic attraction assembly includes a first roller brush magnetic attraction part (not shown) and a second roller brush magnetic attraction part (not shown). The first roller brush magnetic attraction part is connected to a drive shaft of the stepper motor. The second roller brush magnetic attraction component is provided at the filtering box 410 and is connected to the roller brush 450. When the roller brush drive motor is in operation, the first roller brush magnetic attraction part and the second roller brush magnetic attraction part rotate relative to each other, and the roller brush 450 rotates with the second roller brush magnetic attraction part. When the roller brush 450 is jammed due to rigid objects such as branches, or the roller brush 450 is stuck because the filtering box 410 is full of the debris, the first roller brush magnetic attraction part and the second roller brush magnetic attraction part may still rotate relative to each other, so that the roller brush drive motor can still rotate without generating abnormal noise. It should be noted that a disposition manner and a principle of the roller brush magnetic attraction assembly are the same as a disposition manner and a principle of the anti-regurgitation magnetic attraction assembly. Details are not described herein. A structure of the roller brush drive assembly may be the same as that of the auxiliary drive assembly 550.

In some embodiments, the cleaning device 1000 includes a side brush 511 and an auxiliary drive assembly 550. The auxiliary drive assembly 550 is connected to the side brush 511, and the auxiliary drive assembly 550 may provide a driving force for the side brush 511. When there are several side brushes 511, there are several auxiliary drive assemblies 550 connected to the several side brushes 511 in one-to-one correspondence. Alternatively, when there are several side brushes 511, there is one auxiliary drive assembly 550, and the one auxiliary drive assembly 550 drives the several side brushes 511 simultaneously. The auxiliary drive assembly 550 may be the side brush drive motor. Alternatively, the auxiliary drive assembly 550 includes the side brush drive motor and a side brush transmission assembly. The side brush transmission assembly may be, but is not limited to, a side brush gear transmission assembly, a side brush belt transmission assembly, or the like. Alternatively, the auxiliary drive assembly 550 includes the side brush drive motor and a side brush magnetic attraction assembly. It should be noted that the auxiliary drive assembly 550 may be the same as or similar to the roller brush drive assembly. Details are not described herein. The auxiliary drive assembly 550 may be the third drive assembly.

In some embodiments, the cleaning device 1000 further includes the roller brush 450 and several side brushes 511. The roller brush 450 is driven by the roller brush drive assembly, and the several side brushes 511 are driven by one or several auxiliary drive assemblies 550. Alternatively, the roller brush 450 and the several side brushes 511 are simultaneously driven by one drive assembly. In this case, the roller brush 450 and the several side brushes 511 need to be driven by a corresponding roller brush transmission assembly or a corresponding side brush transmission assembly, thereby implementing simultaneous driving.

In some embodiments, in the cleaning device 1000, an output end of a drive motor (for example, the roller brush drive motor, the side brush drive motor, or the anti-regurgitation drive motor) may be sealed, for example, by disposing a sealing structure, to avoid the following case: Water enters the motor through a gap at the output end of the motor, causing the motor to short-circuit, rust, or have other malfunctions. This ensures normal operation of the motor. The sealing structure is a structure having a sealing function and may be, but is not limited to, a double-lip oil seal, to ensure reliability and a service life of the drive motor when the drive motor operates in a humid environment or underwater.

FIG. 35 is a schematic structural view of a side brush drive motor according to the present disclosure. In some embodiments, each of the roller brush drive motor and the side brush drive motor 552 may be the stepper motor. The cleaning device 1000 includes a real-time rotation speed detection assembly (not shown). The real-time rotation speed detection assembly may be provided at the stepper motor. The real-time rotation speed detection assembly may be configured to detect a rotation speed of the stepper motor in real time, to determine, based on the rotation speed, whether the stepper motor is out of step. When the real-time rotation speed detection assembly detects that the stepper motor is out of step, the real-time rotation speed detection assembly feeds back a signal to a control system (not shown), and the control system increases a current of the stepper motor incrementally, to increase an output torque of the stepper motor. In this way, a requirement that the stepper motor can normally operate under heavy load for the cleaning device 1000 can be met.

In an embodiment, when the cleaning device 1000 performs water surface cleaning, the load of the cleaning device 1000 is small, and the control system provides a low current to meet the normal operation of the stepper motor. When an external load increases, such as when the side brush 511 cleans the wall or when the side brush 511 or the roller brush 450 is jammed by leaves, branches, and the like, the low current cannot meet a requirement that the stepper motor normally operates at a rated rotation speed. In this case, the real-time rotation speed detection assembly detects that the stepper motor is out of step and feeds back a detection result to the control system, and the control system appropriately increases the current gradually, to meet a requirement that the stepper motor can normally operate under a current load. Currently, the maximum current setting levels may be set to 4096 levels, and a specific setting of levels may be adjusted based on an actual requirement. The stepper motor, the real-time rotation speed detection assembly, and the control system cooperate with each other, to ensure that the side brush 511 and/or the roller brush 450 can efficiently operate for a long time.

In another embodiment, when the multi-functional cleaning device moves in the water and cleans in a region close to the wall of the pool, the side brush 511 cleans the wall of the pool, and the load is high. The real-time rotation speed detection assembly detects a state of the stepper motor in real time and feeds back the detection result to the control system, and the control system adjusts an input current of the stepper motor to meet the normal operation under the current load.

The stepper motor has advantages of high reliability, a long service life, precise control, and the like, which meets driving requirements of the side brush 511 and/or the roller brush 450. Specifically, the stepper motor is featured by reliability. For example, when the cleaning device 1000 performs water surface cleaning, an output rotation speed of the stepper motor is less than or equal to 100 rpm, and the stepper motor may operate directly at 100 rpm without an additional reduction gearbox. Compared with an existing drive motor that rotates at thousands to tens of thousands of rpm and needs to be provided with the reduction gearbox to meet a requirement for a low rotation speed, the stepper motor in embodiments of the present disclosure has a simpler structure, and a risk of a system failure is reduced. In this embodiment, when the cleaning device 1000 performs water surface cleaning, the output rotation speed of the stepper motor may be greater than or equal to 40 rpm and less than or equal to 100 rpm. The output rotation speed of the stepper motor may be, but is not limited to, 40 rpm, 50 rpm, 60 rpm, 70 rpm, 85 rpm, 94 rpm, or 100 rpm. Further, the output rotation speed of the stepper motor may be greater than or equal to 60 rpm and less than or equal to 80 rpm.

The stepper motor is featured by a long service life. The stepper motor does not include a carbon brush and a commutator, so that mechanical wear and tear of the stepper motor can be reduced, thereby improving the service life of the stepper motor. In addition, maintenance costs can be reduced, and a frequency of replacing a part can be decreased. The stepper motor is featured by precise control. The stepper motor may be configured to convert an electrical pulse signal into angular displacement or linear displacement. In a non-overloaded situation, the rotation speed and a stopping position of the stepper motor only depend on a frequency and a pulse count of the pulse signal, and are not affected by load changes.

In an embodiment, the real-time rotation speed detection assembly includes a grating disk 561 and a grating sensor 562. The grating disk 561 is mounted on the drive shaft of the stepper motor. A photoelectric emission part in the grating sensor 562 is mounted at the drive housing 551, and the photoelectric emission part is at least partially located near two side surfaces of the grating of the grating disk 561. A receiving part in the grating sensor 562 is connected to the control system. When the stepper motor rotates, the grating disk 561 rotates synchronously. For a person skilled in the art, a detection principle of the grating disk 561 and a detection principle of the grating sensor 562 are conventional technologies. The grating disk 561 and the grating sensor 562 may cooperate with each other to detect whether the stepper motor is out of step. An upper surface of the grating disk 561 is in a planar and annular shape. The drive shaft passes through and is connected to a middle part of the grating disk 561. A side wall is provided around a periphery of a lower surface of the grating disk 561 and is substantially perpendicular to the upper surface. An equidistant grating is provided at the side wall. The grating sensor 562 is at least partially mounted on the two side surfaces of the grating.

In other embodiments, the real-time rotation speed detection assembly further includes a Hall code disk (not shown) and a Hall element (not shown). The drive shaft of the stepper motor passes through and is connected to the Hall code disk. The Hall code disk is provided with several Hall magnetic parts (not shown). The Hall element is provided on a drive circuit board (not shown). The drive circuit board is connected to the stepper motor. The drive circuit board does not rotate with the drive shaft of the stepper motor. When the Hall code disk rotates with the drive shaft, each Hall magnetic part approaches the Hall element in turn, and the Hall element is configured to sense magnetic field strength of the Hall magnetic part. The Hall element feeds back a signal of the magnetic field strength to the drive circuit board in real time, to detect in real time whether the stepper motor is out of step.

In some embodiments, the real-time rotation speed detection assembly may further include a magnetic encoder (not shown). This is not limited herein.

In some embodiments, a real-time rotation speed detection assembly corresponding to the roller brush drive motor may be different from a real-time rotation speed detection assembly corresponding to the side brush drive motor 552. For example, the real-time rotation speed detection assembly corresponding to the roller brush drive motor includes the magnetic encoder, and the real-time rotation speed detection assembly corresponding to the side brush drive motor includes the grating disk 561, the grating sensor 562, and the like. In an embodiment, because the roller brush 450 is connected to the gear, once the roller brush drive motor is out of step, loud noise may be generated due to vibration of the roller brush 450 and the gear. A component accuracy of the real-time rotation speed detection assembly corresponding to the roller brush drive motor may be improved by using the magnetic encoder with high resolution or the like, to narrow a recognized step-out range of the roller brush drive motor. The step-out range is a range within which the roller brush drive motor may be out of step. The roller brush drive motor is adjusted within a small step-out range to reduce an amplitude of the vibration generated by the roller brush drive motor. In this way, the noise generated due to the vibration of the roller brush 450 can be reduced, thereby improving product experience.

As further shown in FIG. 1 and FIG. 2, in some embodiments, the cleaning device 1000 includes the solar mechanism 600. The solar mechanism 600 includes the solar panel (not shown). The solar panel is provided on a side surface of the top cover 107, and the side surface is away from the accommodating groove 108. The solar panel may be electrically connected to a battery pack (not shown) to supply power to an electrical component of the cleaning device 1000 through the battery pack. Alternatively, the solar panel directly supplies power to the electrical component of the cleaning device 1000.

A length direction of the filtering box 410 of the main cleaning mechanism 400 extends along the forward direction of the cleaning device body 100. A width direction of the filtering box 410 extends along a direction substantially perpendicular to the forward direction of the cleaning device body 100. A length of the filtering box 410 is greater than or equal to a width of the filtering box 410. In addition, the width of the filtering box 410 is greater than or equal to a height of the filtering box 410. In other words, the filtering box 410 is laid flat in the accommodating groove 108. A size of the filtering box 410 is limited, so that an unfolded area of the cleaning device 1000 in the pool can be increased, and a size of the cleaning device 1000 in the height direction can be reduced, thereby improving the cleaning efficiency of the main cleaning mechanism 400. In addition, the size of the filtering box 410 is limited, so that a surface area of the top cover 107 is large correspondingly, and an area of the solar panel is increased, thereby improving energy supplement efficiency of the cleaning device 1000.

In some embodiments, a maximum length of the contour of the cleaning device body 100 along the forward direction is defined as a first length and represented as L, and a maximum width of the contour of the cleaning device body 100 along a direction perpendicular to the forward direction is defined as a first width and represented as W. In addition, a maximum length of the solar panel along the forward direction is defined as a second length and represented as 1, and a maximum width of the solar panel along the direction perpendicular to the forward direction is defined as a second width and represented as w. In this case, 1>1/L≥0.7, and 1>w/W≥0.5. Based on the disposition of the filtering box 410, the top cover 107 does not need to be frequently flipped and opened by the user, and the area of the solar panel may be set to be larger, thereby improving the energy supplement efficiency. Herein, l/L, namely, a ratio of 1 to L, may be, but is not limited to, 0.7, 0.73, 0.78, 0.8, 0.84, 0.85, 0.91, 0.98, or the like, and w/W, namely, a ratio of w to W, may be, but is not limited to, 0.5, 0.54, 0.62, 0.69, 0.72, 0.78, 0.9, 0.94, 0.98, or the like.

In an embodiment, 1>1/L≥0.75, and 1>w/W≥0.6. For example, L is 532 mm, W is 486 mm, 1 is 425 mm, and w is 328 mm. In this case, 1/L is equal to 0.79, and w/W is equal to 0.67. A size of the solar panel is related to the overall contour of the cleaning device body 100, and the size of the solar panel may be set as required.

In other embodiments, 1 may represent the maximum length of the solar panel along the forward direction, and w may represent the maximum width of the solar panel along the direction substantially perpendicular to the forward direction, where 1≥400 mm, w≥320 mm, and 1≥w. Based on the disposition of the filtering box 410, the solar panel may be directly fixed on the cleaning device body 100 or the buoyancy cavity 210, to increase the size and the area of the solar panel, thereby improving the energy supplement efficiency of the cleaning device 1000. Herein, 1 may be, but is not limited to, 400 mm, 420 mm, 431 mm, 445 mm, 465 mm, 470 mm, 500 mm, 530 mm, 590 mm, 600 mm, 700 mm, or the like, and w may be, but is not limited to, 320 mm, 370 mm, 431 mm, 470 mm, 500 mm, 530 mm, 590 mm, 600 mm, or the like.

In an embodiment, when the filtering box 410 is assembled in the cleaning device 1000, a projection range of the solar panel is equal to or greater than a projection range of the filtering box 410 along a height direction, namely, the height direction of the cleaning device 1000. In other words, a projection area of the solar panel is equal to or greater than a projection area of the filtering box 410 along the height direction of the cleaning device 1000. Further, when the solar panel is located above the filtering box 410, a projection of the solar panel partially or completely overlaps with a projection of the filtering box 410, and the projection range of the solar panel is equal to or greater than the projection range of the filtering box 410. Because the filtering box 410 occupies large space in the cleaning device 1000, a size of the solar panel is large, thereby improving energy supplement efficiency of the cleaning device 1000.

Figure 36A:
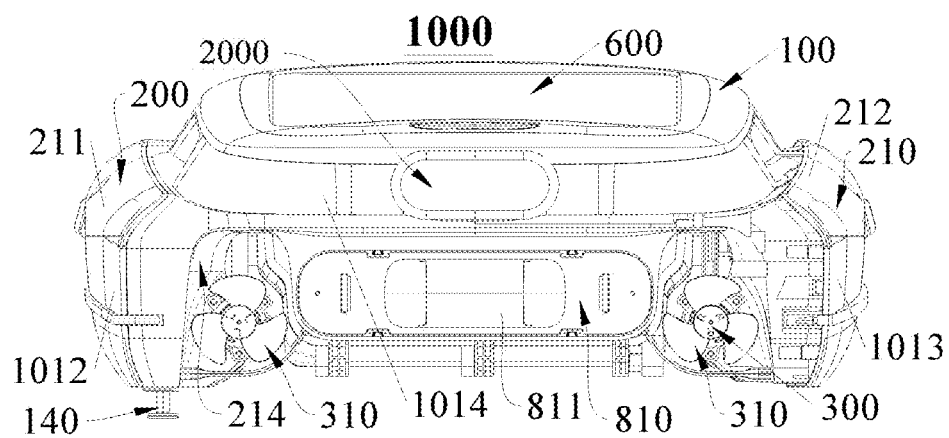
FIG. 36a is a first side view of a cleaning device according to a first embodiment of the present disclosure.
Figure 36B:
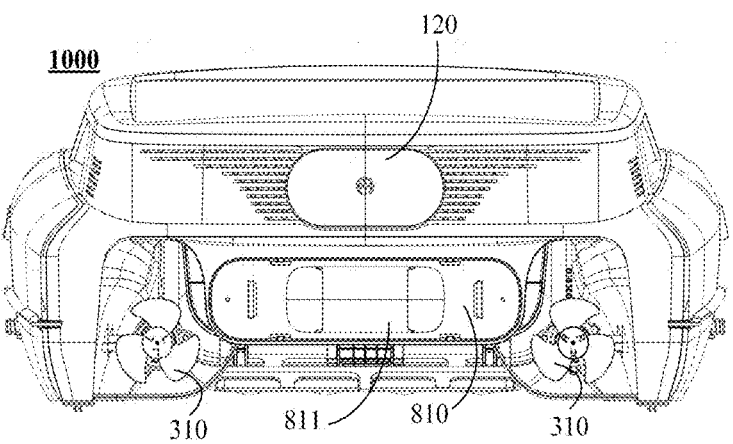
FIG. 36b is a second side view of a cleaning device according to a first embodiment of the present disclosure.
Figure 37:
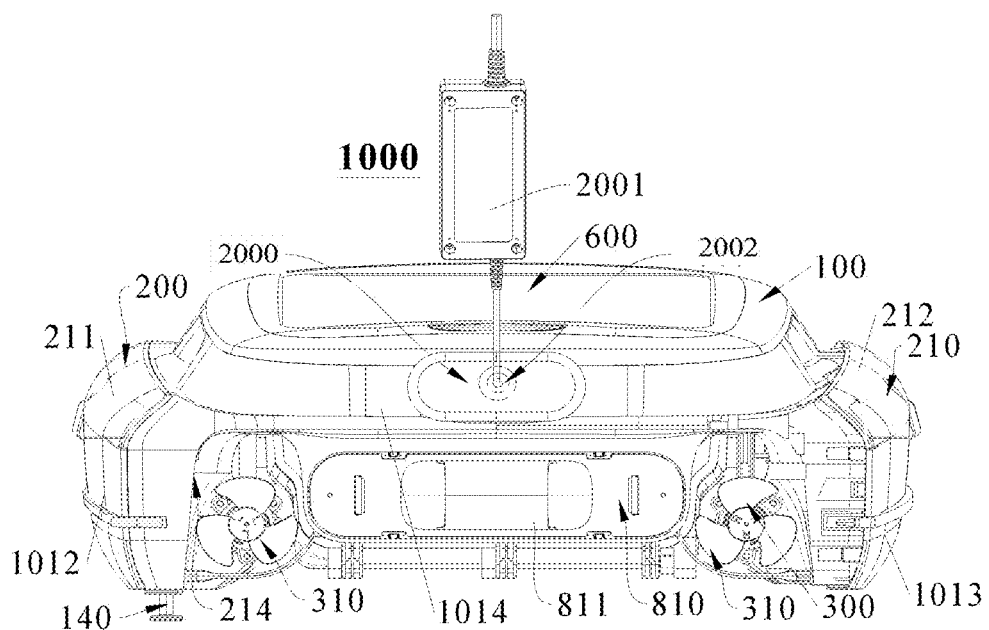
FIG. 37 is a schematic structural view of a cleaning device according to a first embodiment of the present disclosure.

FIG. 36a is a first side view of the cleaning device according to the first embodiment of the present disclosure. FIG. 36b is a second side view of the cleaning device according to the first embodiment of the present disclosure. FIG. 37 is a schematic structural view of the cleaning device according to the first embodiment of the present disclosure. In some embodiments, the cleaning device body 100 is provided with a wireless charging interface 120. The cleaning device 1000 may be charged and powered through the wireless charging interface 120, to meet a requirement for cleaning the pool on a rainy day. The wireless charging interface 120 may be disposed at the top cover 107 or the outer side portion of the cleaning device body 100, such as one of the first side portion 1011, the second side portion 1012, the third side portion 1013, and the fourth side portion 1014. There may be one, two, or a plurality of wireless charging interfaces 120. In this embodiment, there is one wireless charging interface 120, and the wireless charging interface 120 is disposed at the fourth side portion 1014.

The wall of the pool or the edge of the pool is provided with a wireless charging connector 2000 and an adapter 2001. One end of the adapter 2001 is connected to a power source through a cable, and the other end of the adapter 2001 is connected to the wireless charging connector 2000 through a cable. The wireless charging connector 2000 is electrically connected to the wireless charging interface 120 to implement wireless charging.

In some embodiments, FIG. 48 is a schematic structural view of the wireless charging interface and the wireless charging connector according to an embodiment of the present disclosure. As shown in FIG. 48, an end (denoted as a connection end) of the adapter 2001 is connected to the wireless charging connector 2000, and the end is provided with a second reinforcing part 2002 configured to improve strength of the connection end and reduce a risk that the connection end is broken due to an external force. In addition, the second reinforcing part 2002 may serve as a force bearing point for a user to take the wireless charging connector 2000. Specifically, the second reinforcing part 2002 may partially or entirely surround the connection end. When the user pulls a cable between the adapter 2001 and the wireless charging connector 2000 or removes the connection end, leading to an external force applied to the connection end, a possibility that the connection end is broken due to the external force can be effectively reduced by using the second reinforcing part 2002. This ensures a secure and reliable connection between the adapter 2001 and the wireless charging connector 2000. The second reinforcing part 2002 may be any component having a reinforcing function, for example, multi-layer buckles or a reinforcing rib.

In some embodiments, an automatic alignment assembly (not shown) is provided between the wireless charging interface 120 and the wireless charging connector 2000. Accuracy of automatic charging alignment of the wireless charging interface 120 and the wireless charging connector 2000 can be improved through the automatic alignment assembly. The automatic alignment assembly may be a magnetic attraction structure, an inserting structure, a clamping structure, or the like.

In an embodiment, the automatic alignment assembly includes a magnetic attraction automatic alignment assembly (not shown). The magnetic attraction automatic alignment assembly includes a first charging magnetic attraction part and a second charging magnetic attraction part. The first charging magnetic attraction part is provided at the wireless charging interface 120, and the second charging magnetic attraction part is provided at the wireless charging connector 2000. The first charging magnetic attraction part is connected to the second charging magnetic attraction part in a magnetic attraction manner, so that the wireless charging interface 120 and the wireless charging connector 2000 can automatically align for performing charging. In this way, the user does not need to manually plug the wireless charging connector 2000 in the wireless charging interface 120 precisely, thereby improving accuracy of automatic charging of the wireless charging interface 120 and the wireless charging connector 2000, and improving usage experience. In addition, charging stability can also be improved. The first charging magnet may be, but is not limited to, a first charging magnet. The second charging magnet may be, but is not limited to, a second charging magnet.

In some embodiments, the cleaning device 1000 includes a water quality detection assembly. The water quality detection assembly is provided at the cleaning device body 100. When the cleaning device 1000 enters the pool, a probe portion of the water quality detection assembly is at least located in the pool and is configured to detect and obtain water quality data of the to-be-cleaned region. The water quality detection assembly may detect, but is not limited to, at least one water quality parameter of a pH value, an ORP value, an EC value, a TDS value, and a water temperature. The water quality detection assembly may be detachably connected to the cleaning device body 100. This facilitates mounting and replacement of the water quality detection assembly.

In some embodiments, the cleaning device 1000 includes a processor 3002. The water quality detection assembly is connected to the processor 3002. The water quality detection assembly feeds back the detected water quality data to the processor 3002. The processor 3002 transmits the detected water quality data to an APP on a mobile phone through wireless communication. The user may check the water quality parameter of the pool in real time by using the APP, such as the PH, the ORP, the EC, the TDS, and the water temperature. The APP may further provide the user with a water quality treatment suggestion based on the water quality parameter of the pool, such as a reagent type and a quantity of reagents.

In some embodiments, the cleaning device 1000 further includes an in-position detection mechanism for the water quality detection assembly (not shown). The in-position detection mechanism for the water quality detection assembly may be configured to detect whether the water quality detection assembly is mounted in position on the cleaning device body 100 to ensure that the cleaning device 1000 may operate normally only after the water quality detection assembly is mounted in position. This reduces a problem of ineffective detection or a poor detection effect of the water quality detection assembly, thereby better improving intelligence of the cleaning device 1000. For a specific detection manner of the in-position detection mechanism for the water quality detection assembly, refer to the in-position detection mechanism for the filtering box. Details are not described herein again.

In some embodiments, the cleaning device 1000 includes a water quality treatment assembly 810 and a drive box 130. The water quality treatment assembly 810 may be detachably mounted on the cleaning device body 100. For example, the water quality treatment assembly 810 is provided at the rear portion of the cleaning device body 100. The water quality treatment assembly 810 may be separately detached, or the water quality treatment assembly 810 is integrated with a detachable apparatus (for example, the filtering box 410) of the cleaning device body 100 and detached with the detachable apparatus. The water quality treatment assembly 810 spreads a reagent into the pool to implement water quality treatment of the pool. The water quality treatment assembly 810 includes a reagent kit 811 and a reagent drive part (not shown). The reagent kit 811 is configured to store one or more reagents. The reagent may include, but is not limited to, a disinfectant, an algaecide, a coagulant aid, a pH adjuster, and the like. The reagent in the reagent kit 811 may be automatically spread under an external condition (for example, after being in contact with water, the reagent gradually dissolves, or the reagent is gradually released under gravity) or may be actively spread by using the reagent drive part of the cleaning device 100. The drive box 130 is provided in the cleaning device body 100, or the reagent kit 811 includes the reagent drive part, or the drive box 130 includes the reagent drive part. The reagent drive part is configured to provide a driving force to spread the reagent. The reagent drive part may be a reagent drive pump.

The water quality treatment assembly 810 further includes a first reagent pipeline (not shown) and a second reagent pipeline (not shown). The first reagent pipeline and the second reagent pipeline may be provided in the drive box 130. One end of the first reagent pipeline communicates with an outlet of the reagent kit 811 in a sealing manner, and the other end of the first reagent pipeline communicates with an inlet of the reagent drive part. One end of the second reagent pipeline communicates with an outlet of the reagent drive part, and the other end of the second reagent pipeline extends from the drive box 130 in a sealing manner and communicates with a reagent outlet. The first reagent pipeline, the second reagent pipeline, and the reagent drive part cooperate with each other, so that the reagent in the reagent kit 811 can be spread into the pool under the action of the reagent drive part. In some embodiments, the reagent outlet is provided on a housing of the drive box 130. In some embodiments, a filtering mesh is provided at the reagent outlet to prevent external debris from entering the drive box and causing damage to the drive box. The housing of the cleaning device 1000 is further provided with a reagent spread opening. For example, a bottom housing of the cleaning device 1000 is provided with the reagent spread opening. The drive box 130 may be disposed on the bottom housing of the cleaning device 1000. The bottom of the drive box 130 is provided with the reagent outlet. The reagent outlet cooperates with the reagent spread opening on the bottom housing, so that the reagent is driven by the reagent drive part to flow from the reagent kit 811 to the pool through the first reagent pipeline, the reagent drive part, the second reagent pipeline, the reagent outlet, and the reagent spread opening sequentially.

The water quality detection assembly may be configured to detect water quality data of the pool and transmit the water quality data to the processor 3002 of the cleaning device 1000. The processor 3002 may determine one or more abnormal water quality parameters based on the water quality data, and determine a reagent type for water treatment, a quantity of reagents, a reagent drainage manner, and the like based on the abnormal water quality parameters. If it is detected that the water quality is abnormal, and the water needs to be treated, the cleaning device 1000 may control the reagent drive part to be opened. The reagent in the reagent kit 811 may be released into the water of the pool through the reagent drive part to treat the water quality of the pool. The reagent drainage manner may include a continuous drive drainage manner or an intermittent drive drainage manner.

In some embodiments, the reagent kit 811 may be detachably connected to the cleaning device body 100, so that the reagent kit 811 can be mounted and replaced, thereby facilitating storage of different reagents. The drive box 130 may be a sealed cavity and fixedly provided at the cleaning device body 100. The drive box 130 may accommodate, but is not limited to, a battery pack, the reagent drive pump, a circuit board, and the like. This can reduce costs.

In some embodiments, when the cleaning device 1000 performs underwater cleaning, at least a part of the battery pack is located below the water surface, so that heat of the battery pack can be transferred to the water body, thereby cooling the battery pack. In this way, the following case can be avoided: charging efficiency is affected by high temperature of the battery pack due to direct sunlight and other factors, and working efficiency of the cleaning device 1000 is affected. In an embodiment, to reduce damage to the battery pack caused by water ingress into the battery pack, a housing may be provided outside the battery pack, and a thermally conductive sheet may be provided between the housing and the battery pack, so that a part of the battery pack, where the part is located below the water surface, is not directly in contact with the water body. It may be understood that, if the battery pack is originally disposed in a certain housing, such as a housing of the drive box 130, the thermally conductive sheet may be provided between the housing and the battery pack.

In some embodiments, the cleaning device 1000 further includes an in-position detection mechanism for the reagent kit (not shown). The in-position detection mechanism for the reagent kit includes at least one of a sensing assembly, an inductance assembly, and a switch assembly. For example, the sensing assembly and the inductance assembly may be a Hall sensing part and a Hall magnet respectively provided at the reagent kit and the cleaning device body 100. For a specific detection manner of the in-position detection mechanism for the reagent kit, refer to the in-position detection mechanism for the filtering box. Details are not described herein again.

In some embodiments, when the filtering box 410 is assembled to the accommodating groove 108, the filtering box 410 forms a water discharge channel with the rear portion of the cleaning device body 100. At least a part of water discharged from the filtering box 410 may be discharged through the water discharge channel along the forward direction of the cleaning device 1000. The water discharge channel may be a virtual channel or a physical channel and configured for the filtering box 410 to be in fluid communication with the rear portion of the cleaning device body 100. In other words, at least a part of water discharged from the filtering box 410 can be directly discharged from the rear portion of the cleaning device body 100 without being obstructed by other components (for example, the water quality treatment assembly 810 and/or the drive box 130) on the rear portion of the cleaning device body 100. Therefore, a possibility that water flows out from positions (for example, the second side portion 1012 or the third side portion 1013) on the cleaning device body 100 other than the rear portion is reduced. This prevents water flowing out from other positions from pushing uncleaned debris away from the cleaning device body 100.

In a specific embodiment, in the forward direction of the cleaning device 1000, the rear portion of the cleaning device body 100 includes the rear portion of the filtering box 410. Specifically, when the filtering box 410 is assembled to the cleaning device body 100, the rear portion of the filtering box 410 may serve as a part of the rear portion of the cleaning device body 100.

Figure 49A:
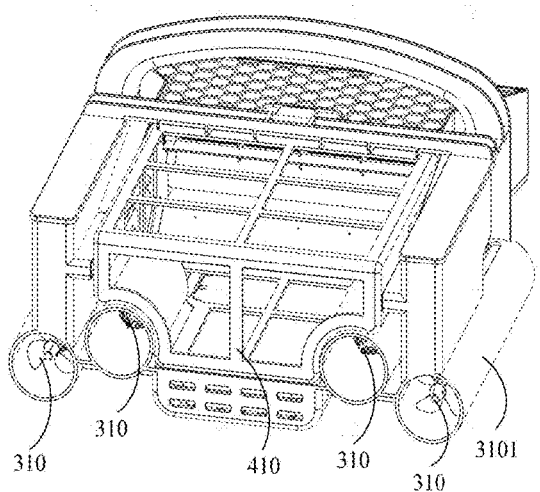
FIG. 49a is a partial structural view of a cleaning device according to an embodiment of the present disclosure.
Figure 49B:
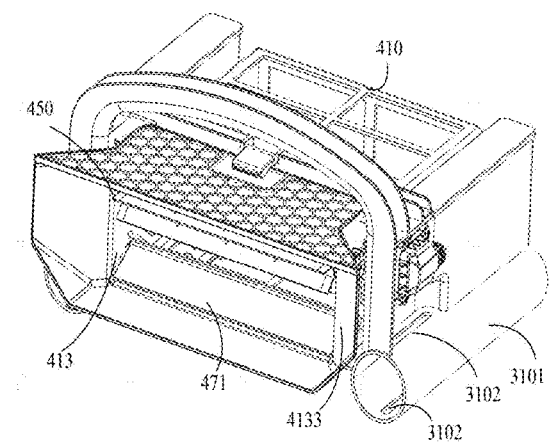
FIG. 49b is a partial structural view of a cleaning device according to an embodiment of the present disclosure.

In some embodiments, FIG. 49a is a partial structural view of the cleaning device according to an embodiment of the present disclosure, and FIG. 49b is a partial structural view of the cleaning device according to an embodiment of the present disclosure. As shown in FIG. 49a and FIG. 49b, along the forward direction of the cleaning device 1000, at least one propeller 310 is disposed behind the filtering box 410 or at the rear portion of the filtering box 410. When the propeller 310 is disposed behind the filtering box 410, a projection range of the propeller 310 at least partially overlaps with a projection range of the filtering box 410 along the forward direction of the cleaning device 1000, and the filtering box 410 is in front of the propeller 310. When the propeller 310 is disposed at the rear portion of the filtering box 410, the projection range of the propeller 310 at least partially overlaps with a projection range of the rear portion of the filtering box 410 along the direction perpendicular to the forward direction of the cleaning device 1000. The rear portion of the filtering box 410 is at least the last third portion of the filtering box 410 along the forward direction of the cleaning device 1000 after the filtering box 410 is assembled to the cleaning device body 100.

The propeller 310 is adjacent to the filtering box 410, and there are no other components between the propeller 310 and the filtering box 410. Water discharged from the filtering box 410 may flow directly through the propeller 310. The propeller 310 may exert a certain suction effect on the water flowing through the filtering box 410, so that a suction effect of the filtering box 410 for debris is improved. In a specific embodiment, a water outlet of the propeller 310 is provided on the rear portion of the cleaning device body 100. Because there are no other components between the propeller 310 and the filtering box 410, the water discharged from the filtering box 410 may be directly discharged from the rear portion of the cleaning device body 100 or discharged from the rear portion of the cleaning device body 100 through the propeller 310 without being obstructed by other components (for example, the water quality treatment assembly 810 and/or the drive box 130) on the rear portion. Therefore, a possibility that water flows out from positions (for example, the second side portion 1012 or the third side portion 1013) on the cleaning device body 100 other than the rear portion is reduced. This prevents water flowing out from other positions from pushing uncleaned debris away from the cleaning device body 100.

In some embodiments, at least two propellers 310 are respectively disposed on two sides of the cleaning device body 100. For example, one propeller 310 is disposed on the second side portion 1012, and the other propeller 310 is disposed on the third side portion 1013. Because the propellers 310 are disposed on the two sides of the cleaning device body 100, a large torque is provided, so that flexibility of direction adjustment of the cleaning device 1000 is improved.

In an embodiment, the cleaning device 1000 further includes a water flow channel 3101. The propeller 310 is disposed in the water flow channel 3101. Different propellers 310 may be disposed in different water flow channels 3101. The water flow channel 3101 may be cylindrical or may be in other shapes. The water flow channel 3101 is provided to guide the water flowing through the propeller 310, so that the water flows through the propeller 310 more stably. This improves propulsion efficiency. In a specific embodiment, in the forward direction of the cleaning device 1000, at least one water inlet of the water flow channel 3101 is located at the front portion of the cleaning device body 100, and at least one water outlet of the water flow channel 3101 is located at the rear portion of the cleaning device body 100.

In a specific embodiment, the water flow channel 3101 may be provided with at least one opening 3102. When there is gas around the water flow channel 3101, the gas may be discharged from the cleaning device body 100 through the opening 3102. In this way, the following case can be avoided: Amounts of gas at different positions (for example, the second side portion 1012 and the third side portion 1013) on the cleaning device body 100 are different, causing heights of different positions on the cleaning device body 100 to be inconsistent when the cleaning device 1000 operates in water.

In a specific embodiment, a quantity of propellers 310 is greater than two, and the quantity of propellers 310 is increased, so that a movement speed of the cleaning device 1000 is increased. Alternatively, the quantity of propellers 310 is less than or equal to two, and a rotation speed of the propeller 310 is increased (for example, a rotation speed of a drive motor of the propeller 310 is greater than or equal to 1000 r/min), so that the movement speed of the cleaning device 1000 is increased. The cleaning device body 100 moves relative to a water flow, so that the water flow and debris are drawn into the debris inlet 413. In this case, because a pushing force applied by the cleaning device 1000 to the water flow has not yet acted on the debris, a possibility that the debris is pushed away by the water flow is reduced. This improves debris cleaning efficiency of the cleaning device 1000.

In a specific embodiment, the water quality treatment assembly 810 and/or the drive box 130 may be disposed at the bottom of the filtering box 410. Based on this disposition manner, water can normally flow through the filtering box 410 without being affected. In addition, when the cleaning device 1000 operates in water, the bottom of the filtering box 410 is usually immersed in water. Accordingly, the water quality treatment assembly 810 and/or the drive box 130 disposed at the bottom of the filtering box 410 are/is also immersed in water, so that the water quality treatment assembly 810 and/or the drive box 130 can be cooled to some extent.

In a specific embodiment, the debris inlet 413 includes a gradually expanding structure 4133. The gradually expanding structure 4133 is a structure of the debris inlet 413 and in an expanded state (for example, in a flared state). The gradually expanding structure 4133 is configured to guide the water flow and expand a range from which the debris enters the debris inlet 413. This improves the cleaning effect of the cleaning device 1000. Refer to FIG. 49b. In a specific embodiment, at least a part of the gradually expanding structure 4133 may protrude from the accommodating opening 102 (not shown), or an outermost side of the gradually expanding structure 4133 is flush with the accommodating opening 102. An expansion angle of the gradually expanding structure 4133 may be greater than or equal to 45° to avoid the following case: The expansion angle is too small, causing the debris to be pushed away by the debris inlet 413.

In some embodiments, the adjustment mechanism 200 of the cleaning device 1000 includes a first buoyancy cavity 211 and a second buoyancy cavity 212 at least partially symmetrically provided at the cleaning device body 100. Stability of a buoyancy force applied to the cleaning device 1000 can be improved by using the two buoyancy cavities 210 at least partially symmetrically provided, so that a phenomenon that the cleaning device 1000 topples and deflects due to an uneven buoyancy force is less likely to occur. The top cover 107 is fixedly connected to the first buoyancy cavity 211 and the second buoyancy cavity 212, that is, the top cover 107 does not need to be opened. The top cover 107 is directly fixed on the first buoyancy cavity 211 and the second buoyancy cavity 212, so that stability of the solar mechanism 600 is improved, thereby improving a service life of the solar mechanism 600.

A structure of the first buoyancy cavity 211 is at least partially the same as that of the second buoyancy cavity 212. In this embodiment, the structure of the first buoyancy cavity 211 is the same as that of the second buoyancy cavity 212. The first buoyancy cavity 211 may be configured to accommodate liquid and/or gas. The buoyancy cavity 210 may further be, but is not limited to, an inflatable buoyancy cavity, a liquid-containing buoyancy cavity, a partitioned buoyancy cavity, or the like. A volume of the buoyancy cavity 210 may be preset. The buoyancy cavity 210 may be made of a rigid material. The rigid material may include, but is not limited to, glass, ceramics, phenolic plastic, polyurethane plastic, epoxy plastic, unsaturated polyester plastic, and the like. For example, the buoyancy cavity 210 may be of a two-layer structure: an inner layer and an outer layer. The inner layer may be made of a flexible material and is configured to accommodate liquid and/or gas. The outer layer is a rigid protective housing and may be configured to provide protection and stability for the inner layer.

In some embodiments, the adjustment mechanism 200 of the cleaning device 1000 may include a buoyancy adjustment part (not shown). The buoyancy adjustment part may be the buoyancy cavity pump 220. The buoyancy adjustment part may be configured to adjust the volume of gas in the buoyancy cavity 210. The volume of gas/liquid in the buoyancy cavity 210 may be adjusted by the buoyancy adjustment part to change a buoyancy force applied to the cleaning device 1000 in the vertical direction. For example, for the multi-functional cleaning device, poses of the cleaning device 1000 under the water and on the water surface may be switched by adjusting the volume of the gas or the liquid in the buoyancy cavity 210. The buoyancy adjustment part may be various structures that can adjust the volume of the gas or the liquid in the buoyancy cavity 210. The buoyancy cavity pump 220 may be, but is not limited to, a pneumatic pump, a hydraulic pump, an electric pump, or the like. The buoyancy cavity pump 220 may alternatively be a piston assembly provided at the buoyancy cavity 210.

In some embodiments, an auxiliary mounting groove 109 is provided at a front end of the first buoyancy cavity 211. An auxiliary mounting portion 110 is provided in the auxiliary mounting groove 109. The front end and/or a rear end of the first buoyancy cavity 211 are/is provided with an anti-collision groove 213. The anti-collision groove 213 is provided with a first anti-collision part 111. A position of the auxiliary mounting groove 109 and a position of the anti-collision groove 213 may be determined as required. In addition, a propulsion groove 214 is provided at a rear portion of the first buoyancy cavity 211. The propulsion groove 214 is configured to mount the propeller 310.

Figure 39:
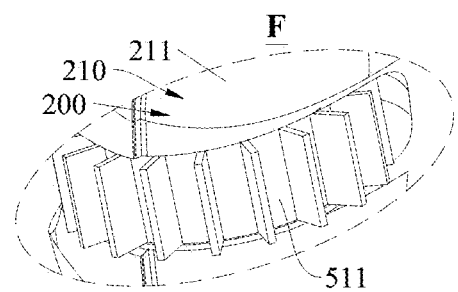
Figure 40:
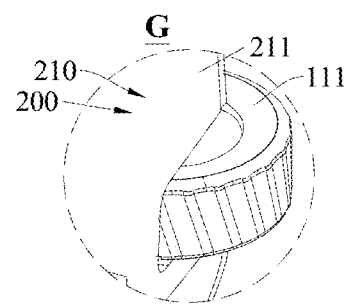

FIG. 38*a* is a schematic structural view of the cleaning device according to a seventh embodiment of the present disclosure. FIG. 39 is a schematic structural view of a portion F shown in FIG. 38*a*. FIG. 40 is a schematic structural view of a portion G shown in FIG. 38*a*. In some embodiments, the cleaning device 1000 includes the first anti-collision part 111. The first anti-collision part 111 is provided at the cleaning device body 100. In addition, the first anti-collision part 111 at least partially protrudes from the contour of the cleaning device body 100. When the cleaning device 1000 collides with the side wall of the pool, an attitude change of the cleaning device 1000 can be reduced by using the first anti-collision part 111, thereby improving operation stability of the cleaning device 1000. In addition, the first anti-collision part 111 plays a cushioning role to reduce damage to the pool caused by the cleaning device 1000 and damage to the cleaning device 1000 caused by colliding with the edge of the pool, thereby improving the service life.

There may be one, two, three, four, or a plurality of first anti-collision parts 111. For example, in this embodiment, there are four first anti-collision parts 111, and the four first anti-collision parts 111 are provided at four corners of the cleaning device body 100 respectively. The four first anti-collision parts 111 may be provided at the front end and/or the rear end of each of the first buoyancy cavity 211 and the second buoyancy cavity 212. A size of the first anti-collision part 111 may be set based on an actual requirement. In this embodiment, the size of the first anti-collision part 111 at the front end of the cleaning device 1000 is larger than the size of the first anti-collision part 111 at the rear end of the cleaning device 1000.

In some embodiments, the first anti-collision part 111 may be rotatably provided at the cleaning device body 100 and play a guiding role. The first anti-collision part 111 includes at least a guiding wheel (not shown) and a guiding shaft (not shown). The guiding shaft passes through and is connected to the guiding wheel. The guiding wheel is rotatably connected to the cleaning device body 100 through the guiding shaft. When the first anti-collision part 111 is provided at the first buoyancy cavity 211, the first buoyancy cavity 211 is recessed to form the anti-collision groove 213, the guiding shaft is rotatably connected to the anti-collision groove 213, and the guiding wheel at least partially protrudes from the first buoyancy cavity 211. Similarly, the second buoyancy cavity 212 may be provided with the above structure of the first buoyancy cavity 211.

The guiding wheel includes a guiding hub and a guiding strip. The guiding shaft passes through and is connected to the guiding hub. The guiding strip encloses a periphery of the guiding hub. The guiding hub is disposed in the cleaning device body 100. The guiding strip at least partially protrudes from the cleaning device body 100. The guiding strip is a flexible strip. The flexible strip may be, but is not limited to, a rubber strip, an elastic cloth strip, or the like.

In some embodiments, the cleaning device 1000 includes at least one distance measurement sensor configured to detect a distance between the cleaning device 1000 and an obstacle for identifying the obstacle. For example, the distance measurement sensor is an ultrasonic sensor or an infrared sensor. As shown in FIG. 38*a*, the cleaning device 1000 includes a plurality of distance measurement sensors, such as at least two overwater sensors 320 and/or at least one underwater sensor 330. When the cleaning device 1000 is located on the water surface, the overwater sensors 320 are located above the water surface, and the underwater sensor 330 is located below the water surface. In some embodiments, the at least two overwater sensors 320 may be disposed symmetrically at the first side portion 1011 of the cleaning device 1000 to detect an object in front of the cleaning device 1000 on the water surface, and the at least one underwater sensor 330 may be disposed at the second side portion 1012 and/or the third side portion 1013 to detect an object on a side of the cleaning device 1000 in the water. The underwater sensor 330 is disposed at the second side portion 1012 and/or the third side portion 1013 to detect a boundary of the to-be-cleaned region when the cleaning device 1000 moves along the edge. In addition, because the underwater sensor 330 can detect a low region in the vertical direction, when the boundary of the to-be-cleaned region has a slope, the underwater sensor 330 is closer to the boundary of the to-be-cleaned region and detects the boundary of the to-be-cleaned region more easily. In some embodiments, a receiving end and a transmitting end of the overwater sensor 320 are separated from each other to expand a range of receiving a signal by the receiving end and a range of transmitting a signal by the transmitting end, so that a problem of a large dead zone of a low-frequency sensor is avoided. A plurality of distance measurement sensors with different orientations are disposed, so that a detection range of the cleaning device 1000 can be improved. Especially, sensors are disposed at the first side portion 1011 and the second side portion 1012 and/or the third side portion 1013 to perform detection in the forward direction of the cleaning device and perform detection on a side of the cleaning device 1000 in the water.

In some embodiments, the cleaning device 1000 includes the first auxiliary cleaning assembly 510 and the first anti-collision part 111. When the first auxiliary cleaning assembly 510 and the first anti-collision part 111 are provided at the front portion of the cleaning device body 100, the first auxiliary cleaning assembly 510 may be located above the first anti-collision part 111, or the first auxiliary cleaning assembly 510 may be located below the first anti-collision part 111. In other words, the first auxiliary cleaning assembly 510 and the first anti-collision part 111 may be arranged substantially parallel to each other or arranged substantially vertically. Substantially parallel arrangement or substantially vertical arrangement indicates that in the height direction of the cleaning device 1000, a projection range of the first auxiliary cleaning assembly 510 at least partially overlaps with a projection range of the first anti-collision part 111. A position relationship between the first auxiliary cleaning assembly 510 and the first anti-collision part 111 may be set as required.

Specifically, the side brush 511 and the first anti-collision part 111 both at least partially protrude from the outer contour of the cleaning device body 100. On a projection plane substantially parallel to the reference plane 1, an area of the side brush 511 protruding from the outer contour of the cleaning device body 100 is larger than an area of the first anti-collision part 111 protruding from the outer contour of the cleaning device body 100. In other words, a distance over which the side brush 511 protrudes from the cleaning device body 100 is larger than a distance over which the guiding wheel protrudes from the cleaning device body 100.

In an embodiment, on the projection plane substantially parallel to the reference plane 1, a projection boundary of the guiding wheel is at least partially located between a projection boundary of the hub 513 of the side brush 511 and a projection boundary of the cleaning portion 5111, or the projection boundary of the guiding wheel is at least partially located within the projection boundary of the side brush 511, that is, when the cleaning device 1000 is in contact with an obstacle, the side brush 511 is first in contact with the obstacle and is deformed, and then the guiding wheel is in contact with the obstacle. In this way, the cleaning portion 5111 of the side brush 511 can effectively clean the wall of the pool, and when the cleaning device 1000 is too close to the wall of the pool, the guiding wheel can also play an anti-collision role.

In some embodiments, in a same radial direction, a difference between a tangent length of the side brush 511 at least partially protruding from the outer contour of the cleaning device body 100 and a tangent length of the first anti-collision part 111 at least partially protruding from the outer contour of the cleaning device body 100 is a tangent difference. The tangent difference is greater than 0 and less than or equal to 3 mm. The range of the tangent difference is limited, so that the side brush 511 can operate normally, that is, clean a region such as the side wall or a corner of the pool. In addition, the first anti-collision part 111 can play a cushioning role to reduce an attitude change of the cleaning device. The tangent difference may be, but is not limited to, 0.5 mm, 0.9 mm, 1 mm, 1.5 mm, 1.9 mm, 2.5 mm, 3 mm, or the like. During an actual process, when the tangent difference is too large, and the side brush drive motor is the stepper motor, the side brush 511 is squeezed to the side wall of the pool, and the first anti-collision part 111 is not in contact with the side wall of the pool. In this case, the stepper motor may generate abnormal noise. Therefore, the tangent difference cannot be too large. In other words, the tangent difference may be set based on an actual requirement. In different radial directions, the tangent differences may be equal or unequal.

FIG. 38*b* is a schematic structural view of the cleaning device according to an eighth embodiment of the present disclosure. Refer to FIG. 38*b*. In this embodiment, there are six first anti-collision parts 111, and the six first anti-collision parts 111 are respectively provided at four corners of the cleaning device body 100, the second side portion 1012, and the third side portion 1013. A size of the first anti-collision part 111 may be determined as required. In this embodiment, the size of the first anti-collision part 111 at the front end of the cleaning device 1000 is larger than the size of the first anti-collision part 111 at another position on the cleaning device 1000. A distance over which the first anti-collision part 111 protrudes from the cleaning device body 100 may be determined as required. In this embodiment, a protruding distance of the first anti-collision part 111 at the front end of the cleaning device 1000 is larger than that of the first anti-collision part 111 at another position on the cleaning device 1000. A manner in which the first anti-collision part 111 protrudes from the cleaning device body 100 may be that the cleaning device body 100 is provided with an extension mechanism 113. A first end of the extension mechanism 113 is provided on the cleaning device body 100, a second end of the extension mechanism 113 protrudes from the contour of the cleaning device body 100, and the first anti-collision part 111 may be rotatably provided at the second end of the extension mechanism 113, so that the distance over which the first anti-collision part 111 protrudes from the cleaning device body 100 is increased. In this way, an anti-collision range of the first anti-collision part 111 is increased.

In some embodiments, the cleaning device 1000 includes a second anti-collision part 112. A part of the cleaning device body 100 is exposed on the water surface when the cleaning device body 100 moves on the water surface, and the second anti-collision part 112 may be provided at the part, such as a most protruding part of the front portion and/or the rear portion of the outer contour of the cleaning device body 100, where the outer contour is exposed on the water surface. If the cleaning device 1000 includes the first auxiliary cleaning assembly 510 and the second anti-collision part 112, one part of the first auxiliary cleaning assembly 510 is located on the water surface, and the other part of the first auxiliary cleaning assembly 510 is located below the water surface, the second anti-collision part 112 may be disposed at a most protruding part of the outer contour of the cleaning device body 100, where the most protruding part is located higher than the first auxiliary cleaning assembly 510. The second anti-collision part 112 may be an anti-collision block made of a cushioning material. This is not limited herein. When the cleaning device 1000 collides during moving on the water surface, the second anti-collision part 112 can play a cushioning role, to reduce the damage to the pool caused by the cleaning device 1000 and the damage to the cleaning device 1000 caused by collision, thereby improving the service life.

In some embodiments, as shown in FIG. 1, the cleaning device 1000 includes a third anti-collision part 114. The third anti-collision part 114 is provided on a side portion of the cleaning device 1000, such as the second side portion 1012 and/or the third side portion 1013, to play a cushioning role for the side portion. This reduces the damage to the pool caused by the cleaning device 1000 and the damage to the cleaning device 1000 caused by collision, thereby improving the service life. The third anti-collision part 114 may be, but is not limited to, a rubber strip.

In some embodiments, the drive box 130 is provided with a vibrator (not shown). Because the drive box 130 is a sealed cavity, the vibrator may transmit sound in the sealed cavity to the outside of the cleaning device 1000, to remind the user to perform a relevant operation.

Figure 50A:
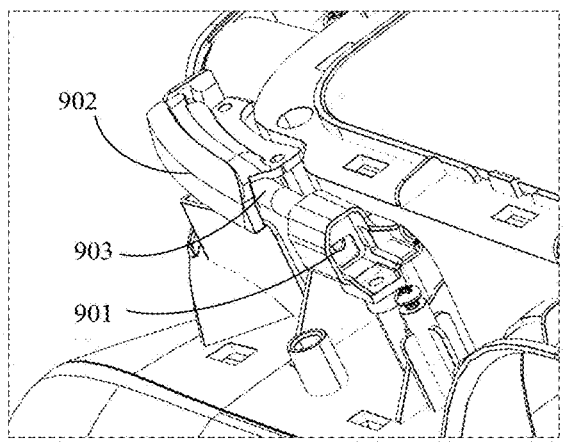
FIG. 50a is a partial structural view of a cleaning device according to an embodiment of the present disclosure.
Figure 50B:
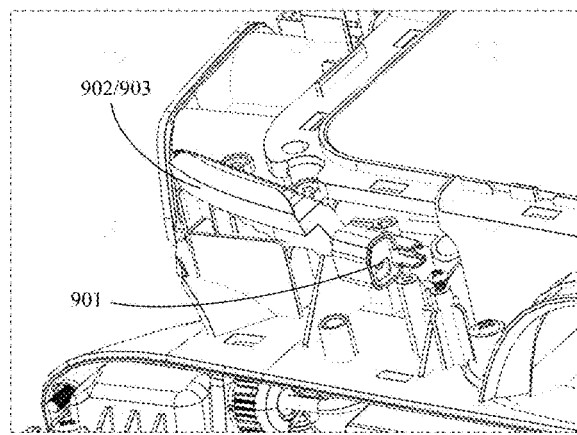
FIG. 50b is a partial structural view of a cleaning device according to an embodiment of the present disclosure.

In some embodiments, FIG. 50*a* is a partial structural view of the cleaning device according to an embodiment of the present disclosure, and FIG. 50*b* is a partial structural view of the cleaning device according to an embodiment of the present disclosure. Refer to FIG. 38*b*. The cleaning device 1000 includes a light-emitting structure 900. The light-emitting structure 900 may indicate a current state (for example, a current operation state, a fault state, network configuration, and a battery level) of the cleaning device 1000. In addition, in low visibility, visibility of the cleaning device 1000 can be improved by using the light-emitting structure 900. A quantity of light-emitting structures 900 and a position of the light-emitting structure 900 may be determined based on an actual requirement. In an embodiment, the light-emitting structure 900 may be disposed at any position on the first side portion 1011, for example, an edge of the front portion of the cleaning device body 100 or a middle position on the front portion. In another embodiment, the light-emitting structure 900 may be disposed at an intersection point between the first side portion 1011 of the cleaning device body 100 and the top of the cleaning device body 100. In an embodiment, the cleaning device 1000 may be provided with only one light-emitting structure 900, or one light-emitting structure 900 may be disposed at each of different positions (for example, on two sides of the first side portion 1011, or on the second side portion 1012 and the third side portion 1013).

In an embodiment, the light-emitting structure 900 includes at least one light-emitting part 901. The light-emitting part 901 may emit light constantly or flicker. The emitted light may be in a single color or a plurality of colors. For example, the light-emitting part 901 may emit light of different colors based on a current state of the cleaning device 1000. The light-emitting part 901 may be, but is not limited to, an LED light.

In an embodiment, the light-emitting structure 900 further includes at least one light transmission part 902. The light transmission part 902 may be disposed on a surface of the cleaning device body 100 and configured to transmit, to the outside of the cleaning device body 100, the light emitted by the light-emitting part 901. The light transmission part 902 may be made of glass, plastic, or other materials having light transmission performance. The light transmission part 902 is disposed, so that the light-emitting structure 900 can be disposed inside the cleaning device body 100, to prevent the light-emitting structure 900 from being exposed to an external environment. When the cleaning device 1000 operates in a pool or another humid environment, the light transmission part 902 is disposed, so that the following case can be effectively avoided: The light-emitting structure 900 is damaged because water enters the light-emitting structure 900 or the light-emitting structure 900 is hit. This extends a service life of the light-emitting structure 900.

In one embodiment, the light-emitting structure 900 further includes a light guiding part 903. The light guiding part 903 is configured to guide, to a position at which the light transmission part 902 is located, the light emitted by the light-emitting part 901. Specifically, the light-emitting part 901 is connected to at least one end of the light guiding part 903. When the light-emitting part 901 emits light, the emitted light may be guided by the light guiding part 903 to a position at which the light guiding part 903 is located. If the light transmission part 902 is disposed at the light guiding part 903, the light guided by the light guiding part 903 may be transmitted through the light transmission part 902 to the outside of the cleaning device body 100. In this case, the light-emitting part 901 and the light transmission part 902 may be disposed in a staggered manner to prevent the light-emitting part 901 from being directly placed at the light transmission part 902. Based on the above disposition, the light-emitting part 901 can be sealed inside the cleaning device body 100 to prevent the light-emitting part 901 from being damaged due to being in contact with water. This improves operation stability of the light-emitting structure 900. In addition, the light guiding part 903 may be in different shapes and of different lengths, so that a light-emitting range of the light-emitting part 901 can be expanded. This optimizes a light emitting effect. The light guiding part 903 may be made of any light guiding material such as optical glass, an optical crystal, or optical plastic.

Refer to FIG. 50*b*. In some specific embodiments, the light transmission part 902 and the light guiding part 903 are integral structure, or a part of the light guiding part 903 is located on the surface of the cleaning device body 100, and another part is located inside the cleaning device body 100, so that the light guiding part 903 can both guide light and transmit light. Based on the above disposition, a gap between the light transmission part 902 and the light guiding part 903 is avoided, so that the following case can be avoided: Mist is formed due to interaction between heat generated when the light-emitting part 901 emits light or heat inside the cleaning device body 100 and water entering the cleaning device body 100, causing the mist to exist between the light transmission part 902 and the light-emitting part 901. This avoids affecting an effect that the light passes through the light transmission part 902. In addition, because the mist and water drops into which the mist condenses on the light transmission part 902 are usually located inside the cleaning device body 100, it is difficult for the user to remove the mist and the water drops from the outside of the cleaning device body 100. Based on the above disposition, impact on user experience is avoided. In some specific embodiments, the light guiding part 903 may be provided with a refraction structure, such as a sawtooth structure, to improve a light guiding effect. In this way, the light can be effectively guided to a specified position.

Figure 41A:
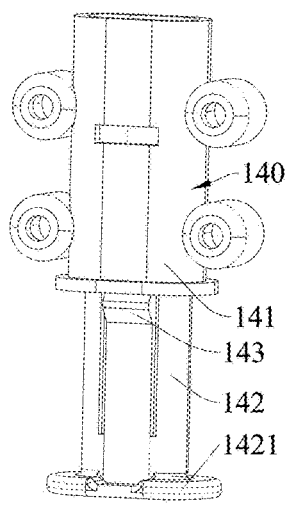
FIG. 41a is a schematic structural view of an anti-stranding assembly of a cleaning device according to a first embodiment of the present disclosure.

FIG. 41*a* is a schematic structural view of an anti-stranding assembly of the cleaning device according to the first embodiment of the present disclosure. In some embodiments, the cleaning device 1000 includes an anti-stranding assembly 140. The anti-stranding assembly 140 is provided at the bottom of the cleaning device body 100. The anti-stranding assembly 140 has a first state and a second state. When the anti-stranding assembly 140 is in the first state, the anti-stranding assembly 140 is in an open state relative to the cleaning device body 100, and interference occurs between the anti-stranding assembly 140 and a step in the pool and other structures to prevent the cleaning device 1000 from rushing to a shallow water region or going ashore. In this way, the anti-stranding assembly 140 plays an anti-stranding role. When the anti-stranding assembly 140 is in the second state, the anti-stranding assembly 140 is in a closed state relative to the cleaning device body 100, and the anti-stranding assembly 140 is stored.

The anti-stranding assembly 140 may be telescopically connected to the bottom of the cleaning device body 100. When the anti-stranding assembly 140 is in the first state, the anti-stranding assembly 140 extends out of the bottom of the cleaning device body 100, and when the anti-stranding assembly 140 is in the second state, the anti-stranding assembly 140 is retracted into the bottom of the cleaning device body 100. Alternatively, when the anti-stranding assembly 140 is in the first state, the anti-stranding assembly 140 is unfolded and extends out of the bottom of the cleaning device body 100, and when the anti-stranding assembly 140 is in the second state, the anti-stranding assembly 140 is folded and stored at the bottom of the cleaning device body 100. In this way, the anti-stranding function of the cleaning device 1000 is implemented. The anti-stranding assembly 140 is provided at a position on the bottom of the cleaning device body 100, and the position is close to a front end of the cleaning device body 100. The anti-stranding assembly 140 may alternatively be provided at four corners at the bottom of the cleaning device body 1000.

In an embodiment, the anti-stranding assembly 140 may include an anti-stranding housing 141, an anti-stranding part 142, and a pressed elastic portion 143. The anti-stranding housing 141 is provided in the front end of the cleaning device body 100, and the front end is close to the bottom of the cleaning device body 100. The anti-stranding part 142 may be pulled out from the anti-stranding housing 141 and may extend out of or be retracted into the anti-stranding housing 141. The pressed elastic portion 143 may be elastically provided at an outer side portion of the anti-stranding part 142. When the anti-stranding assembly 140 needs to be used, an external force is applied to the anti-stranding part 142, and the anti-stranding part 142 and the pressed elastic portion 143 both extend out of the cleaning device body 100. In this case, the pressed elastic portion 143 is clamped at the bottom of the front end of the cleaning device body 100 to lock the anti-stranding part 142. When the anti-stranding assembly 140 does not need to be used, the pressed elastic portion 143 is compressed, and the anti-stranding part 142 extends into the anti-stranding housing 141. In this case, the anti-stranding part 142 is retracted into the cleaning device body 100.

Furthermore, an end of the anti-stranding part 142 is provided with a manual portion 1421. When the anti-stranding assembly 140 needs to be used, the anti-stranding part 142 can conveniently extend out of the cleaning device body 100 through the manual portion 1421. When the anti-stranding assembly 140 does not need to be used, the anti-stranding part 142 is retracted into the anti-stranding housing 141, and the manual portion 1421 can prevent the anti-stranding part 142 from fully retracting into the cleaning device body 100, thereby improving usage experience.

During an actual process, the anti-stranding assembly 140 may include the anti-stranding housing 141, the anti-stranding part 142, and an anti-stranding drive assembly. The anti-stranding drive assembly is connected to the anti-stranding part 142 and is configured to automatically drive the anti-stranding part 142 to extend out of or retract into the cleaning device body 100. The anti-stranding drive assembly may include, but is not limited to, a drive motor and the like.

Figure 41B:
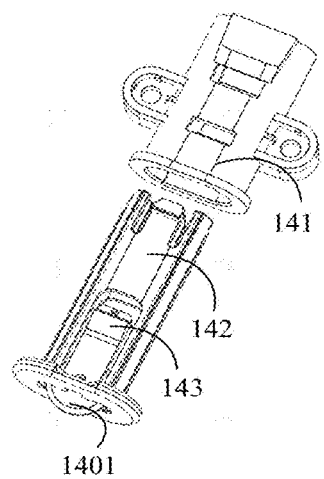
FIG. 41b is an exploded view of an anti-stranding assembly of a cleaning device according to a first embodiment of the present disclosure.

In some embodiments, the anti-stranding assembly 140 may include an anti-stranding wheel 1401. FIG. 41b is an exploded view of the anti-stranding assembly of the cleaning device according to the first embodiment of the present disclosure. The anti-stranding wheel 1401 may be rotatably provided at the bottom of the anti-stranding assembly 140 or may be, but is not limited to, provided at the bottom of the anti-stranding part 142. When the anti-stranding assembly 140 is in the first state and/or the second state, the anti-stranding wheel 1401 may protrude from an outer contour of the anti-stranding assembly 140. For example, when the anti-stranding assembly 140 extends out of the bottom of the cleaning device body 100, the anti-stranding wheel 1401 protrudes from the outer contour of the anti-stranding assembly 140. When the anti-stranding assembly 140 is retracted into the cleaning device body 100, the anti-stranding wheel 1401 is also retracted into the outer contour of the anti-stranding assembly 140. Alternatively, regardless of whether the anti-stranding assembly 140 is retracted into the cleaning device body 100, the anti-stranding wheel 1401 always protrudes from the outer contour of the anti-stranding assembly 140. This is not limited herein. The anti-stranding wheel 1401 is provided, so that the cleaning device body 100 can move forward, backward, leftward, and rightward to escape from the trap when the cleaning device body 100 is stranded, thereby improving a capability of escaping from the trap.

The third embodiment of the present disclosure further provides a control method for the cleaning device. The control method is used to control the cleaning device 1000. Specifically, the control method may include the following steps. Step S900: Detect that the cleaning device currently meets a triggering condition for a telescopic movement.

In some embodiments, the triggering condition for the telescopic movement includes at least one of the following conditions. The first triggering condition for the telescopic movement is that a distance between the cleaning device 1000 and a target object is within a preset distance range. The target object includes at least one of a wall and an obstacle. The second triggering condition for the telescopic movement is that the cleaning device 1000 is in a trapped state. A condition in which it is detected that the cleaning device 1000 is in the trapped state may include, but is not limited to, the following conditions. First, a second trigger sensor of the cleaning device 1000 collects second sensing data, and it is determined that there is a preset deviation between an actual rotation angle of the cleaning device 1000 and a preset rotation angle of the cleaning device 1000. Then, it is detected that the cleaning device 1000 does not move for a target distance after moving for a first time. Further, it is detected that a difference between a position of the cleaning device 10 relative to a reference point before a second time and a position of the cleaning device 10 relative to the reference point after the second time is within a preset difference range. The reference point is determined by using a third trigger sensor. Finally, a current of the drive motor of the cleaning device 1000 increases, and a current increase meets a current change for a trapped situation. The third triggering condition for the telescopic movement is that the cleaning device 1000 receives a preset instruction. The fourth triggering condition for the telescopic movement is that the cleaning device 1000 is in a preset operation mode. The preset operation mode includes at least one of an energy-saving mode, a return mode, and a charging mode. The return mode indicates that a cleaning operation has been completed and the cleaning device 1000 is in a returning process. It may be understood that the preset operation mode may further include a trap escaping mode and the like other than the above operation modes. This is not limited herein.

Step S901: Control the first auxiliary cleaning assembly of the cleaning device 1000 to move telescopically. The telescopic movement includes at least one of an extension movement along a direction away from the cleaning device body 100 of the cleaning device 1000 and a retraction movement along a direction close to the cleaning device body 100 of the cleaning device 1000.

The first auxiliary cleaning assembly 510 of the cleaning device 1000 provided in the present disclosure may rotate around its own axis, move telescopically, and rotate. In other words, the first auxiliary cleaning assembly 510 can move flexibly. This can expand a range of single cleaning of the cleaning device 1000 during cleaning and reduce a cleaning path of the cleaning device 1000. Therefore, the cleaning efficiency is improved. In addition, when the cleaning device 10 is trapped during cleaning the pool, the first auxiliary cleaning assembly 510 can move flexibly to escape from the trap. A range occupied by the cleaning device 1000 is reduced, so that the cleaning device 1000 escapes from the trap.

In some embodiments, the cleaning device 1000 includes a main circuit board (not shown). The main circuit board is provided with an inertial measurement mounting portion (not shown). The inertial measurement mounting portion is configured to mount an inertial measurement unit (not shown). The inertial measurement unit is configured to measure action information of the cleaning device 1000. The action information may include, but is not limited to, an acceleration, angular displacement, and the like. During a process of designing a layout of the printed circuit board, namely, the PCB layout design, a periphery of the inertial measurement mounting portion is hollowed, and the inertial measurement unit is mounted at a hollowed edge of the inertial measurement mounting portion, to resolve a problem of zero drift of the inertial measurement unit caused by deformation of the main circuit board.

In some embodiments, the cleaning device 1000 may be, but is not limited to, recalled in a one-button manner by using an electronic device such as a mobile phone, or a remote control. In an embodiment, the cleaning device 1000 includes a communication assembly, such as a Wi-Fi communication assembly (not shown) and a Bluetooth assembly (not shown). The Wi-Fi communication assembly has a hot spot function, so that the hot spot function is enabled to call the cleaning device 1000. The electronic device is connected to the Wi-Fi communication assembly and the Bluetooth assembly. The electronic device is connected to the Wi-Fi communication assembly, that is, an APP on the electronic device APP is configured to be connected to the Wi-Fi communication assembly, and then the cleaning device 1000 is configured to be connected to a Wi-Fi router. When the cleaning device 1000 needs to be recalled, a recall button of the APP on the electronic device is directly tapped. When the cleaning device 1000 receives the above instruction, the cleaning device 1000 may automatically dock at an edge of the pool. In other embodiments, the cleaning device 1000 may alternatively be controlled remotely through a remote control.

In some embodiments, the communication assembly is located on an upper side of the first buoyancy cavity 211 or at any position located on an upper side of the second buoyancy cavity 211, where the position is close to the top of the cleaning device body 100, so that when the cleaning device 1000 is located on the water surface, the communication assembly is located above the liquid surface. This facilitates establishment of a communication connection between the communication assembly and the electronic device. The communication assembly may alternatively be disposed in the drive box 130 or another confined space, and an antenna connected to the communication assembly may be disposed adjacent to or at the top of the cleaning device body 100, so that when the cleaning device 1000 is located on the water surface, the antenna is located above the liquid level. In this way, the communication assembly can transmit and receive data through the antenna, and a communication connection is established between the communication assembly with a communication device. A control system may be disposed in the drive box 130, and the interior of the drive box 130 is a closed or sealed area. The control system is disposed in the drive box 130, to prevent water from entering the control system, so that problems, such as a short circuit and damage to an electronic component of the control system, can be avoided.

The present disclosure further provides a control method for a cleaning device. The cleaning device 1000 further includes a current collection module and an energy storage mechanism. The energy storage mechanism may be the battery pack and/or the electrical component described above. The control method for the cleaning device includes the following steps. Step S910: Control the moving mechanism to move along a zigzag route and obtain a present charging current of the solar mechanism. The moving mechanism 300 is configured to drive the cleaning device body 100 to move. The moving mechanism 300 moves in the pool along the zigzag route, and the solar mechanism 600 of the cleaning device 1000 is at least partially located on the water surface. A speed of finding an optimal energy supplement point can be improved based on the zigzag route, and an operation manner is flexible and reliable. The current collection module obtains the present charging current of the solar mechanism 600 in real time. Step S911: In a case where the present charging current is greater than or equal to a first target charging current, control the moving mechanism to stop moving and control the solar mechanism to charge the energy storage mechanism. The first target charging current is a preset value, which may be determined based on an actual requirement. For example, when the first target charging current is 1 A, the present charging current is greater than or equal to 1 A. The first target charging current may be a first target charging current threshold. The present charging current is equal to or greater than the first target charging current threshold, all of which meet requirements. When the present charging current is greater than or equal to the first target charging current, the present charging current meets a charging requirement, the moving mechanism stops moving, and the solar mechanism is controlled to charge the energy storage mechanism, so that energy is supplemented to the cleaning device at a position at which the present charging current meets the requirement. The moving mechanism is controlled to move along the zigzag route, and when the present charging current of the solar mechanism is greater than or equal to the first target charging current, the cleaning device stops moving, and the solar mechanism is controlled to charge the energy storage mechanism, so that a speed at which the cleaning device finds the optimal energy supplement point can be improved. In this way, the cleaning device is charged.

The control method for the cleaning device further includes the following step S912. Step S912: In a case where the present charging current is less than the first target charging current, cyclically perform the following sub-steps until the moving mechanism has traversed a target detection region, or charging is performed. The target detection region may be a partial or entire region of the pool. When the present charging current is less than the first target charging current, the present charging current cannot meet the charging requirement. In this case, the following sub-steps, such as step S9120, step S9121, step S9122, and step S9123, or step S9124, step S9125, step S9126, and step S9127, are cyclically performed until the optimal energy supplement point is found to charge the cleaning device. Alternatively, the above sub-steps are cyclically performed until the moving mechanism has traversed the target detection region, and the optimal energy supplement point has not been found.

Step S912 includes the following sub-steps. Step S9120: Control the moving mechanism to continue to move and count movement duration of the continued movement. The movement duration is duration for which the moving mechanism drives the cleaning device to move. When the present charging current is less than the first target charging current, the movement duration of the cleaning device is counted. Step S9121: In a case where the movement duration corresponding to the present movement reaches a duration threshold, obtain the present charging current of the solar mechanism. The duration threshold is a preset value, which may be determined based on an actual requirement. For example, the duration threshold may be 5 minutes, that is, the movement duration of the cleaning device is 5 minutes. Within the duration threshold, the present charging current of the solar mechanism is obtained in real time. Step S9122: In a case where the present charging current is greater than or equal to a second target charging current after the movement duration, control the moving mechanism to stop moving and control the solar mechanism to charge the energy storage mechanism. The second target charging current is a preset value, which may be determined based on an actual requirement. The second target charging current is less than the first target charging current. When the present charging current within the duration threshold is greater than or equal to the second target charging current, the present charging current meets the charging requirement, the moving mechanism stops moving, and the solar mechanism is controlled to charge the energy storage mechanism, so that energy is supplemented to the cleaning device at a position at which the present charging current meets the requirement. Step S9123: In a case where the present charging current is less than the second target charging current after the movement duration, control the moving mechanism to continue to move. When the present charging current within the duration threshold is less than the second target charging current, the present charging current cannot meet the charging requirement, and the moving mechanism continues to move to find the optimal energy supplement point. The first target charging current corresponding to a previous movement is greater than the second target charging current corresponding to the present movement. For example, in a case where the moving mechanism moves for a first time, and the first target charging current is 2 A, when the obtained present charging current of the solar mechanism is greater than or equal to 2 A, the cleaning device is charged for supplementing energy. When the present charging current is less than 2 A, the moving mechanism continues to perform the present movement, and the duration threshold is 5 minutes. In this case, the second target charging current is 1.5 A. When the obtained present charging current of the solar mechanism is greater than or equal to 1.5 A, the cleaning device is charged for supplementing energy. When the present charging current is less than 1.5 A, the moving mechanism continues to move for a next time, and a third target charging current is determined to be 1 A. The foregoing operations are repeated until the moving mechanism has traversed the target detection region or the energy supplement point is found to perform charging. In this way, the sub-steps are performed cyclically, and the target charging current is gradually decreased, to find the optimal energy supplement point, thereby improving the charging efficiency of the cleaning device.

Step S912 may further include the following sub-steps. Step S9124: Control the moving mechanism to continue to move until the moving mechanism has traversed the target detection region, and count a plurality of charging currents of the solar mechanism at various positions in a present movement route. Step S9125: In a case where the plurality of charging currents are all less than the first target charging current, determine a maximum charging current in the plurality of charging currents. Step S9126: Control the moving mechanism to move in the target detection region again and obtain the second present charging current of the solar mechanism. The second present charging current is a present charging current obtained when the moving mechanism moves in the target detection region again. Step S9127: In a case where the second present charging current is greater than or equal to the maximum charging current, control the moving mechanism to stop moving and control the solar mechanism to charge the energy storage mechanism. For example, in a case where the first target charging current is 1 A, if the charging currents are all less than 1 A until the moving mechanism has traversed the target detection region, the maximum charging current in the plurality of charging currents, for example, 0.9 A, is determined. The moving mechanism is controlled to move in the target detection region again. When the moving mechanism moves to a position at which the second present charging current is greater than or equal to 0.9 A, the moving mechanism is controlled to stop moving, and the solar mechanism is controlled to charge the energy storage mechanism. The above sub-steps are performed, so that when the present charging current cannot meet the target charging current, the optimal energy supplement point is found in the target detection region, thereby improving the charging efficiency of the cleaning device.

The present disclosure further provides a control method for a cleaning device. The cleaning device 1000 further includes a current collection module and an energy storage mechanism. The energy storage mechanism may be the battery pack and/or the electrical component. The control method for the cleaning device includes the following steps. Step S920: Control the moving mechanism to move along a zigzag route and obtain a plurality of charging currents of the solar mechanism at various positions in a moving route respectively. The moving mechanism 300 is configured to drive the cleaning device body 100 to move. The moving mechanism 300 moves in the pool along the zigzag route, and the solar mechanism 600 of the cleaning device 1000 is at least partially located on the water surface. A movement speed of finding an optimal energy supplement point can be increased based on the zigzag route, and an operation mode is flexible and reliable. The current collection module obtains the plurality of charging currents at the various positions of the solar mechanism along the moving route. Step S921: Count a quantity of charging currents that are greater than a first target charging current. The first target charging current is a preset value, which may be determined based on an actual requirement. For example, when the first target charging current is 1 A, a quantity of positions at which the charging current is greater than or equal to 1 A is counted. Step S922: In a case where the quantity is greater than or equal to a quantity threshold, control the moving mechanism stop moving and control the solar mechanism to charge the energy storage mechanism. The quantity threshold is a proportion of a total quantity. The quantity threshold is a preset value, which may be determined based on an actual requirement. For example, the quantity threshold is 20% of the total quantity. The total quantity is a sum of data statistics for the plurality of charging currents of the moving mechanism at various positions along the moving route. When the quantity is greater than or equal to the quantity threshold, the charging current meets the charging requirement, the moving mechanism stops moving, and the solar mechanism is controlled to charge the energy storage mechanism, so that energy is supplemented to the cleaning device at the position at which the present charging current meets the requirement. Step S923: In a case where the quantity is less than the quantity threshold, control the moving mechanism to be in a standby state in situ for preset duration, control the moving mechanism to move along the zigzag route, and obtain the plurality of charging currents of the solar mechanism at the various positions along the moving route. When the quantity is less than the quantity threshold, it is determined that there is insufficient sunlight, and the charging current cannot meet the charging requirement. The moving mechanism stops moving, and the cleaning device is controlled to be in the standby state in situ. The preset duration is duration during which the cleaning device is in the standby state in situ. After the preset duration meets the requirement, the moving mechanism continues to move along the zigzag route, and the above steps are performed. It should be noted that the above quantity may alternatively be an area of the target detection region. The quantity threshold may alternatively be an area proportion of the target detection region. The quantity of charging currents, of the solar mechanism at the various positions along the moving route, greater than the first target charging current is counted, and whether the quantity is greater than the quantity threshold is determined to find the optimal energy supplement point, thereby improving efficiency of the cleaning device in finding the optimal energy supplement point for charging.

The present disclosure further provides a method for preventing a cleaning device from being trapped. The method for preventing the cleaning device from being trapped includes the following steps. Step S930: Obtain a present angle of the cleaning device. The present angle of the cleaning device may be measured through the inertial measurement unit. Step S931: Obtain an angle difference between the present angle of the cleaning device and a target angle of the cleaning device. The target angle of the cleaning device is a preset value, which may be determined based on different operation conditions of the cleaning device. Step S932: In a case where the angle difference is greater than a preset angle difference, the cleaning device is in a trapped state. The preset angle difference is a preset value. The angle difference is compared with the preset angle difference to determine whether the cleaning device is in the trapped state. Step S933: Control the cleaning device to move backward and turn around to escape from the trap. After the cleaning device is in the trapped state, the cleaning device may automatically move backward and turn around to escape from the trap. The cleaning device may move backward and turn around to escape from the trap through a propeller and the like. The angle difference and the preset angle difference are compared, so that whether the cleaning device is in the trapped state can be determined, and the cleaning device can move backward and turn around to escape from the trap. Based on the above method, a capability of the cleaning device to escape from the trap can be improved.

The present disclosure further provides a method for preventing a cleaning device from being trapped, applied to a situation in which both the front side and the rear side of the cleaning device are close to an obstacle, and therefore, the cleaning device cannot directly rotate in situ to escape from the trap. The method for preventing the cleaning device from being trapped includes the following steps, and a case where the cleaning device moves to the left to escape from the trap is taken as an example. Step S1030: Control the cleaning device to move backward until the rear side of the cleaning device abuts against the obstacle. Duration for which the rear side of the cleaning device abuts against the obstacle may last for preset duration, so that the rear side of the cleaning device can be more fully in contact with the obstacle. This is not limited herein. Step S1031: Control the cleaning device to rotate to the left. If a moving mechanism is provided at each of two sides of the cleaning device, a propulsion force provided by the right moving mechanism of the cleaning device may be greater than a propulsion force provided by the left moving mechanism of the cleaning device, to improve efficiency of the cleaning device in rotating to the left. Duration for which the cleaning device rotates to the left is controlled to last for the preset duration to maximize a leftward rotation angle of the cleaning device. This is not limited herein. Step S1032: Control the cleaning device to move forward and/or rotate until the front side of the cleaning device abuts against the obstacle. After each time step S1030, step S1031, and step S1032 are performed, the cleaning device may be controlled to rotate in situ to determine whether the cleaning device escapes from the trap. If the cleaning device can rotate in situ, an operation of escaping from the trap may be performed. If the cleaning device cannot rotate in situ, step S1030 to step S1032 may be performed cyclically until the cleaning device escapes from the trap.

In an embodiment, a direction of escaping from the trap may be determined based on a distance between the cleaning device and the obstacle. For example, the sensor provided at the cleaning device, such as a distance measurement sensor at the right side of the cleaning device, measures that the distance between the right side of the cleaning device and the obstacle is less than a preset distance, such as 40 cm. In this case, the cleaning device preferentially moves to the left to escape from the trap. Otherwise, the cleaning device preferentially moves to the right to escape from the trap. In this way, the capability of the cleaning device to escape from the trap can be improved. In another embodiment, if the cleaning device includes a side brush, the side brush is controlled to rotate in the direction of escaping from the trap during a process in which the cleaning device escapes from the trap. In this way, when the side brush also abuts against the obstacle, the side brush rotates to assist the cleaning device in improving a rotation capability, so that the capability of the cleaning device to escape from the trap can be improved.

The present disclosure further provides a method for automatically charging a cleaning device. The method for automatically charging the cleaning device includes the following steps. Step S940: Detect a present charging current at a target pool wall of a target region in real time. The target region may be, but is not limited to, a swimming pool, a pool, and the like. Step S941: Determine whether the present charging current is a target charging current. The target charging current is a charging current at a wireless charging station. Step S942: If the present charging current is the target charging current, perform a charging action. When the present charging current is the target charging current at the wireless charging station, the wireless charging interface of the cleaning device is connected to the wireless charging connector of the wireless charging station for wireless charging. When the solar panel does not meet the charging requirement, the wireless charging interface may be configured to charge the cleaning device on a rainy day, to meet a requirement for cleaning the pool on the rainy day. In this way, whether the present charging current at the target pool wall of the target region is the target charging current is detected in real time. If the present charging current is the target charging current, the wireless charging requirement is met. Step S942 further includes step S9421. Step S9421: Performing the charging action includes performing alignment through the automatic alignment assembly and performing charging. The wireless charging interface is aligned with the wireless charging connector through the automatic alignment assembly, to improve accuracy of automatically aligning the wireless charging interface with the wireless charging connector for performing charging. The automatic alignment assembly may be a magnetic attraction automatic alignment assembly. When the cleaning device is charged at the wireless charging station, the magnetic attraction automatic alignment assembly is configured to automatically align the wireless charging interface with the wireless charging connector.

The present disclosure further provides a method for preventing a cleaning device from regurgitating debris. The method for preventing the cleaning device from regurgitating debris includes the following steps. Step S950: Detect a current edge distance between the cleaning device and a side wall of a target region. The cleaning device is provided with an edge sensor. When the cleaning device is located at an edge, the edge sensor may detect a distance between the cleaning device and the side wall of the target region in real time. The edge sensor may be, but is not limited to, an ultrasonic sensor, an infrared sensor, a lidar sensor, a TOF sensor, or the like. Step S951: When the current edge distance is less than a preset edge distance, control a movement speed of the cleaning device. The preset edge distance is a preset value. When the current edge distance is less than or equal to the preset edge distance, the speed of the cleaning device is controlled to gradually decrease or directly decrease to 0, to slow down the cleaning device. Step S952: Control the cleaning device to rotate along a first rotation direction, control a side, of the cleaning device, close to a rotation radius to move backward at a first rotation speed, and control a side, of the cleaning device, away from the rotation radius to move forward at a second rotation speed. The first rotation speed is greater than the second rotation speed. The cleaning device has two sides along the forward direction, and each of the two sides is provided with a first propeller. When two first propellers move in opposite directions, the cleaning device may be driven to make a turn. For example, when the first rotation direction is a leftward rotation direction, and the cleaning device moves to a target side wall in front of the cleaning device, the left first propeller rotates in a reverse direction, and the cleaning device moves backward. At the same time, the left first propeller moves at the first rotation speed. The right first propeller rotates in a forward direction, and the cleaning device moves forward. At the same time, the right first propeller moves at the second rotation speed. In this case, the first rotation speed of the left first propeller is less than the second rotation speed of the right first propeller. The cleaning device rotates to the left by limiting rotation of the two first propellers in different directions and at different rotation speeds. During a process in which the cleaning device rotates to the left, a right front side of the cleaning device is close to the side wall of the target region to gather the debris, to ensure that the debris is not lost. Similarly, the cleaning device may rotate to the right. Details are not described herein again. Step S953: Control the side, of the cleaning device, away from the rotation radius to move forward at a third rotation speed, and control the side, of the cleaning device, close to the rotation radius to move backward at a fourth rotation speed. The third rotation speed is greater than the fourth rotation speed. When the cleaning device is not close to the target side wall, the cleaning device rotates to the left. The right first propeller continues to move forward at the third rotation speed and speeds up, and the left first propeller continues to move backward at the fourth rotation speed and speeds down, so that the cleaning device can keep rotating to the left to gather the debris, and the debris is not regurgitated. In addition, the cleaning device can turn around along a bow-shaped path (the bow-shaped path means that two adjacent paths are parallel to each other, and forward directions of the cleaning device are opposite to each other).

The present disclosure further provides a method for preventing a cleaning device from regurgitating debris. The method for preventing the cleaning device from regurgitating debris includes the following steps. Step S960: If it is detected that the cleaning device is turning around, close the anti-regurgitation door of the cleaning device, and open the anti-regurgitation door after a turning around action is completed. In this way, the debris is prevented from being regurgitated during a process in which the cleaning device is turning around. Step S961: If it is detected that the cleaning device is moving backward, close the anti-regurgitation door of the cleaning device, and open the anti-regurgitation door after a moving backward action is completed. In this way, the debris is prevented from being regurgitated during a process in which the cleaning device is moving backward. The anti-regurgitation door is opened after the moving backward action is completed for preset duration, for example, 2 seconds, to prevent the cleaning device from regurgitating the debris due to moving backward inertia. It should be noted that step S960 and step S961 are parallel steps, and there is no sequential relationship or causal relationship. In some embodiments, the method for preventing the cleaning device from regurgitating debris may be included in an optional control mode of the cleaning device for the user to choose. If the user chooses the optional control mode, the cleaning device performs the method to prevent debris from being regurgitated during turning around and/or moving backward. If the user does not choose the optional control mode, the cleaning device only turns around and/or moves backward. This improves intelligence of the cleaning device.

The present disclosure further provides a control method for a cleaning device. The control method for the cleaning device includes the following steps. Step S970: Determine whether a current edge distance between the cleaning device and a side wall of a target region is a first preset edge distance. The cleaning device is provided with an underwater edge sensor or a water surface edge sensor. The edge sensor may be an ultrasonic sensor or an infrared sensor, and is configured to detect the current edge distance between the cleaning device and the side wall of the target region. The preset edge distance is a preset value. The current edge distance is compared with the preset edge distance, so that the first auxiliary cleaning assembly is controlled to operate. In an embodiment, the edge sensor is provided at a right side of the cleaning device body. Step S971: If the current edge distance is the first preset edge distance, control the first auxiliary cleaning assembly of the cleaning device to operate and clean the target side wall. The first auxiliary cleaning assembly can clean the target side wall. Step S972: Identify an obstacle and detect an angle between the cleaning device and the obstacle. The cleaning device is provided with an underwater distance measurement sensor or a water surface distance measurement sensor, such as an ultrasonic sensor or an infrared sensor. The distance measurement sensor can detect an attitude of the cleaning device and detect whether there is an obstacle in front of the cleaning device. When the cleaning device moves along the edge, the distance measurement sensor can detect whether there is an obstacle in front of the cleaning device and whether the cleaning device inclines toward the side wall of the target region. There may be one, two, or a plurality of distance measurement sensors. In this embodiment, there are two distance measurement sensors disposed at the left side and the right side of the front end of the cleaning device respectively. Step S973: Control an action of the cleaning device based on different types of obstacles. The action includes at least one of moving backward, rotating, and moving forward. The control method for the cleaning device further includes step S974. Step S974: When it is detected that the current edge distance between the cleaning device and the side wall of the target region is less than a second preset edge distance, the cleaning device stops moving. Based on the above steps, different types of obstacles can be identified, and different actions can be performed based on the different types of obstacles.

The present disclosure provides a cleaning device, including: a cleaning device body, including an outer side portion; at least one accommodating opening and at least one accommodating groove, where the at least one accommodating opening is provided at the outer side portion, the at least one accommodating groove is provided on the cleaning device body, and the at least one accommodating opening communicates with the at least one accommodating groove; an adjustment mechanism, including at least one buoyancy cavity, where the at least one buoyancy cavity is provided at the cleaning device body and configured to adjust the cleaning device body to be at least partially located on a water surface; a moving mechanism, disposed on the cleaning device body and configured to drive the cleaning device body to move; a main cleaning mechanism, including at least one filtering box, where the at least one filtering box is at least provided with a debris inlet, at least partially accommodated in the at least one accommodating groove, and capable of being assembled to the at least one accommodating groove in a pull-out manner through the at least one accommodating opening, and a direction of pulling out the at least one filtering box includes a direction substantially parallel to a forward direction of the cleaning device; a handle, disposed at a periphery of the at least one filtering box; a roller brush, rotatably disposed at the debris inlet, where the handle and the roller brush are located on a same side of the cleaning device body; and a solar mechanism, including a solar panel disposed on a top surface of the cleaning device body. A maximum length of a contour of the cleaning device body along the forward direction is a first length. A maximum width of the contour of the cleaning device body along a direction perpendicular to the forward direction is a first width. A maximum length of the solar panel along the forward direction is a second length. A maximum width of the solar panel along the direction perpendicular to the forward direction is a second width. A ratio of the second length to the first length is greater than or equal to 0.7 and less than 1. A ratio of the second width to the first width is greater than or equal to 0.5 and less than 1.

In some embodiments, the cleaning device includes an auxiliary cleaning mechanism, which is different from the roller brush, disposed at the cleaning device body, and at least configured to increase a cleaning range of the debris inlet.

In some embodiments, the cleaning device includes a locking mechanism disposed between the at least one filtering box and the cleaning device body. When the at least one filtering box is assembled to the at least one accommodating groove through the at least one accommodating opening, the locking mechanism is in a locked state. When the at least one filtering box needs to be removed from the at least one accommodating groove, the locking mechanism is in an unlocked state. The locking mechanism includes a locking assembly and a locking groove, one of the at least one filtering box and the cleaning device body is provided with the locking assembly, and the other one of the at least one filtering box and the cleaning device body is provided with the locking groove.

In some embodiments, along a height direction of the cleaning device body, a projection of the solar panel overlaps with a projection of the at least one filtering box, and the solar panel is fixedly disposed at the cleaning device body.

In some embodiments, the auxiliary cleaning mechanism includes a first auxiliary cleaning assembly, and along a height direction of the cleaning device body, a projection of the first auxiliary cleaning assembly at least partially overlaps with a projection of the debris inlet.

In some embodiments, along the forward direction of the cleaning device, at least a part of the first auxiliary cleaning assembly is disposed in front of the debris inlet, to guide debris outside a working region of the debris inlet to the working region of the debris inlet.

In some embodiments, one portion of the debris inlet is located on the water surface, the other portion of the debris inlet is located under the water surface, and at least a part of the first auxiliary cleaning assembly is located on the water surface.

In some embodiments, the first auxiliary cleaning assembly includes a side brush and a rotation shaft, the side brush rotates around the rotation shaft, the rotation shaft is rotatably disposed at the cleaning device body, the side brush includes a side brush body and a cleaning portion, and at least a part of the cleaning portion protrudes from the contour of the cleaning device body.

In some embodiments, the cleaning device further includes at least one guiding wheel, rotatably disposed at the cleaning device body. The at least one guiding wheel and the first auxiliary cleaning assembly are arranged substantially vertically. A distance over which the at least one guiding wheel protrudes from the contour of the cleaning device body is less than or equal to a distance over which the first auxiliary cleaning assembly protrudes from the contour of the cleaning device body.

In some embodiments, the at least one filtering box includes a filtering box portion and a rotating portion, the rotating portion has an open position and a closed position relative to the filtering box portion, and when the rotating portion is in the open position, a debris dumping opening is formed on the at least one filtering box, and the debris dumping opening is disposed opposite to the debris inlet.

In some embodiments, the main cleaning mechanism includes an anti-regurgitation assembly disposed close to the debris inlet of the at least one filtering box, and the anti-regurgitation assembly is configured to prevent at least a part of debris from being regurgitated to a to-be-cleaned region through the debris inlet.

In some embodiments, a movement track of the roller brush and a movement track of the anti-regurgitation assembly do not interfere with each other, or the movement track of the roller brush and the movement track of the anti-regurgitation assembly interfere with each other, and the anti-regurgitation assembly or the roller brush is made of a flexible material.

In some embodiments, the adjustment mechanism includes at least a first buoyancy cavity and a second buoyancy cavity substantially symmetrically provided at two sides of the cleaning device body; and the cleaning device further includes a top cover fixedly disposed between the first buoyancy cavity and the second buoyancy cavity, and the solar panel at least partially covers the top cover.

In some embodiments, the cleaning device further includes a water quality treatment assembly, and the water quality treatment assembly includes at least a reagent kit configured to treat water quality in a to-be-cleaned region.

In some embodiments, the cleaning device further includes an anti-stranding assembly, disposed at a bottom of the cleaning device and capable of being switched between a first state and a second state.

In some embodiments, when the at least one filtering box is assembled to the at least one accommodating groove, the at least one filtering box forms a water discharge channel with a rear portion of the cleaning device body, and at least a part of water discharged from the at least one filtering box is discharged through the water discharge channel along the forward direction of the cleaning device.

In some embodiments, along the forward direction of the cleaning device, a projection range of the moving mechanism at least partially overlaps with a projection range of the at least one filtering box, and the at least one filtering box is in front of the moving mechanism; or along the direction perpendicular to the forward direction of the cleaning device, the projection range of the moving mechanism at least partially overlaps with a projection range of a rear portion of the at least one filtering box.

In some embodiments, the anti-regurgitation assembly includes an anti-regurgitation door and an anti-regurgitation drive assembly. The anti-regurgitation door is driven by the anti-regurgitation drive assembly. The anti-regurgitation drive assembly includes a first anti-jamming structure configured to prevent a foreign object from entering the anti-regurgitation drive assembly. The first anti-jamming structure is disposed in at least one of the following manners: the first anti-jamming structure is disposed on the at least one filtering box, the first anti-jamming structure is disposed in the at least one accommodating groove, or the first anti-jamming structure is partially disposed on the at least one filtering box and partially disposed in the at least one accommodating groove.

In some embodiments, the cleaning device further includes a roller brush drive assembly. The roller brush is driven by the roller brush drive assembly. The roller brush drive assembly includes a second anti-jamming structure configured to prevent a foreign object from entering the roller brush drive assembly. The second anti-jamming structure is disposed in at least one of the following manners: the second anti-jamming structure is disposed on the at least one filtering box, the second anti-jamming structure is disposed in the at least one accommodating groove, or the second anti-jamming structure is partially disposed on the at least one filtering box and partially disposed in the at least one accommodating groove.

In some embodiments, the cleaning device further includes a light-emitting structure configured to indicate a current state of the cleaning device or improve visibility of the cleaning device in low visibility. The light-emitting structure includes at least one light-emitting part and at least one light transmission part configured to transmit, to the outside of the cleaning device body, light emitted by the at least one light-emitting part. The light-emitting structure further includes at least one light guiding part configured to guide, to a position at which the at least one light transmission part is located, the light emitted by the at least one light-emitting part.

The above description describes only implementations of the present disclosure and is not intended to limit the scope of the present disclosure. Any equivalent structure or equivalent process transformation performed based on the contents of the specification and the accompanying drawings of the present disclosure or applied directly or indirectly in other related technical fields shall fall within the protection scope of the present disclosure.

What is claimed is:

1. A cleaning device, comprising:
a cleaning device body, comprising an outer side portion;
at least one accommodating opening and at least one accommodating groove, wherein the at least one accommodating opening is provided at the outer side portion, the at least one accommodating groove is provided on the cleaning device body, and the at least one accommodating opening communicates with the at least one accommodating groove;
an adjustment mechanism, comprising at least one buoyancy cavity, wherein the at least one buoyancy cavity is provided at the cleaning device body and the at least one buoyancy cavity is configured to adjust the cleaning device body to be at least partially located on a water surface;
a moving mechanism disposed on the cleaning device body, wherein the moving mechanism is configured to drive the cleaning device body to move;
a main cleaning mechanism comprising at least one filtering box, wherein the at least one filtering box is at least provided with a debris inlet, the at least one filtering box is at least partially accommodated in the at least one accommodating groove and the at least one filtering box is capable of being assembled to the at least one accommodating groove in a pull-out manner through the at least one accommodating opening, and a direction of pulling out the at least one filtering box comprises a direction substantially parallel to a forward direction of the cleaning device;
a handle, disposed at a periphery of the at least one filtering box;
a roller brush, rotatably disposed at the debris inlet, wherein the handle and the roller brush are located on a same side of the cleaning device body; and
a solar mechanism, comprising a solar panel disposed on a top surface of the cleaning device body, wherein
a maximum length of a contour of the cleaning device body along the forward direction is a first length, a maximum width of the contour of the cleaning device body along a direction perpendicular to the forward direction is a first width, a maximum length of the solar panel along the forward direction is a second length, a maximum width of the solar panel along the direction perpendicular to the forward direction is a second width, a ratio of the second length to the first length is greater than or equal to 0.7 and less than 1, and a ratio of the second width to the first width is greater than or equal to 0.5 and less than 1.

2. The cleaning device according to claim 1, wherein the cleaning device comprises an auxiliary cleaning mechanism disposed at the cleaning device body, the auxiliary cleaning mechanism is different from the roller brush, and the auxiliary cleaning mechanism is at least configured to increase a cleaning range of the debris inlet.

3. The cleaning device according to claim 1, wherein along a height direction of the cleaning device body, a projection range of the solar panel is equal to or greater than a projection range of the at least one filtering box, and the solar panel is fixedly disposed at the cleaning device body.

4. The cleaning device according to claim 2, wherein the auxiliary cleaning mechanism comprises a first auxiliary cleaning assembly, and along a height direction of the cleaning device body, a projection of the first auxiliary cleaning assembly at least partially overlaps with a projection of the debris inlet.

5. The cleaning device according to claim 4, wherein along the forward direction of the cleaning device, at least a part of the first auxiliary cleaning assembly is disposed in front of the debris inlet, to guide debris outside a working region of the debris inlet to the working region of the debris inlet.

6. The cleaning device according to claim 4, wherein one portion of the debris inlet is located on the water surface, another portion of the debris inlet is located under the water surface, and at least a part of the first auxiliary cleaning assembly is located on the water surface.

7. The cleaning device according to claim 4, wherein the first auxiliary cleaning assembly comprises a side brush and a rotation shaft, the side brush rotates around the rotation shaft, the rotation shaft is rotatably disposed at the cleaning device body, the side brush comprises a side brush body and a cleaning portion, and at least a part of the cleaning portion protrudes from the contour of the cleaning device body.

8. The cleaning device according to claim 1, wherein the at least one filtering box comprises a filtering box portion and a rotating portion, the rotating portion has an open position and a closed position relative to the filtering box portion, and when the rotating portion is in the open position, a debris dumping opening is formed on the at least one filtering box, and the debris dumping opening is disposed opposite to the debris inlet.

9. The cleaning device according to claim 1, wherein the main cleaning mechanism comprises an anti-regurgitation assembly disposed close to the debris inlet of the at least one filtering box, and the anti-regurgitation assembly is configured to prevent at least a part of debris from being regurgitated to a to-be-cleaned region through the debris inlet.

10. The cleaning device according to claim 1, wherein the adjustment mechanism comprises at least a first buoyancy cavity and a second buoyancy cavity substantially symmetrically provided at two sides of the cleaning device body, the cleaning device further comprises a top cover fixedly disposed between the first buoyancy cavity and the second buoyancy cavity, and the solar panel at least partially covers the top cover.

11. The cleaning device according to claim 1, further comprising a water quality treatment assembly, wherein the water quality treatment assembly comprises at least a reagent kit configured to treat water quality of a to-be-cleaned region.

12. The cleaning device according to claim 1, further comprising an anti-stranding assembly, wherein the anti-stranding assembly is disposed at a bottom of the cleaning device and the anti-stranding assembly is capable of being switched between a first state and a second state.

13. The cleaning device according to claim 1, wherein along the forward direction of the cleaning device, a projection range of the moving mechanism at least partially overlaps with a projection range of the at least one filtering box, and the at least one filtering box is in front of the moving mechanism; or
along the direction perpendicular to the forward direction of the cleaning device, the projection range of the moving mechanism at least partially overlaps with a projection range of a rear portion of the at least one filtering box.

14. The cleaning device according to claim 1, further comprising a roller brush drive assembly, wherein the roller brush is driven by the roller brush drive assembly, the roller brush drive assembly comprises a second anti-jamming structure configured to prevent a foreign object from entering the roller brush drive assembly, and the second anti-jamming structure is disposed in at least one of the following manners: the second anti-jamming structure is disposed on the at least one filtering box, the second anti-jamming structure is disposed in the at least one accommodating groove, or the second anti-jamming structure is partially disposed on the at least one filtering box and partially disposed in the at least one accommodating groove.

* * * * *